(12) United States Patent
Kato et al.

(10) Patent No.: US 7,347,897 B2
(45) Date of Patent: Mar. 25, 2008

(54) CRYSTALLIZATION APPARATUS, CRYSTALLIZATION METHOD, AND PHASE MODULATION DEVICE

(75) Inventors: Tomoya Kato, Yokohama (JP); Masakiyo Matsumura, Yokohama (JP); Yukio Taniguchi, Yokohama (JP)

(73) Assignee: Advanced LCD Technologies Development Center Co., Ltd., Totsuka-ku (JP)

( * ) Notice: Subject to any disclaimer, the term of this patent is extended or adjusted under 35 U.S.C. 154(b) by 379 days.

(21) Appl. No.: 11/098,647

(22) Filed: Apr. 5, 2005

(65) Prior Publication Data

US 2006/0027162 A1    Feb. 9, 2006

(30) Foreign Application Priority Data

Aug. 3, 2004  (JP)  ............................. 2004-226668
Aug. 3, 2004  (JP)  ............................. 2004-226669

(51) Int. Cl.
*C30B 35/00*   (2006.01)
(52) U.S. Cl. .......................................... 117/201; 117/4
(58) Field of Classification Search ................... 117/1; 257/1; 430/1; 438/1
See application file for complete search history.

(56) References Cited

U.S. PATENT DOCUMENTS

| 6,071,765 A * | 6/2000 | Noguchi et al. ............ 438/166 |
| 7,018,749 B2 * | 3/2006 | Taniguchi ........................ 430/5 |
| 7,217,319 B2 * | 5/2007 | Matsumura et al. ........... 117/4 |

FOREIGN PATENT DOCUMENTS

JP    2000-306859    11/2000

OTHER PUBLICATIONS

Masakiyo Matsumura, "Preparation of Ultra-Large Grain Silicon Thin-Films by Excimer-Laser", Surface Science, vol. 21. No. 5, 2000, pp. 278-287.
Kohki Inoue, et al., "Amplitude and Phase Modulated Excimer-Laser Melt-Regrowth Method of Silicon Thin-Films—A New Growth Method of 2-D Position-Controlled Large-Grains", Journal of Papers of the Institute of Electronics, Information and Communications Engineers, IEICE The Transactions, vol. J85-C, No. 8, Aug. 2002, pp. 624-629.

* cited by examiner

*Primary Examiner*—Robert Kunemund
*Assistant Examiner*—Marissa W. Chaet
(74) *Attorney, Agent, or Firm*—Oblon, Spivak, McClelland, Maier & Neustadt, P.C.

(57) ABSTRACT

A crystallization apparatus of the present invention irradiates a non-single-crystal semiconductor film with a luminous flux having a predetermined light intensity distribution to crystallize the film, and comprises a phase modulation device comprising a plurality of unit areas which are arranged in a certain period and which mutually have substantially the same pattern, and an optical image forming system disposed between the phase modulation device and the non-single-crystal semiconductor film. The unit area of the phase modulation device has a reference face having a certain phase, a first area disposed in the vicinity of a center of each unit area and having a first phase difference with respect to the reference face, and a second area disposed in the vicinity of the first area and having substantially the same phase difference as that of the first phase difference with respect to the reference face.

20 Claims, 47 Drawing Sheets

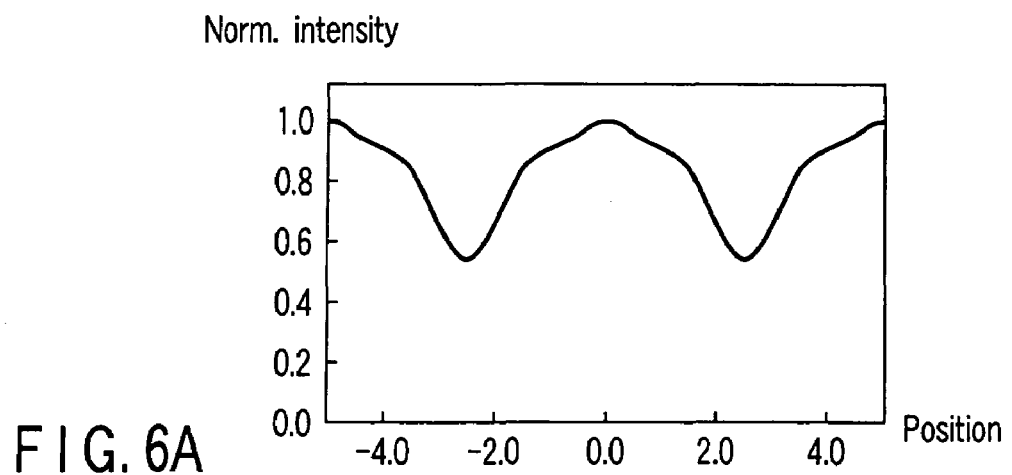
F I G. 6A
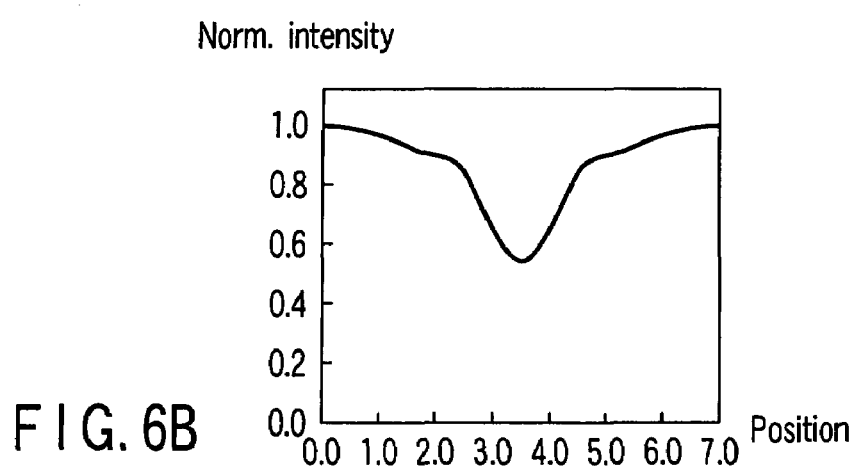
F I G. 6B
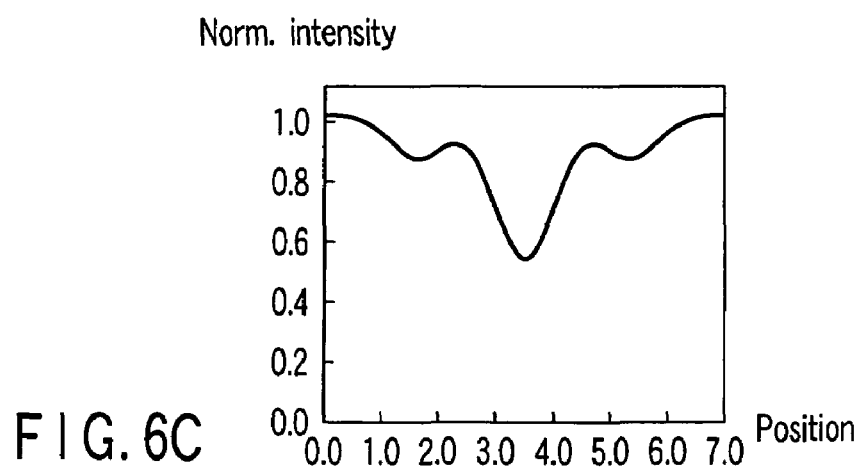
F I G. 6C

Image plane

Point spread distribution function

Image plane

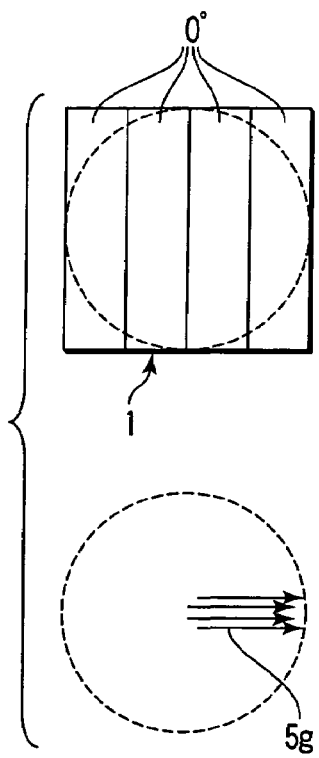 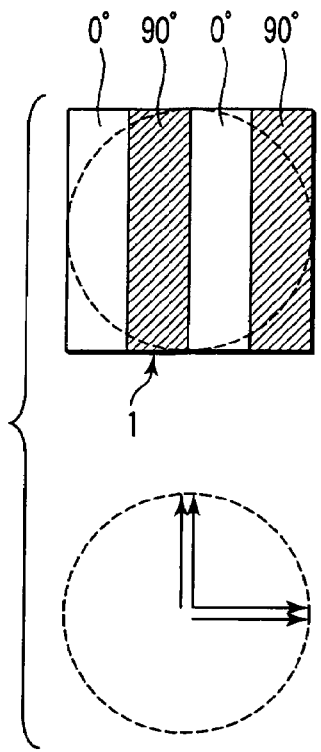 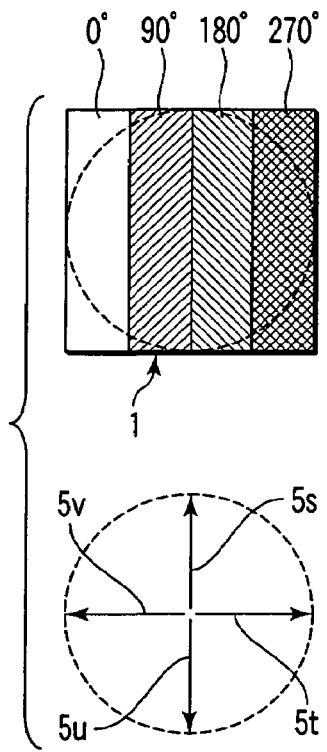
FIG. 8A  FIG. 8B  FIG. 8C
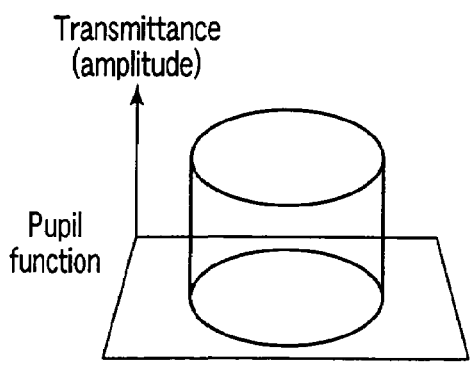 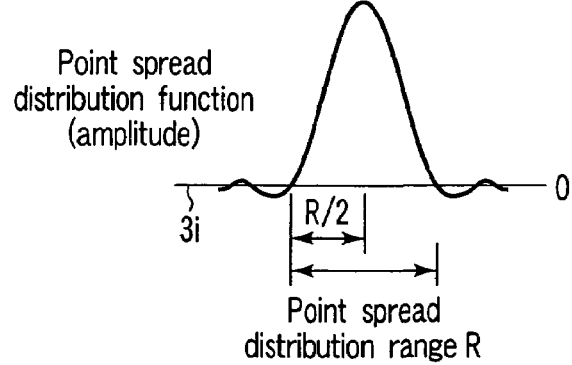
FIG. 9A  FIG. 9B

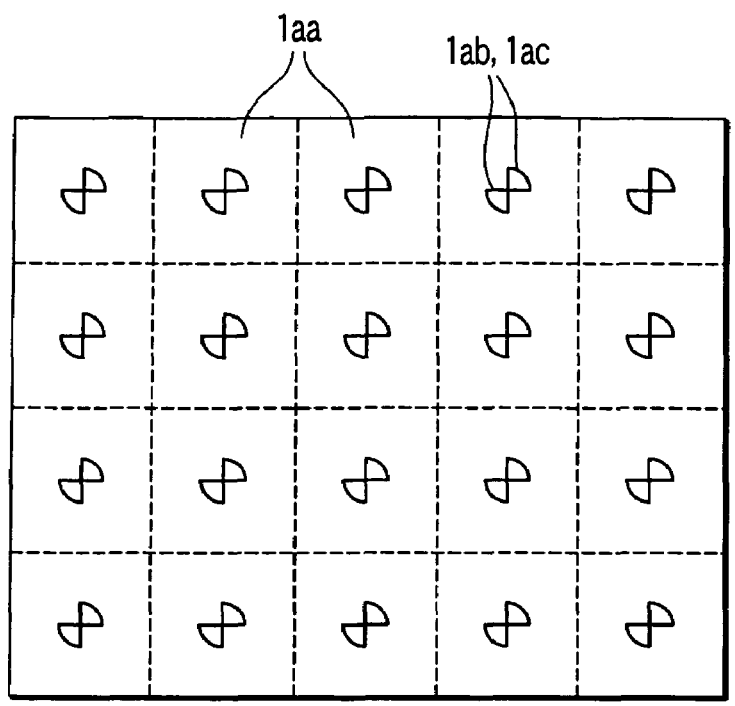
F I G. 14A
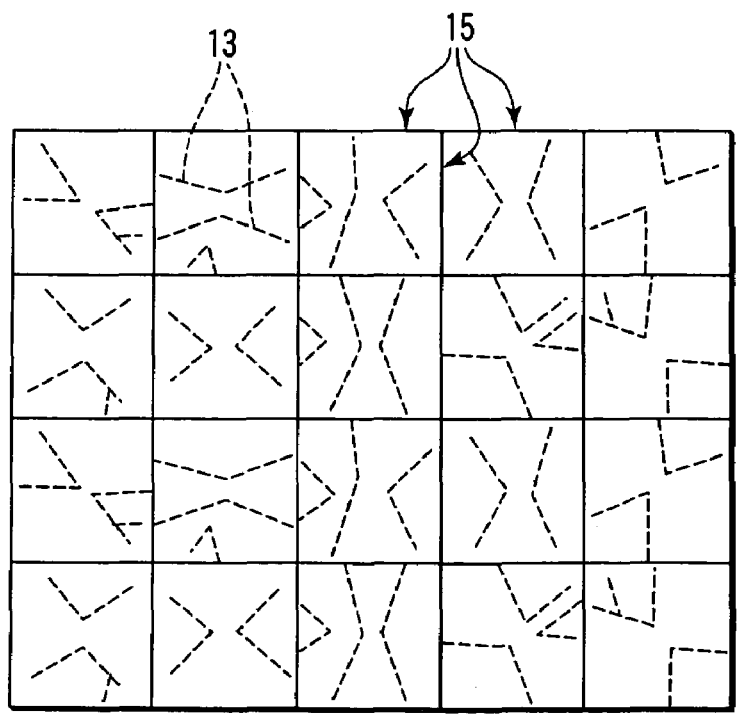
F I G. 14B

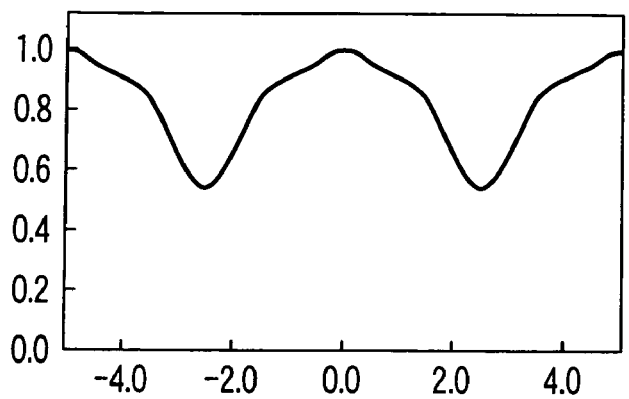
F I G. 18A
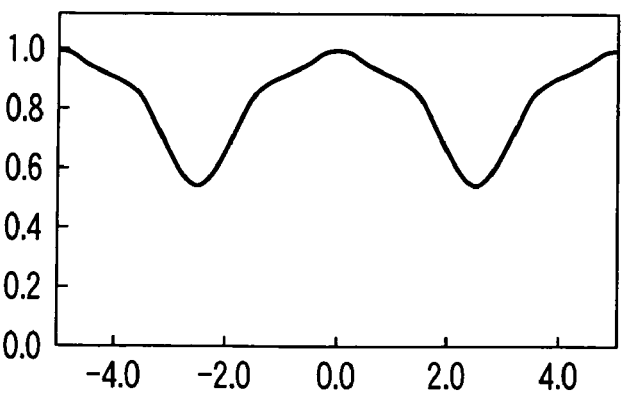
F I G. 18B
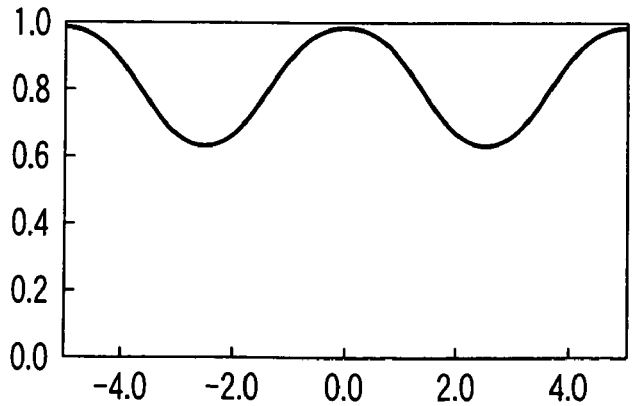
F I G. 18C

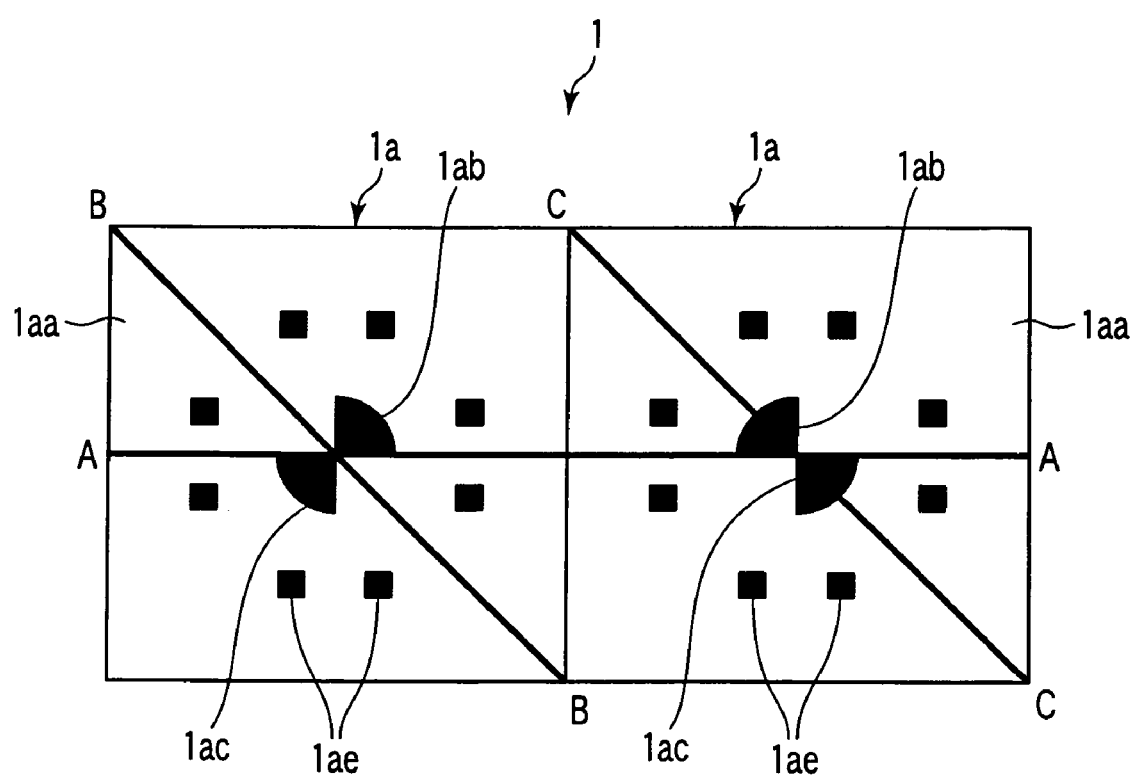
F I G. 19

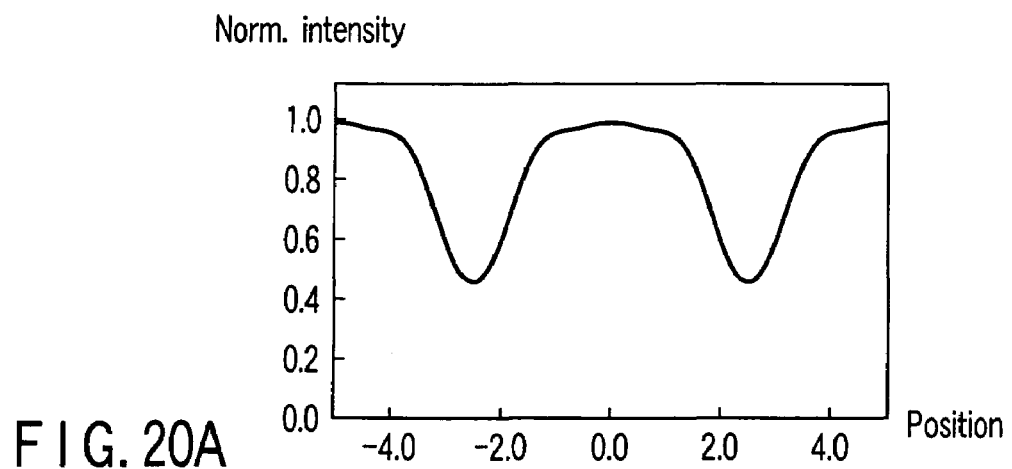
F I G. 20A
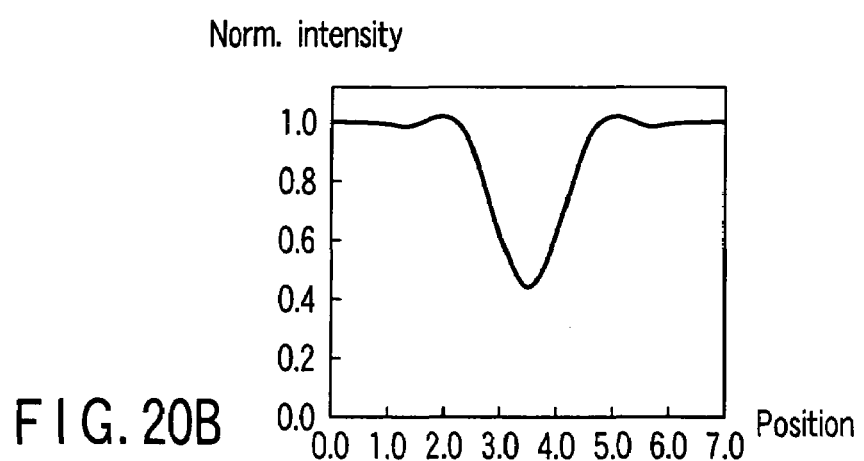
F I G. 20B
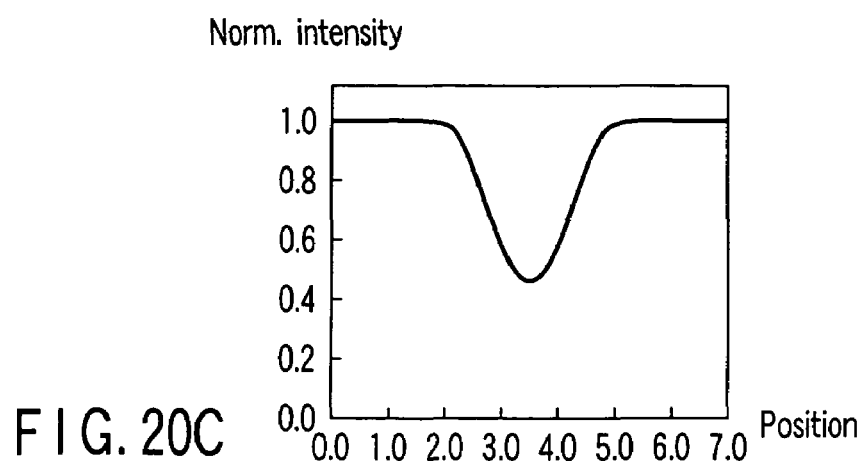
F I G. 20C

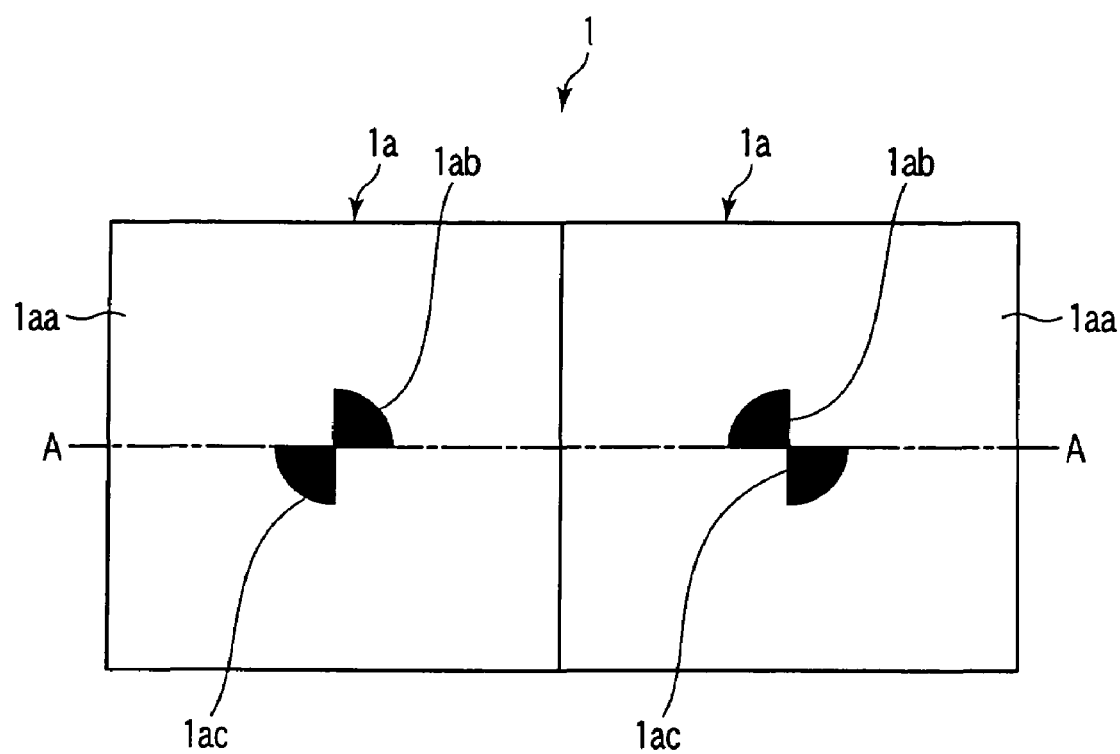
F I G. 24

Phase modulation pattern
100deg step

Light intensity distrubution

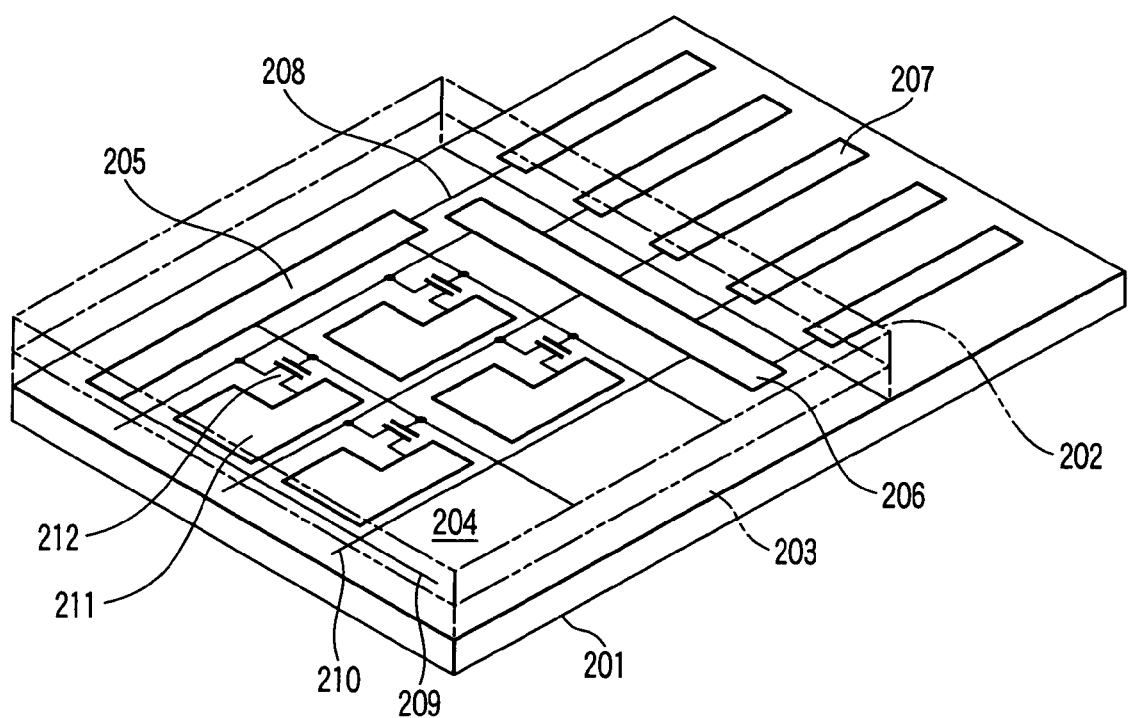
F I G. 30

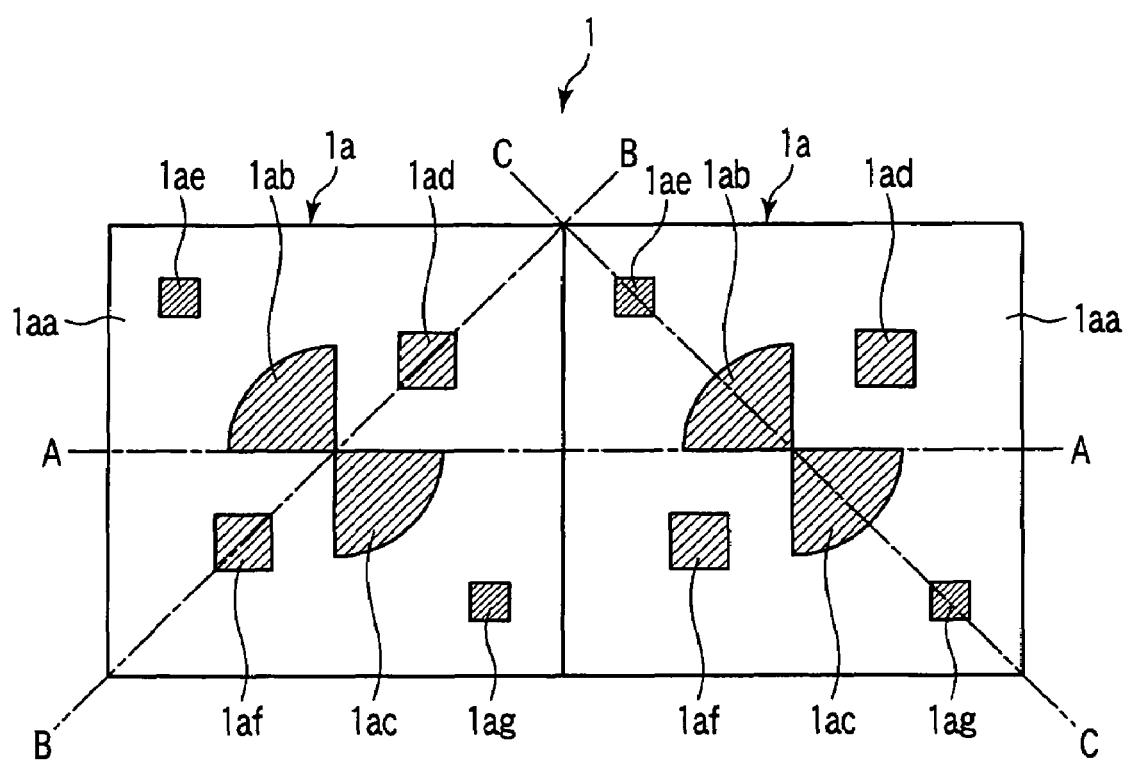
F I G. 33

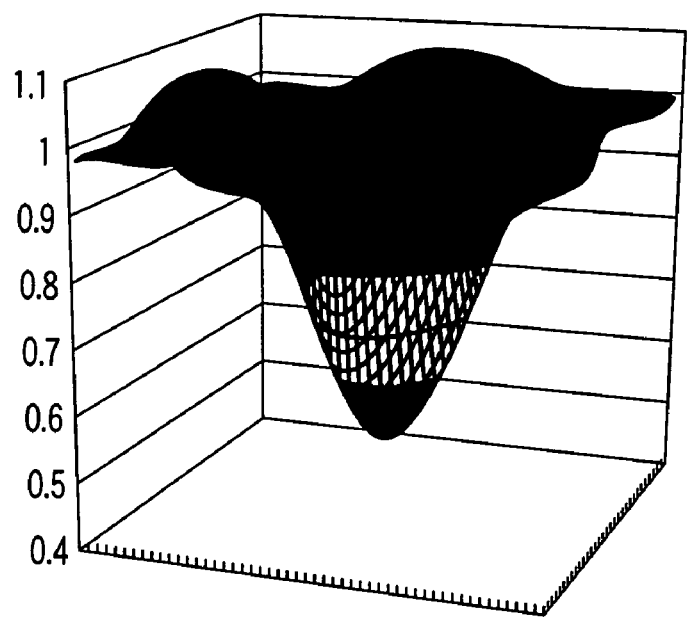
F I G. 36A
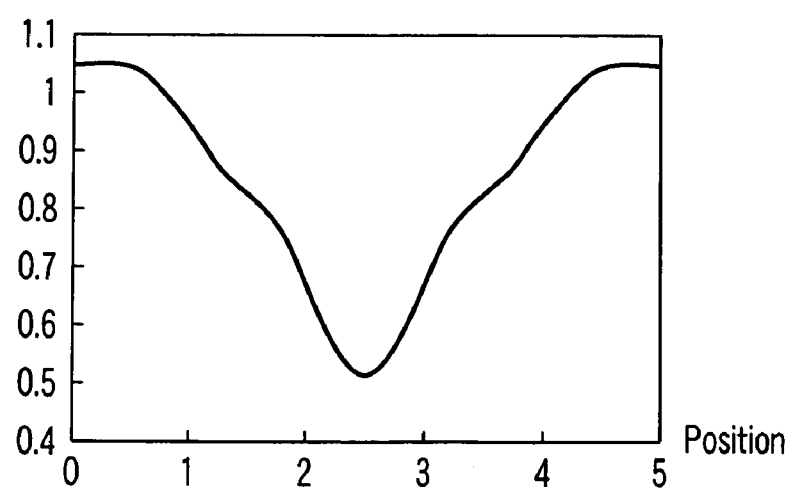
F I G. 36B

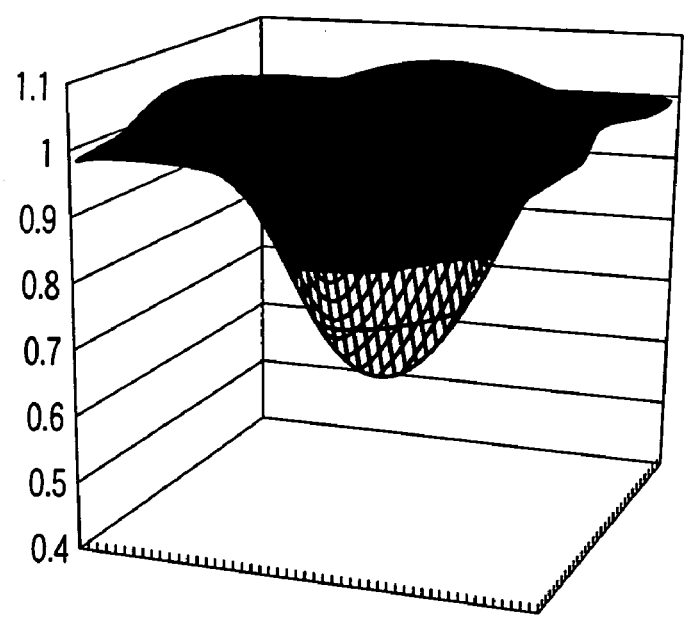
F I G. 37A
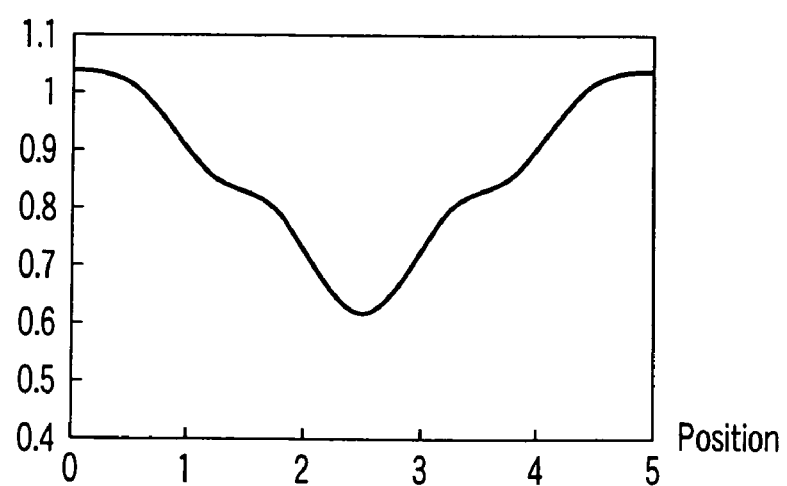
F I G. 37B

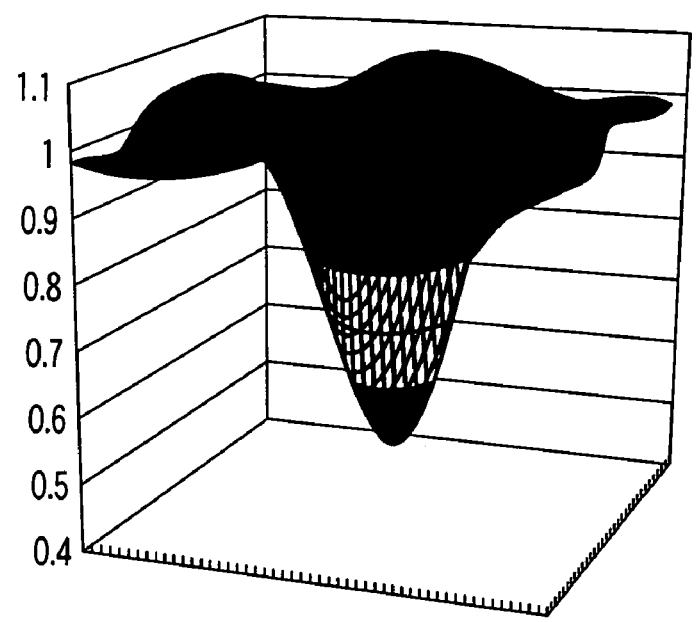
F I G. 40A
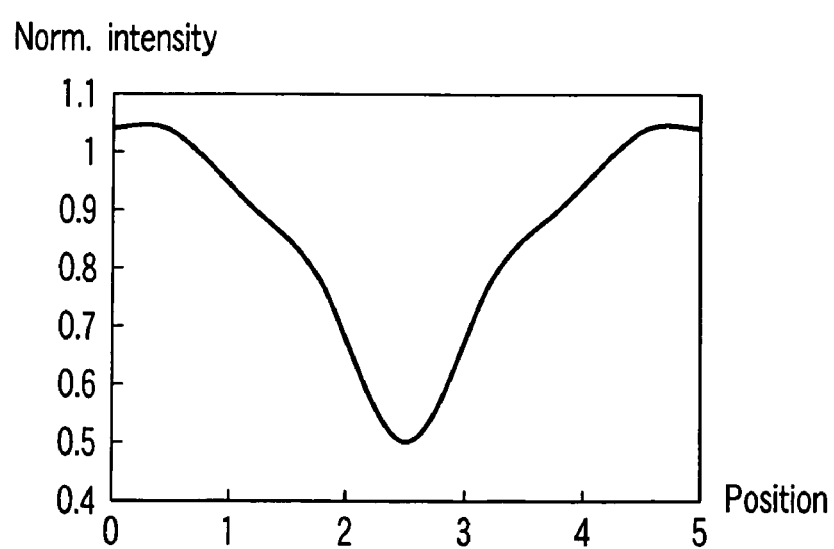
F I G. 40B

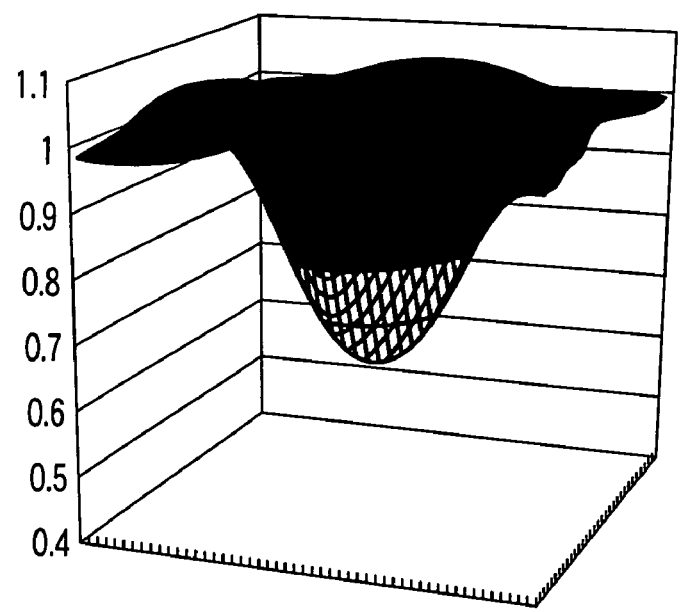
F I G. 41A
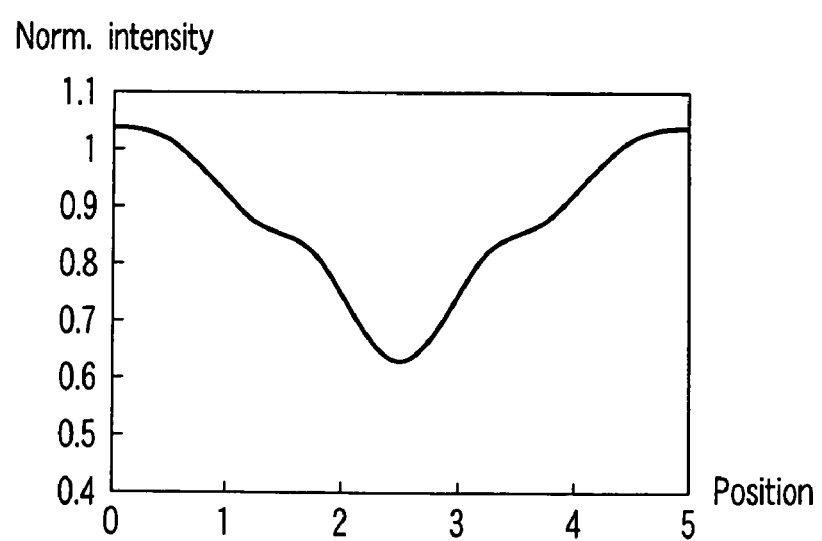
F I G. 41B

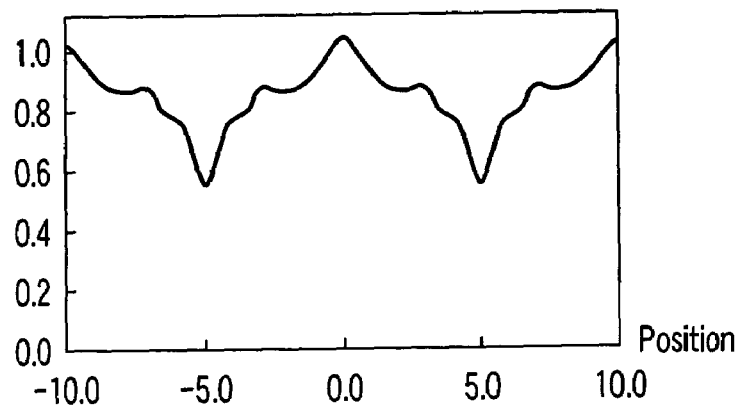
F I G. 47A
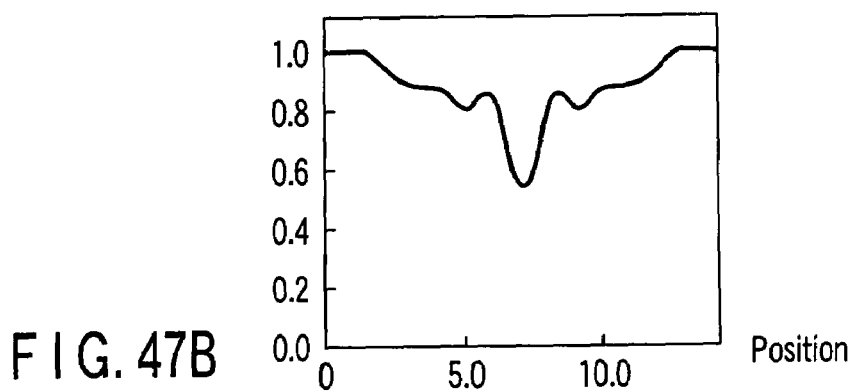
F I G. 47B
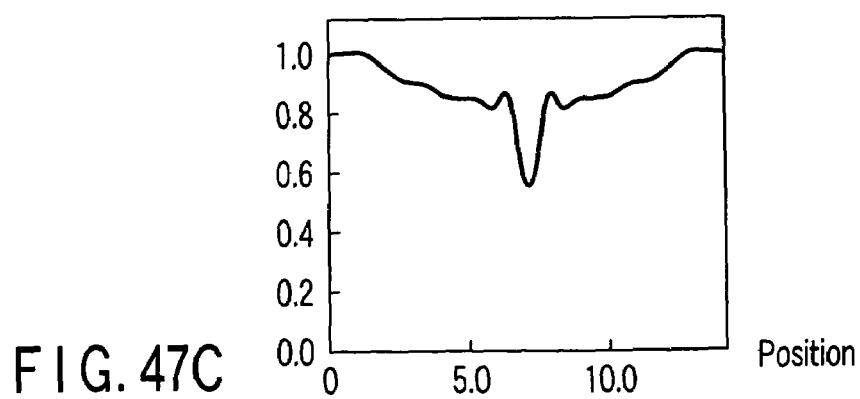
F I G. 47C

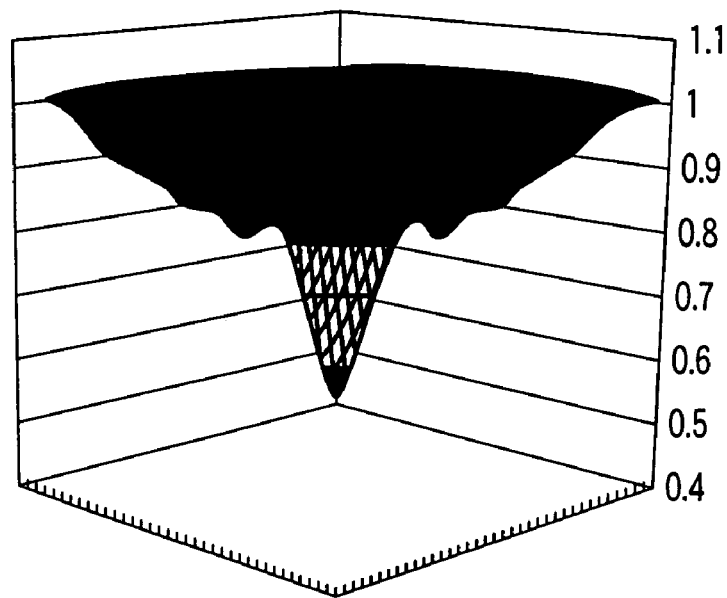
F I G. 48A
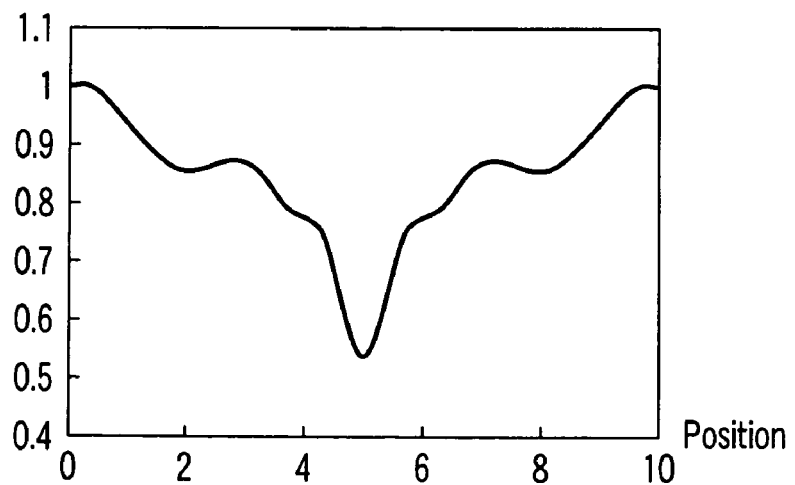
F I G. 48B

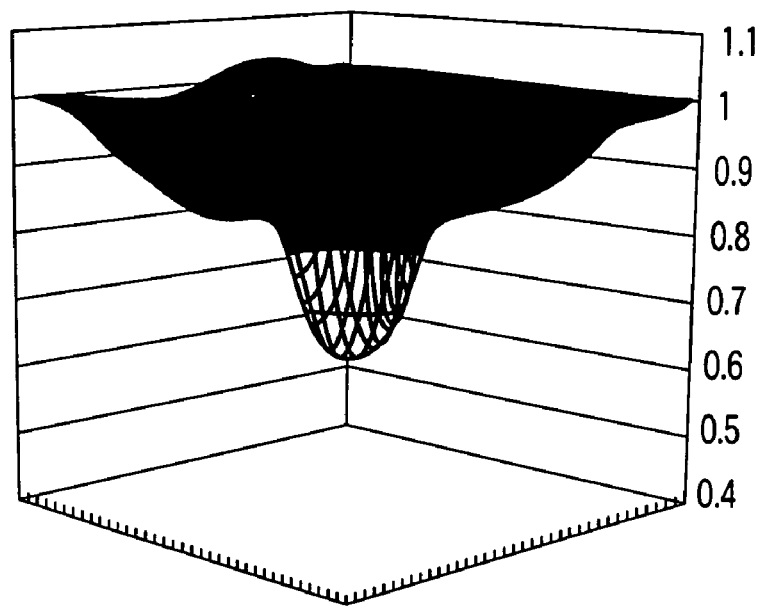
F I G. 49A
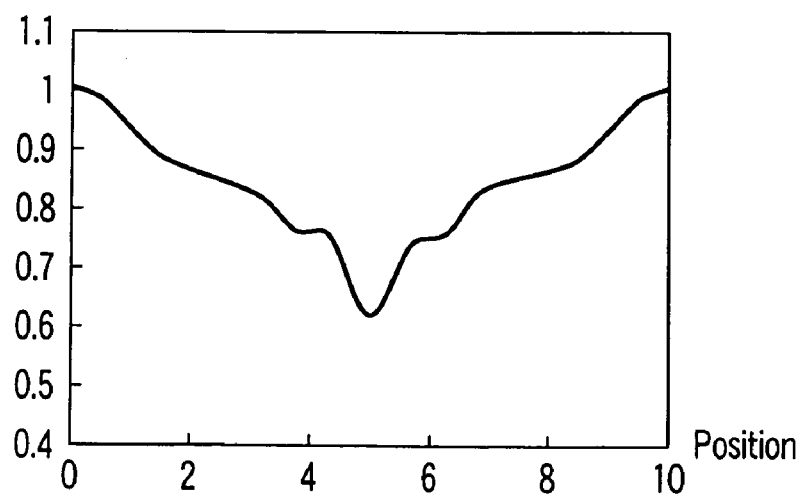
F I G. 49B

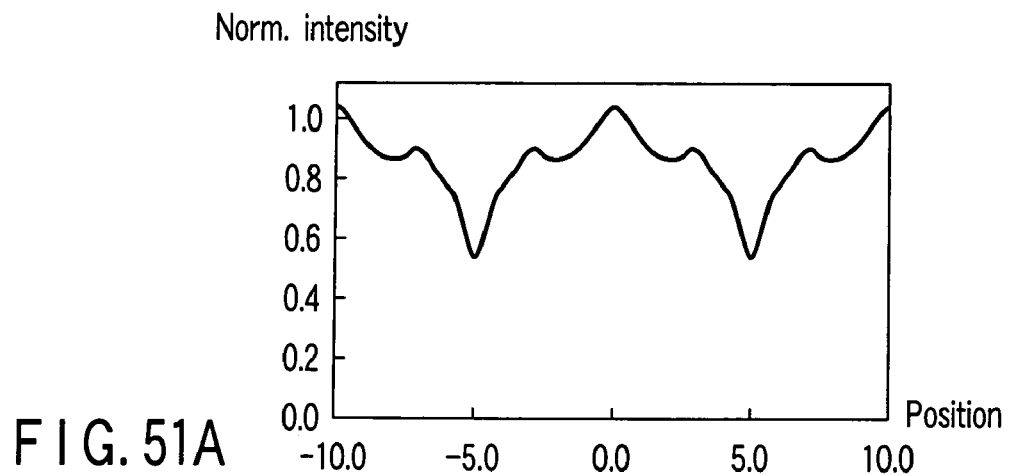
F I G. 51A
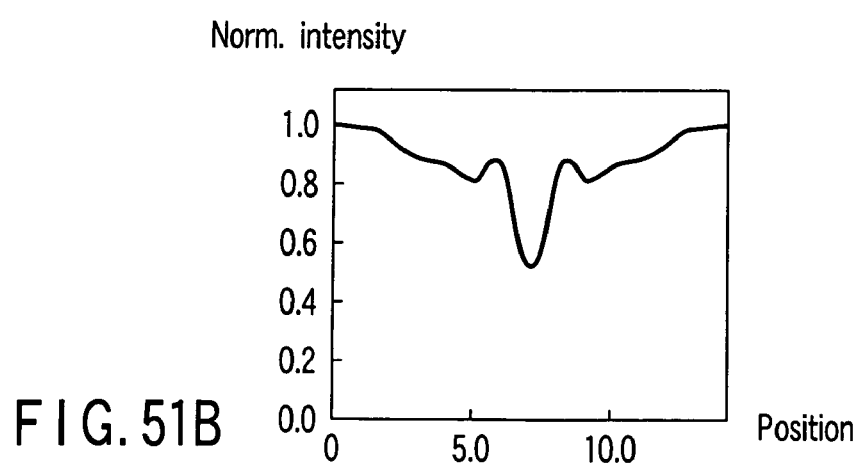
F I G. 51B
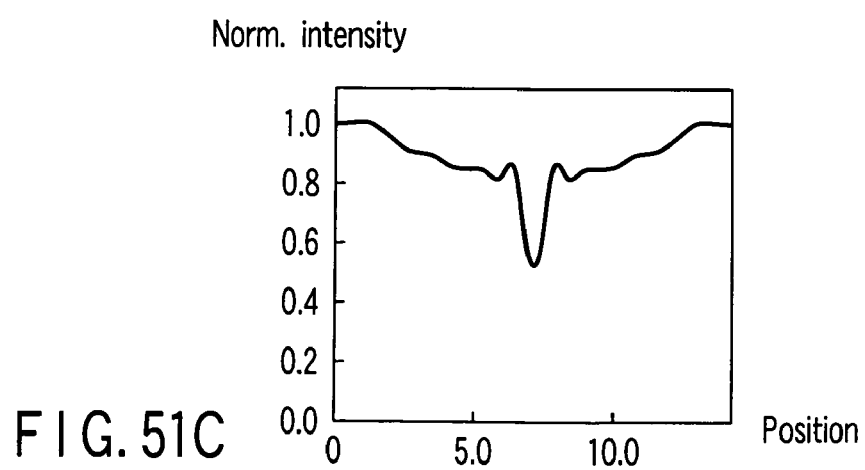
F I G. 51C

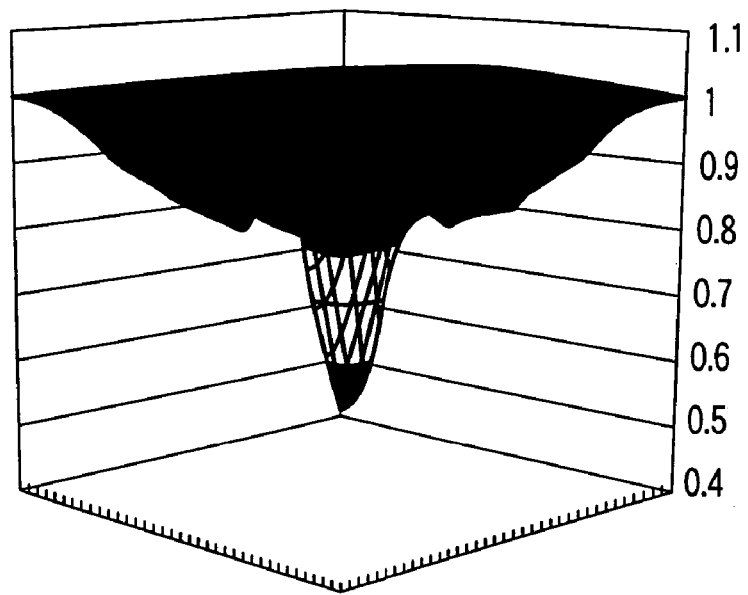
F I G. 52A
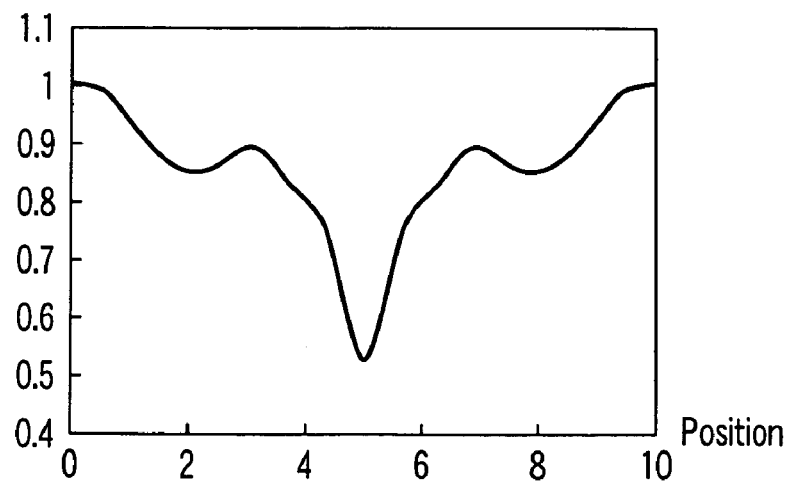
F I G. 52B

US 7,347,897 B2

CRYSTALLIZATION APPARATUS, CRYSTALLIZATION METHOD, AND PHASE MODULATION DEVICE

CROSS-REFERENCE TO RELATED APPLICATIONS

This application is based upon and claims the benefit of priority from prior Japanese Patent Applications No. 2004-226668, filed Aug. 3, 2004; and No. 2004-226669, filed Aug. 3, 2004, the entire contents of both of which are incorporated herein by reference.

BACKGROUND OF THE INVENTION

1. Field of the Invention

The present invention relates to a crystallization apparatus, a crystallization method, and a phase modulation device, particularly to a crystallization apparatus which irradiates a polycrystal or amorphous semiconductor film with laser light having a predetermined light intensity distribution to produce a crystallized semiconductor film.

2. Description of the Related Art

A thin-film transistor (TFT), for example, for use in a switching device which controls a potential applied to a pixel of a liquid crystal display (LCD) has heretofore been formed in an amorphous silicon layer or a poly-silicon layer.

The poly-silicon layer has an electron or hole mobility higher than that of the amorphous silicon layer. Therefore, in the case where the transistor is formed in the poly-silicon layer, switching speed is increased and, consequently, display response is accelerated as compared with the case where the transistor is formed in the amorphous silicon layer. Therefore, it is possible to constitute a peripheral LSI with thin-film transistors with the advantage that design margins of other components can be reduced. Furthermore, in the case where peripheral circuits such as a driver circuit and DAC are incorporated on the same substrate as the display, it is possible to increase operation speeds of the peripheral circuits.

Polycrystal silicon is constituted of an aggregation of crystal grains, and the mobility of electrons or holes is lower than that for single-crystal silicon. However, in the case where a large number of thin-film transistors are formed in the poly-silicon layer, fluctuations of crystal grain boundary number in a channel portion raise a problem. To solve the problem, in recent years, a crystallization method of producing crystallized silicon having large grain diameters has been proposed in order to enhance the mobility of electrons or holes and to reduce the fluctuations of the crystal grain boundary number in the channel portion.

A phase modulation excimer laser annealing process (phase modulation ELA process) has heretofore been proposed as the crystallization method (Surface Science, Vol. 21, No. 5, pp. 278 to 287, 2000). According to this method, a phase shifter is disposed parallel to and in the vicinity of the polycrystal or amorphous semiconductor film, and the semiconductor film is irradiated with excimer laser light via the phase shifter to crystallize the semiconductor film.

In the phase modulation ELA process, a light intensity distribution having an inverse peak pattern (the light intensity becomes minimum at the center, and the light intensity rapidly increases toward the periphery) in which the light intensity is minimized at the point corresponding to the phase shift steps of the phase shifter is generated, and the polycrystal or amorphous semiconductor film is irradiated with the light having the light intensity distribution having the inverse peak pattern. As a result, a temperature gradient is generated in a molten region in accordance with the light intensity distribution, a crystal nucleus is formed in the portion which first solidifies, corresponding to the point at which the light intensity is minimized, and crystals grow in a lateral direction toward the periphery from the crystal nucleus (hereinafter referred to as "lateral growth" or "lateral-direction growth"). Accordingly, single-crystal grains having large grain diameters are produced.

In Jpn. Pat. Appln. KOKAI Publication No. 2000-306859, a technique has been disclosed in which the semiconductor film is irradiated with light having the light intensity distribution having the inverse peak pattern produced via a phase shift mask (phase shifter) to crystallize the film. Further in Inoue et al., Journal of Papers of the Institute of Electronics, Information and Communication Engineers, Vol. J85-C, No. 8, pp. 624 to 629, August 2002, a technique has been disclosed in which the semiconductor film is irradiated with light having a light intensity distribution of a concave pattern plus inverse peak pattern produced by combining the phase shifter with a light absorption distribution.

As disclosed in the Jpn. Pat. Appln. KOKAI Publication No. 2000-306859, the light intensity distribution of the inverse peak pattern is formed in the portion corresponding to a phase shift portion in a conventional technique in which the phase shifter is used to form the light intensity distribution of the inverse peak pattern. However, since the light intensity does not increase linearly, growth of the crystals easily end midway. Since a surplus irregularity distribution is easily generated in the periphery of the light intensity distribution having the inverse peak pattern, the light intensity distribution having the inverse peak pattern cannot be arranged into an array, or crystal grains cannot be generated in the array.

It is to be noted that when the angle distribution of illuminative light with respect to the phase shifter is adjusted, or the arrangement position of the phase shifter is designed, it may be possible to bring an obtained light intensity distribution close to an ideal distribution. However, the design cannot be analytically performed with a prospect. Even if the analytic design can be realized, it is expected that considerably complicated conditions are obtained.

It is to be noted that, as disclosed in Inoue et al., Journal of the Institute of Electronics, Information and Communication Engineers, Vol. J85-C, No. 8, pp. 624 to 629, August 2002, the light intensity distribution of the concave pattern plus inverse peak pattern for the crystallization can be obtained in the conventional technique in which the phase shifter is combined with the light absorption distribution. However, it is difficult to grow the crystals having large grain diameters in the lateral direction. It is generally difficult to form a film having a light absorption distribution which continuously changes. Especially, when a film to be crystallized is irradiated with light having a very high intensity for the crystallization, deterioration of film materials of the film having the light absorption distribution is unfavorably easily caused by thermal or chemical changes by light absorption.

BRIEF SUMMARY OF THE INVENTION

The present invention has been developed in view of the above-described problem of the conventional technique. An object of the present invention is to provide a crystallization apparatus and a crystallization method capable of realizing sufficient crystal growth from a crystal nucleus in a lateral direction and producing a crystallized semiconductor film having a large grain diameter.

A crystallization apparatus according to one aspect of the present invention is an apparatus which irradiates a non-single-crystal semiconductor film with a luminous flux having a predetermined light intensity distribution to thereby crystallize the semiconductor film.

The crystallization apparatus comprises:

a phase modulation device comprising a plurality of unit areas which are arranged in a certain period and which mutually have substantially the same pattern; and an optical image forming system disposed between the phase modulation device and the non-single-crystal semiconductor film.

Each of the unit areas of the phase modulation device comprises:

a reference face having a certain phase;

a first area disposed in the vicinity of a center of each unit area and having a first phase difference with respect to the reference face; and a second area disposed in the vicinity of the first area and having substantially the same phase difference as the first phase difference with respect to the reference face.

In the above-described crystallization apparatus, the predetermined light intensity distribution preferably has a plurality of unit distribution areas arranged in a predetermined period and having substantially the same two-dimensional distribution.

Each of the unit distribution areas has an inversely peaked distribution which is positioned in the vicinity of the center of the unit distribution area and whose light intensity rapidly increases radially toward periphery from an area having a lowest light intensity, and a tilted distribution whose light intensity slowly increases radially toward the periphery from the inversely peaked distribution.

A minimum value of the light intensity in each of the unit distribution areas preferably has a relative value of 0.2 to 0.7, when a maximum value of the light intensity in the unit distribution area is normalized into 1.

A shape of each of the unit distribution areas is preferably constituted as follows.

A width of the light intensity distribution in light intensity obtained by adding ⅖ of a difference between a maximum value and a minimum value to the minimum value of the light intensity in each of the unit distribution areas is between 0.5 and 1.5 μm, when the maximum value of the light intensity in the unit distribution area is normalized into 1.

The respective unit distribution areas are preferably arranged at an interval of 4 to 20 μm in a rectangular or triangular lattice form.

According to another aspect of the present invention, a crystallization method comprises:

passing laser light through a phase modulation device comprising a plurality of unit areas which are arranged in a certain period and which mutually have substantially the same pattern, and an optical image forming system to thereby produce a luminous flux having a predetermined light intensity distribution;

irradiating a non-single-crystal semiconductor film with a luminous flux having the predetermined light intensity distribution to melt the semiconductor film;

periodically producing a single growing crystal nucleus in a process in which a molten portion of the non-single-crystal semiconductor film solidifies; and growing crystals radially centering on the growing crystal nucleus to thereby form a film of a crystal grain array.

Here, each of the unit areas of the phase modulation device has:

a reference face having a certain phase;

a first area disposed in the vicinity of a center of each unit area and having a first phase difference with respect to the reference face; and a second area disposed in the vicinity of the first area and having substantially the same phase difference as the first phase difference with respect to the reference face.

In the above-described crystallization method, the non-single-crystal semiconductor film is preferably positioned in the vicinity of an actual focal position different from a calculated focal position of the optical image forming system, and subsequently irradiated with the luminous flux having the predetermined light intensity distribution.

In the above-described crystallization method, the predetermined light intensity distribution preferably has a plurality of unit distribution areas arranged in a predetermined period and having substantially the same two-dimensional distribution.

Each of the unit distribution areas has an inversely peaked distribution which is positioned in the vicinity of the center of the unit distribution area and whose light intensity rapidly increases radially toward periphery from an area having a lowest light intensity, and a tilted distribution whose light intensity slowly increases radially toward the periphery from the inversely peaked distribution.

A semiconductor film according to another aspect of the present invention is a semiconductor film formed on an insulating substrate by the crystallization method in order to prepare a device.

A crystal structure of the semiconductor film comprises crystal grains arranged at a periodic interval of 4 to 20 μm, and includes an only twin grain boundary inside the crystal grains.

According to another aspect of the present invention, a top gate type thin-film transistor comprises:

a semiconductor film formed on an insulating substrate by the crystallization method;

a gate insulating film disposed on the semiconductor film; and a gate electrode disposed on the semiconductor film via the gate insulating film.

A crystal structure of the semiconductor film comprises crystal grains arranged at a periodic interval of 4 to 20 μm, and includes an only twin grain boundary inside the crystal grains.

According to another aspect of the present invention, a bottom gate type thin-film transistor comprises:

a gate electrode disposed on an insulating substrate;

a gate insulating film disposed on the gate electrode; and a semiconductor film formed in such a manner as to coat the gate electrode via the gate insulating film by the crystallization method.

A crystal structure of the semiconductor film comprises crystal grains arranged at a periodic interval of 4 to 20 μm, and includes an only twin grain boundary inside the crystal grains.

According to another aspect of the present invention, a display device comprises:

an array substrate on which a pixel electrode and a thin-film transistor to drive the pixel electrode are formed;

an opposite substrate which is disposed facing the array substrate and on which an opposite electrode is formed; and an electro-optic material held in a gap between the array substrate and the opposite substrate.

The thin-film transistor comprises: a semiconductor film formed by the above-described crystallization method; and a gate electrode superimposed upon one face of the semiconductor film via a gate insulating film.

A crystal structure of the semiconductor film comprises crystal grains arranged at a periodic interval of 4 to 20 μm, and includes an only twin grain boundary inside the crystal grains.

According to another aspect of the present invention, a phase modulation device comprises: a plurality of unit areas arranged in a certain period and having substantially the same pattern.

Here, each of the unit areas has:

a reference face having a certain phase;

a first area disposed in the vicinity of a center of each unit area and having a first phase difference with respect to the reference face; and a second area disposed in the vicinity of the first area and having substantially the same phase difference as the first phase difference with respect to the reference face.

In the phase modulation device, the first area preferably has substantially the same pattern as that of the second area, and is brought into contact with the second area substantially in one point.

The first and second areas preferably have fan shapes.

The first and second areas preferably have a size of 0.3 to 1.5 μm in terms of a converted value of a diameter in a function face as a whole.

Each of the unit areas preferably has a plurality of third areas around the first and second areas, and each of the third areas has a dot pattern smaller than a predetermined dimension, and has substantially the same phase difference as that of the first area with respect to the reference face.

A proportion of the third area preferably changes with a distance from the center of each of the unit areas in the unit area.

Each unit area preferably has a plurality of cells smaller than the predetermined dimension, and a proportion of the third area in each cell changes with the cell.

The proportion is preferably reduced apart from the center of the unit area.

According to still another aspect of the present invention, a crystallization apparatus is an apparatus which irradiates a non-single-crystal semiconductor film with a luminous flux having a predetermined light intensity distribution to crystallize the semiconductor film, comprising.

The crystallization apparatus comprises:

a phase modulation device comprising a plurality of unit areas which are arranged in a certain period and which mutually have substantially the same pattern;

a luminous flux split device which splits a luminous flux passed through the phase modulation device into two incoherent luminous fluxes; and an optical image forming system disposed between the luminous flux split device and the non-single-crystal semiconductor film, each of the unit areas of the phase modulation device comprising:

a reference face having a certain phase;

a first area disposed in the vicinity of a center of each unit area and having a first phase difference with respect to the reference face; and a second area disposed in the vicinity of the first area and having a second phase difference whose absolute value is substantially equal to that of the first phase difference with respect to the reference face and whose sign is different from that of the first phase difference, the reference face having substantially the same phase between two adjacent unit areas, the first area having a substantially reversed phase difference with respect to the reference face between two adjacent unit areas, the second area having a substantially reversed phase difference with respect to the reference face between two adjacent unit areas.

In the crystallization apparatus, the predetermined light intensity distribution preferably has a plurality of unit distribution areas arranged in the predetermined period and having substantially the same two-dimensional distribution.

Each of the unit distribution areas has an inversely peaked distribution which is positioned in the vicinity of the center of the unit distribution area and whose light intensity rapidly increases radially toward periphery from an area having a lowest light intensity, and a tilted distribution whose light intensity slowly increases radially toward the periphery from the inversely peaked distribution.

A minimum value of the light intensity in each of the unit distribution areas preferably has a relative value of 0.2 to 0.7, when a maximum value of the light intensity in the unit distribution area is normalized into 1.

A shape of each of the unit distribution areas is preferably constituted as follows.

A width of the light intensity distribution in light intensity obtained by adding ⅖ of a difference between a maximum value and a minimum value to the minimum value of the light intensity in each of the unit distribution areas is between 0.5 and 1.5 μm, when the maximum value of the light intensity in the unit distribution area is normalized into 1.

The respective unit distribution areas are preferably arranged at an interval of 4 to 20 μm in a rectangular or triangular lattice form.

According to still another aspect of the present invention, in a crystallization apparatus, a non-single-crystal semiconductor film is irradiated with a luminous flux having a predetermined light intensity distribution to melt this semiconductor film;

subsequently a single growing crystal nucleus is periodically produced in a process in which a molten portion of the non-single-crystal semiconductor film solidifies; and subsequently crystals are grown radially centering on the growing crystal nucleus to thereby form a film of a crystal grain array.

Here, the predetermined light intensity distribution preferably has a plurality of unit distribution areas arranged in the predetermined period and having substantially the same two-dimensional distribution.

Each of the unit distribution areas has an inversely peaked distribution which is positioned in the vicinity of the center of the unit distribution area and whose light intensity rapidly increases radially toward periphery from an area having a lowest light intensity, and a tilted distribution whose light intensity slowly increases radially toward the periphery from the inversely peaked distribution.

In the above-described crystallization apparatus, a minimum value of the light intensity in each of the unit distribution areas preferably has a relative value of 0.2 to 0.7, when a maximum value of the light intensity in the unit distribution area is normalized into 1.

A shape of each of the unit distribution areas is preferably constituted as follows.

A width of the light intensity distribution in light intensity obtained by adding ⅔ of a difference between a maximum value and a minimum value to the minimum value of the light intensity in each of the unit distribution areas is between 0.5 and 1.5 µm, when the maximum value of the light intensity in the unit distribution area is normalized into 1.

The respective unit distribution areas are preferably arranged at an interval of 4 to 20 µm in a rectangular or triangular lattice form.

According to still another aspect of the present invention, a crystallization method comprises:

irradiating a non-single-crystal semiconductor film with a luminous flux having a predetermined light intensity distribution to melt the semiconductor film;

periodically producing a single growing crystal nucleus in a process in which a molten portion of the non-single-crystal semiconductor film solidifies; and growing crystals radially centering on the growing crystal nucleus to thereby form a film of a crystal grain array.

Here, the predetermined light intensity distribution has a plurality of unit distribution areas arranged in a predetermined period and having substantially the same two-dimensional distribution.

Each of the unit distribution areas has an inversely peaked distribution which is positioned in the vicinity of the center of the unit distribution area and whose light intensity rapidly increases radially toward periphery from an area having a lowest light intensity, and a tilted distribution whose light intensity slowly increases radially toward the periphery from the inversely peaked distribution.

In the crystallization method, preferably, the crystals are grown radially centering on the growing crystal nucleus, and a crystal grain array film including an only twin grain boundary therein is formed.

A semiconductor film according to still another aspect of the present invention is formed on an insulating substrate by the crystallization method in order to prepare a device.

A crystal structure of the semiconductor film comprises crystal grains arranged at a periodic interval of 4 to 20 µm, and includes an only twin grain boundary inside the crystal grains.

According to still another aspect of the present invention, a top gate type thin-film transistor comprises:

a semiconductor film formed on an insulating substrate by the crystallization method;

a gate insulating film disposed on the semiconductor film; and a gate electrode disposed on the semiconductor film via the gate insulating film.

A crystal structure of the semiconductor film comprises crystal grains arranged at a periodic interval of 4 to 20 µm, and includes an only twin grain boundary inside the crystal grains.

According to still another aspect of the present invention, a bottom gate type thin-film transistor comprises:

a gate electrode disposed on an insulating substrate;

a gate insulating film disposed on the gate electrode; and a semiconductor film formed in such a manner as to coat the gate electrode via the gate insulating film by the crystallization method.

A crystal structure of the semiconductor film comprises crystal grains arranged at a periodic interval of 4 to 20 µm, and includes an only twin grain boundary inside the crystal grains.

According to still another aspect of the present invention, a display device comprises:

an array substrate on which a pixel electrode and a thin-film transistor to drive the pixel electrode are formed;

an opposite substrate which is disposed facing the array substrate and on which an opposite electrode is formed; and an electro-optic material held in a gap between the array substrate and the opposite substrate.

The thin-film transistor comprises: a semiconductor film formed by the above-described crystallization method; and a gate electrode superimposed upon one face of the semiconductor film via a gate insulating film.

A crystal structure of the semiconductor film comprises crystal grains arranged at a periodic interval of 4 to 20 µm, and includes an only twin grain boundary inside the crystal grains.

According to still another aspect of the present invention, a phase modulation device comprises: a plurality of unit areas arranged in a certain period and having substantially the same pattern.

Here, each of the unit areas has:

a reference face having a certain phase;

a first area disposed in the vicinity of a center of each unit area and having a first phase difference with respect to the reference face; and a second area disposed in the vicinity of the first area and having a second phase difference whose absolute value is substantially equal to that of the first phase difference with respect to the reference face and whose sign is different from that of the first phase difference, the reference face having substantially the same phase between two adjacent unit areas, the first area having a substantially reversed phase difference with respect to the reference face between two adjacent unit areas, the second area having a substantially reversed phase difference with respect to the reference face between two adjacent unit areas.

In the phase modulation device, the first area preferably has substantially the same pattern as that of the second area, and is brought into contact with the second area substantially in one point.

The first and second areas preferably have fan shapes.

The first and second areas preferably have a size of 0.3 to 3 µm in terms of a converted value of a diameter in a function face as a whole.

Each of the unit areas preferably has a plurality of third areas and a plurality of fourth areas around the first and second areas.

Each of the third areas has a dot pattern smaller than a predetermined dimension, and has substantially the same phase difference as that of the first area with respect to the reference face, and each of the fourth areas has a dot pattern smaller than the predetermined dimension, and has substantially the same phase difference as that of the second area with respect to the reference face.

Proportions of the third and fourth areas preferably change with a distance from the center of each of the unit areas in the unit area.

Each unit area preferably has a plurality of cells smaller than the predetermined dimension, and proportions of the third and fourth areas in each cell change with the cell.

The proportion is preferably reduced apart from the center of the unit area.

According to the present invention, a high-quality semiconductor crystal thin film is obtained having an array structure comprising large crystal grains whose positions have been controlled by one-shot laser annealing. The thin-film transistor using the semiconductor film obtained in the present invention has a high mobility and smaller fluctuations in threshold voltage as compared with a conventional polysilicon thin-film transistor. When the thin-film transistor of the present invention is applied to the display device, for example, a liquid crystal display, an organic electroluminescent display or the like, it is possible to form a high-function calculation device or the like in a peripheral circuit. Therefore, the present invention has a great effect for realizing a system on panel. In the crystallization method of the present invention, the phase modulation device (or the phase modulation device and luminous flux split device) is only inserted in an optical path. Therefore, an optical system is not complicated, and much time is not required in adjusting the system. Since a depth of focus of the optical system is large, a process margin broadens, and the method of the present invention is suitable for mass production.

BRIEF DESCRIPTION OF THE SEVERAL VIEWS OF THE DRAWING

FIGS. 6A, 6B, 6C show a light intensity distribution obtained in an actual focus position in Embodiment 1;

FIGS. 8A, 8B, 8C show a typical relation between a change of a phase and light intensity in a point spread distribution range R;

FIGS. 9A, 9B show a relation between a pupil function and a point spread distribution function in an optical image forming system;

FIGS. 14A, 14B are diagrams schematically showing one example of a relation between an arrangement pattern of a unit area in the phase modulation device, and an array pattern of a formed crystal structure;

FIGS. 18A, 18B, 18C show a light intensity distribution obtained in each defocus position of −7 to −15 μm in Embodiment 2;

FIG. 19 is a diagram schematically showing a constitution of a phase modulation device in Embodiment 3;

FIGS. 20A, 20B, 20C show a light intensity distribution obtained in an actual focus position in Embodiment 3;

FIG. 24 is a diagram schematically showing a constitution of a phase modulation device in Embodiment 5;

FIG. 30 is a perspective view schematically showing a constitution of a display device according to one embodiment of the present invention;

FIG. 33 is a diagram schematically showing a constitution of a phase modulation device of Embodiment 10;

FIGS. 36A, 36B show a light intensity distribution obtained in a focus position by the phase modulation device and the luminous flux split device in Embodiment 10;

FIGS. 37A, 37B show a light intensity distribution obtained in a defocus position by the phase modulation device and the luminous flux split device in Embodiment 10;

FIGS. 40A, 40B show a light intensity distribution obtained in a focus position by the phase modulation device and the luminous flux split device in Embodiment 11;

FIGS. 41A, 41B show a light intensity distribution obtained in a defocus position by the phase modulation device and the luminous flux split device in Embodiment 11;

FIGS. 47A, 47B, 47C show a light intensity distribution obtained by the phase modulation device, when any luminous flux split device is not used in Embodiment 13;

FIGS. 48A, 48B show a light intensity distribution obtained in a focus position by the phase modulation device and the luminous flux split device in Embodiment 13;

FIGS. 49A, 49B show a light intensity distribution obtained in a defocus position by the phase modulation device and the luminous flux split device in Embodiment 13;

FIGS. 51A, 51B, 51C show a light intensity distribution obtained by the phase modulation device, when any luminous flux split device is not used in Embodiment 14;

FIGS. 52A, 52B show a light intensity distribution obtained in a focus position by the phase modulation device and the luminous flux split device in Embodiment 14.

DETAILED DESCRIPTION OF THE INVENTION

Embodiments of the present invention will be described with reference to the accompanying drawings.

Figure 1:
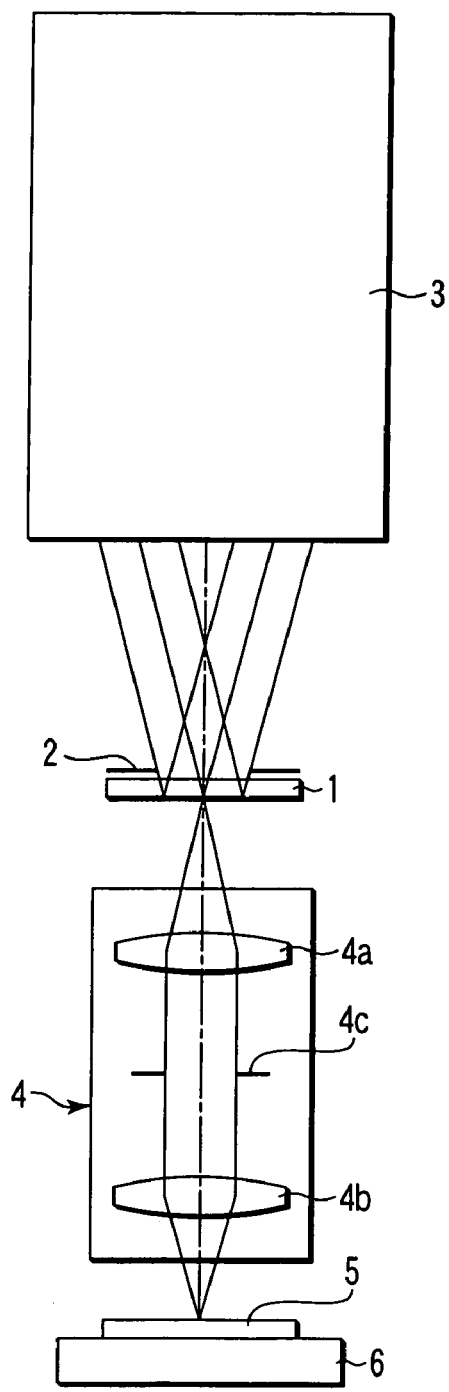
FIG. 1 is a diagram schematically showing a constitution of a crystallization apparatus according to one embodiment of the present invention.
Figure 2:
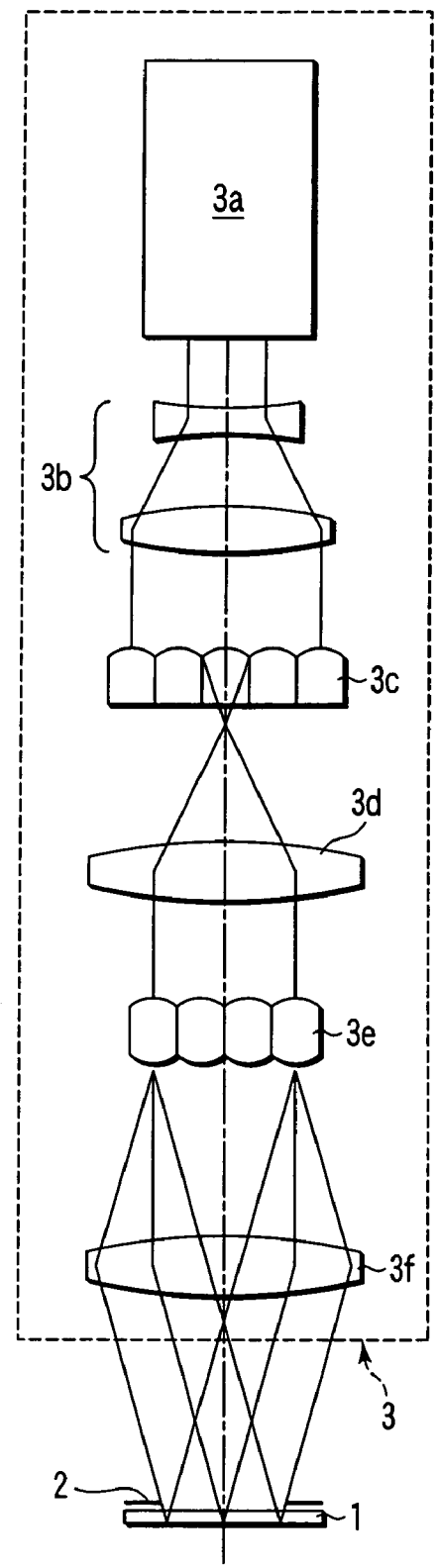
FIG. 2 is a diagram schematically showing an inner constitution of an illumination system of FIG. 1.

FIG. 1 is a diagram schematically showing a constitution of a crystallization apparatus according to one embodiment of the present invention. FIG. 2 is a diagram schematically showing an inner constitution of an illumination system of FIG. 1. Referring to FIGS. 1 and 2, the crystallization apparatus comprises a phase modulation device 1 for modulating a phase of an incident luminous flux to form a luminous flux having a predetermined light intensity distribution, and an illumination system 3 for illuminating the phase modulation device 1 via a diaphragm 2. A constitution and a function of the phase modulation device 1 will be described later.

The illumination system 3 comprises, for example, a KrF excimer laser light source 3a which supplies light having a wavelength of 248 nm. As the light source 3a, another appropriate light source that emits an energy light ray for melting a member to be treated may be used, such as an XeCl excimer laser light source or a YAG laser light source. Laser light supplied from the light source 3a is enlarged via a beam expander 3b, and thereafter enters a first fly eye lens 3c. Thus, a plurality of light sources are formed on a rear-side focal plane of the first fly eye lens 3c, and the luminous flux from the plurality of light sources illuminates an incidence face of a second fly eye lens 3e via a first optical capacitor system 3d in a superimposing manner.

As a result, light sources more than those on the rear-side focal face of the first fly eye lens 3c are formed on the rear-side focal face of the second fly eye lens 3e. The luminous flux from the plurality of light sources formed on the rear-side focal face of the second fly eye lens 3e illuminates the phase modulation device 1 via a second optical capacitor system 3f and the diaphragm 2 in the superimposing manner. Here, the first fly eye lens 3c and the first optical capacitor system 3d constitute a first homogenizer. The laser light supplied from the light source 3a is homogenized on the phase modulation device 1 with respect to an incidence angle by the first homogenizer.

Moreover, the second fly eye lens 3e and the second optical capacitor system 3f constitute a second homogenizer. The laser light whose incidence angle from the first homogenizer has been homogenized is homogenized on the phase modulation device 1 with respect to an incidence angle in each position in the plane by the second homogenizer. It is to be noted that a pair of cylindrical fly eye lenses may be used instead of the first fly eye lens 3c or the second fly eye lens 3e. Here, the cylindrical fly eye lens comprises a plurality of cylindrical lens elements which have a refraction function in a certain flat face and which do not have any refraction function in a flat face crossing the flat face at right angles.

Thus, the illumination system 3 irradiates the phase modulation device 1 with the laser light having a substantially uniform light intensity distribution. The laser light whose phase has been modulated by the phase modulation device 1 enters a substrate 5 to be treated via an optical image forming system 4. Here, a phase pattern face of the phase modulation device 1, and the substrate 5 to be treated are arranged in an optically conjugated manner in the optical image forming system 4. In other words, the substrate 5 to be treated is disposed in a plane (i.e., the image plane of the optical image forming system 4) optically conjugated with respect to the phase pattern face of the phase modulation device 1. The optical image forming system 4 comprises an aperture iris 4c between positive lens groups 4a and 4b.

The aperture iris 4c has a plurality of aperture irises whose openings (light transmitting portions) have different sizes. The plurality of aperture irises 4c may be constituted to be changeable with respect to an optical path. Alternatively, the aperture iris 4c may have irises whose opening sizes are continuously changeable. In any case, as described later, the size (i.e., image-side numerical aperture NA of the optical image forming system 4) of the opening of the aperture iris 4c is set in such a manner as to produce a desired light intensity distribution on the semiconductor film of the substrate 5 to be treated. It is to be noted that the optical image forming system 4 may be a refractive optical system, reflective optical system, or refractive/reflective optical system.

Moreover, the substrate 5 to be treated is constituted by depositing a lower-layer insulating film, a semiconductor thin film, and an upper-layer insulating film in order on the substrate. That is, in the substrate 5 to be treated, for example, an underlayer insulating film, a non-single-crystal film (e.g., an amorphous silicon film), and a cap film are successively formed on plate glass for a liquid crystal display by a chemical vapor development (CVD) process. The underlayer insulating film and the cap film are insulating films (e.g., $SiO_2$). The underlayer insulating film prevents the amorphous silicon film from being directly brought into contact with the glass substrate. Foreign matters such as Na are prevented from being mixed in the amorphous silicon film. Moreover, temperature of the amorphous silicon film is prevented from being directly conducted to the glass substrate. The amorphous silicon film is a crystallized semiconductor film.

The amorphous silicon film is heated, when incident light is absorbed. The cap film is heated, when a part of heat is conducted. The heat is accumulated in the amorphous silicon film. When the incidence of the light beam is interrupted, the temperature of a high-temperature portion drops relatively rapidly in an irradiated face of the amorphous silicon film. The above-described heat accumulating effect moderates a drop speed of the temperature, and promotes crystal growth of a lateral direction of a large grain diameter. The substrate 5 to be treated is positioned and held in a predetermined position on a substrate stage 6 by a vacuum chuck, an electrostatic chuck or the like.

Embodiment 1

Figure 3:
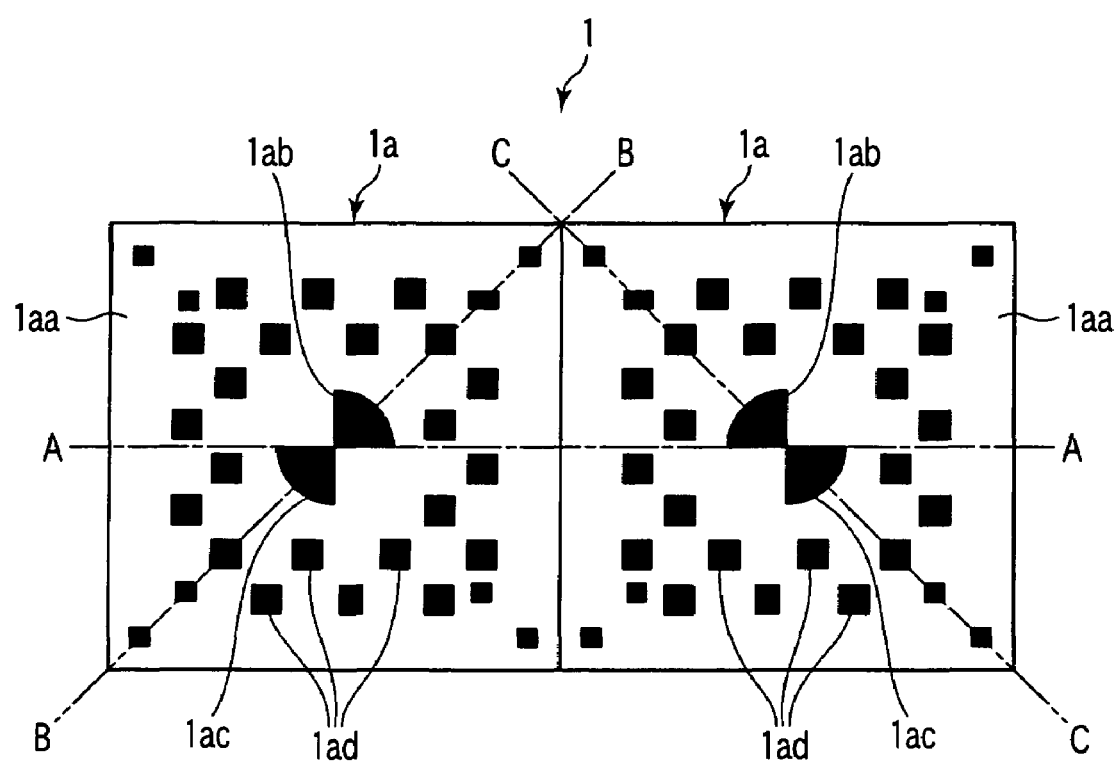
FIG. 3 is a diagram schematically showing a constitution of a phase modulation device of Embodiment 1.

FIG. 3 is a diagram schematically showing a constitution of a phase modulation device according to Embodiment 1 of the present invention. The phase modulation device 1 is a phase modulation device for preparing a semiconductor thin film comprising a 5 µm square crystal grain array. The phase modulation device 1 comprises a plurality of unit areas 1a having the same pattern, and the respective unit areas 1a are two-dimensionally arranged in a predetermined period. In FIG. 3, for simplicity of description, only two adjacent unit areas 1a having square shapes are shown. One side of each of the unit areas 1a is 5 µm in accordance with a converted value in the image plane of the optical image forming system 4. Dimensions of the phase modulation device 1 will be described hereinafter in accordance with converted values in the image plane of the optical image forming system 4.

The unit area 1a comprises a reference face (blank portion in the drawing) 1aa having a certain phase, a first area 1ab and a second area 1ac arranged in the vicinity of a center of the unit area 1a, and a plurality of third areas 1ad disposed around the first area 1ab and the second area 1ac. Here, each of the first area 1ab and the second area 1ac is a pattern having a fan shape obtained by dividing a circle having a radius of 0.5 µm into four equal parts, and the areas are arranged in such a manner that vertexes are brought into contact with each other in the center of the unit area 1a.

In Embodiment 1, 0.5 µm square unit cells (not shown) having square shapes are virtually set longitudinally/laterally and densely around the first area 1ab and the second area 1ac. Each cell is optically smaller than a radius of a point spread distribution range of the optical image forming system 4. Moreover, one third area 1ad is selectively disposed in each unit cell. A proportion of the third area 1ad in the unit cell is set in such a manner as to gradually decrease apart from a contact (center of the unit area 1a) between the first area 1ab and the second area 1ac. The first area 1ab, second area 1ac, and all third areas 1ad have a phase difference (relative phase at a time when a phase in the reference face 1aa is standardized as 0°) of +90° with respect to the reference face 1aa.

Figure 4A:
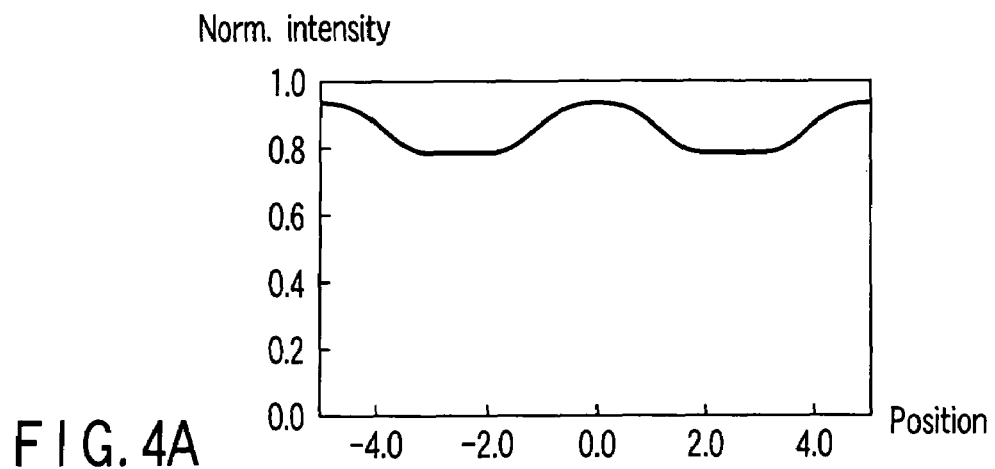
FIGS. 4A, 4B, 4C show a light intensity distribution obtained in each defocus position of +5 to −5 μm in Embodiment 1.
Figure 4B:
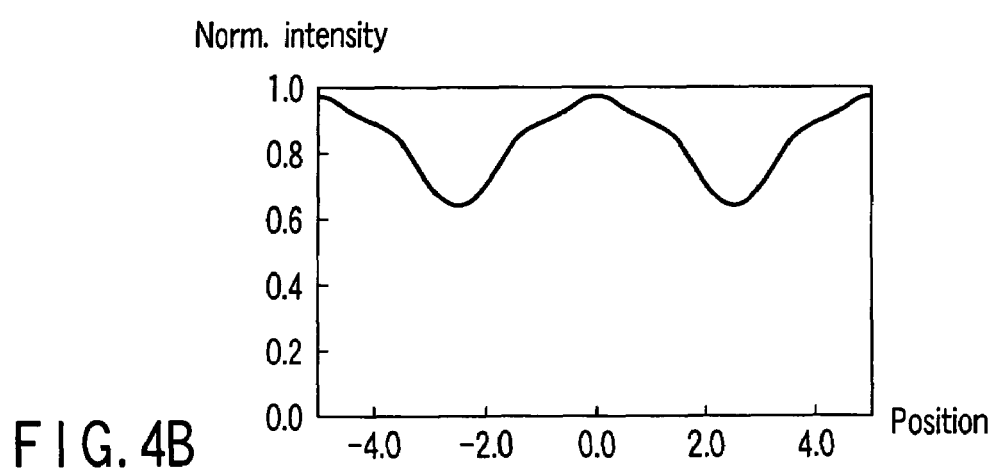

Here, a light intensity distribution is noted which is formed along a transverse line corresponding to a line A-A crossing a middle of the unit area 1a in the surface of the substrate 5 to be treated positioned in various positions with respect to the optical image forming system 4. First, on the surface defocused in a direction (upper side in FIG. 1) approaching the optical image forming system 4 by 5 µm (i.e., defocus of +5 µm) from a calculated focus position (focal position) of the optical image forming system 4 a light intensity distribution is formed along a crossing line corresponding to a crossing line A-A of the unit area 1a as shown in FIG. 4a on the surface of the positioned substrate 5 to be treated. A light intensity distribution is formed as shown in FIG. 4B along a crossing line corresponding to the crossing line A-A of the unit area 1a on the surface of the substrate 5 to be treated, positioned on the calculated focus position of the optical image forming system 4.

Figure 4C:
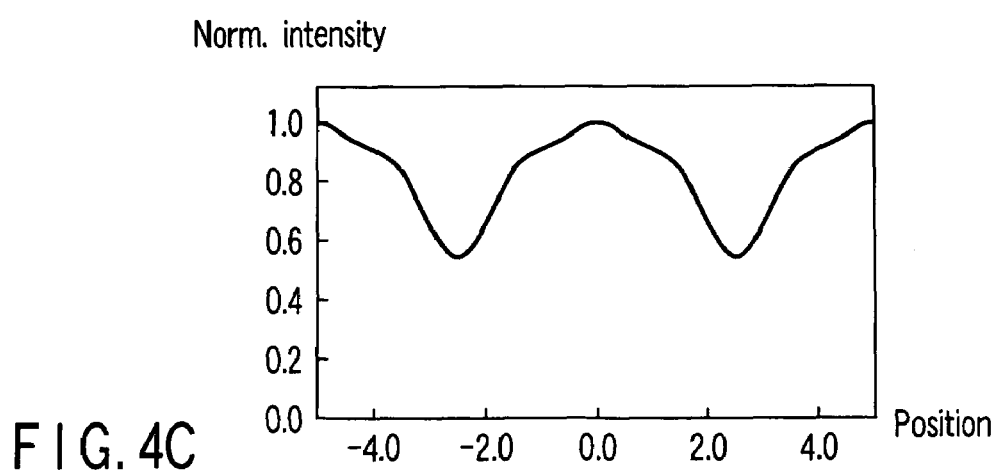
Figure 5A:
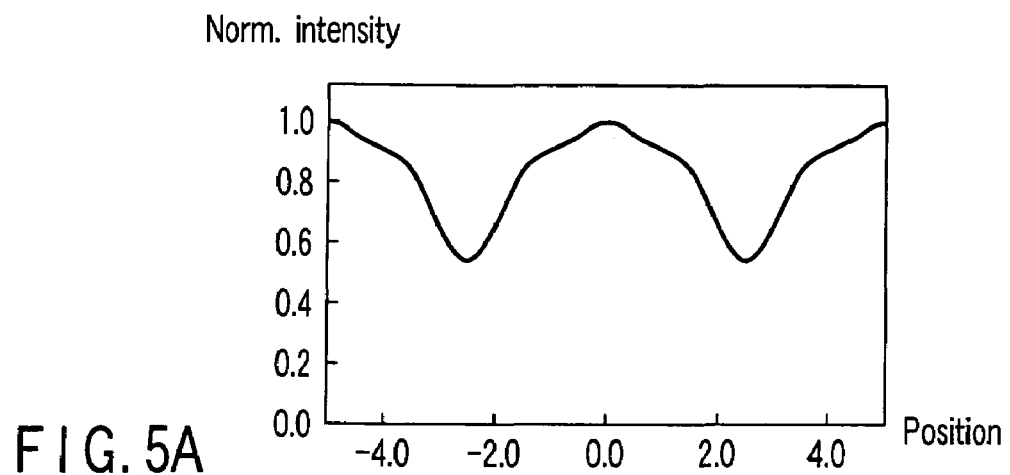
FIGS. 5A, 5B, 5C show a light intensity distribution obtained in each defocus position of −7 to −15 μm in Embodiment 1.

On the surface of the substrate 5 to be treated, defocused in a direction (lower part of FIG. 1) distant from the optical image forming system 4 by 5 µm (i.e., defocus of −5 µm) from the calculated focus position of the optical image forming system 4, a light intensity distribution is formed as shown in FIG. 4C along the crossing line corresponding to the crossing line A-A of the unit area 1a. Furthermore, on the surface of the substrate 5 to be treated, defocused in a direction distant from the optical image forming system 4 by 7 µm (i.e., defocus of −7 µm) from the calculated focus position of the optical image forming system 4 and positioned, a light intensity distribution is formed as shown in FIG. 5A along the crossing line corresponding to the crossing line A-A of the unit area 1a.

Figure 5B:
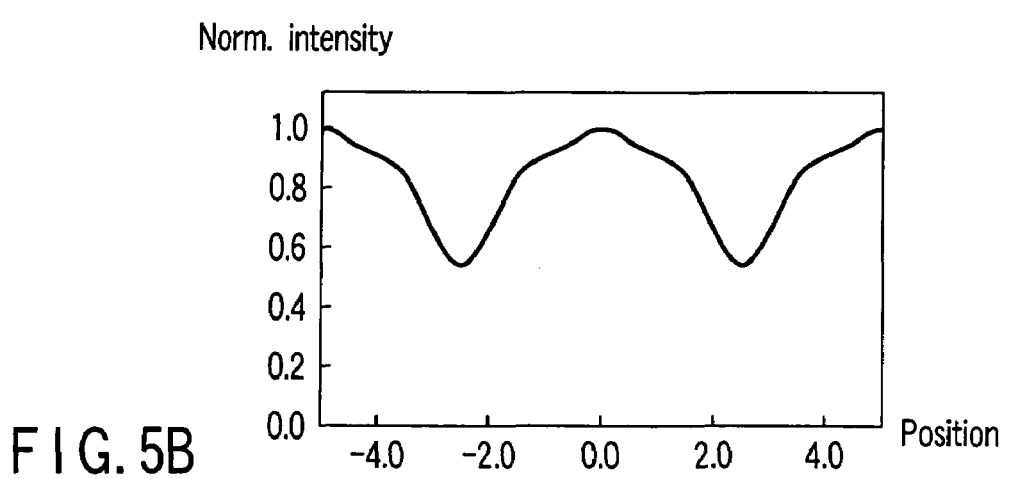
Figure 5C:
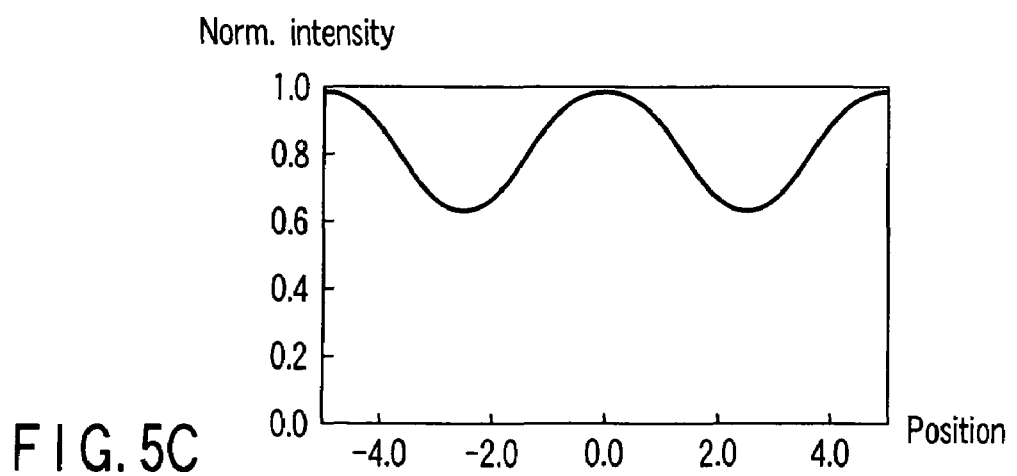

Moreover, on the surface of the substrate 5 to be treated, defocused in a direction distant from the optical image forming system 4 by 10 µm (i.e., defocus of −10 µm) from the calculated focus position of the optical image forming system 4 and positioned, a light intensity distribution is formed as shown in FIG. 5B along the crossing line corresponding to the crossing line A-A of the unit area 1a. Finally, on the surface of the substrate 5 to be treated, defocused in a direction distant from the optical image forming system 4 by 15 µm (i.e., defocus of −15 µm) from the calculated focus position of the optical image forming system 4 and positioned, a light intensity distribution is formed as shown in FIG. 5C along the crossing line corresponding to the crossing line A-A of the unit area 1a.

It is to be noted that in the following embodiments, a magnification of the optical image forming system 4 telecentric on opposite sides is set to ⅕, the image-side numerical aperture NA is set to 0.13, and an illumination sigma value (numerical aperture of an illumination system/object-side numerical aperture of the optical image forming system 4) is set to 0.43. In FIGS. 4A to 4C and FIGS. 5A to 5C, the ordinate indicates light intensity, and shows a relative value at a time when the maximum value is normalized into 1. The abscissa indicates a distance (µm) from a point corresponding to the center of the unit area 1a. It is to be noted that in this specification, all the light intensity distributions are displayed in accordance with a method similar to the above-described method.

As shown in FIGS. 4A to 4C and FIGS. 5A to 5C, referring to the light intensity distribution obtained by changing the position of the substrate 5 to be treated with respect to the optical image forming system 4, a state in which the light intensity rapidly increases from a bottom peak (position where the light intensity is lowest) is kept between the calculated focus position and a defocus position of −10 µm. A shape of the light intensity distribution is kept between the calculated focus position and a defocus position of −15 µm. That is, it is seen in Embodiment 1 that a depth of focus of ±5 to ±7 µm is secured.

In this manner, a phase difference is 90° in the phase modulation device 1 of Embodiment 1, and different from 180°. Therefore, an actual focus position shifts from the calculated focus position. Referring to FIGS. 4A to 4C and FIGS. 5A to 5C, it is seen that a gradient of the light intensity increasing from the bottom peak is largest in a light intensity distribution obtained from a position defocused by −7 µm from the calculated focus position, and a calculated defocus position of −7 μm is an actual focus position.

In Embodiment 1, light intensity distributions shown in FIGS. 6A to 6C are formed on the surface of the substrate 5 to be treated positioned in the actual focus position of the optical image forming system 4. That is, the light intensity distribution shown in FIG. 6A is formed along a crossing line corresponding to the crossing line A-A of the unit area 1a of the phase modulation device 1 in FIG. 3. The light intensity distribution shown in FIG. 6B is formed along a slanted line corresponding to a rightward ascending diagonal line B-B of the unit area 1a on the left side. The light intensity distribution shown in FIG. 6C is formed along a slanted line corresponding to a leftward ascending diagonal line C-C of the unit area 1a on the right side. Referring to FIGS. 6A to 6C, it is seen that there is little anisotropy in the light intensity distribution obtained via the phase modulation device 1 of the Embodiment 1.

Moreover, it is seen from FIG. 6A that a bottom peak having a smallest light intensity is formed corresponding to a contact (i.e., the center of the unit area 1a) between the first area 1ab and the second area 1ac. An inversely peaked distribution whose light intensity rapidly increases is formed radially toward periphery from the bottom peak by functions of the first area 1ab and second area 1ac. A tilted distribution whose light intensity slowly increases is formed radially toward the periphery from the inversely peaked distribution by functions of a plurality of third areas 1ad. For example, a pattern of a phase step of the phase modulation device 1 is obtained, when the surface of a quartz glass substrate is worked, and a thickness distribution corresponding to a predetermined phase is formed. The quartz glass substrate can be worked by selective etching or focused ion beam (FIB) working.

Next, a proportion of the third area 1ad is set in such a manner as to decrease apart from the center of the unit area 1a. Accordingly, the tilted distribution of the light intensity is obtained in such a manner that the intensity increases apart from the inversely peaked distribution. This principle will be described.

FIGS. 7A to 7F are explanatory views of the principle concerning a relation between the proportion of the third area and the light intensity distribution. In general, a light amplitude distribution U(x, y) of an image by the phase modulation device 1 is represented by the following equation (1). It is to be noted that in the equation (1), T(x, y) denotes the complex amplitude transmittance distribution of the phase modulation device 1, * denotes the convolution, and ASF(x, y) denotes the point spread distribution function of the optical image forming system 4. Here, the point spread distribution function is defined as amplitude distribution of a point image by the optical image forming system.

$$U(x,y)=T(x,y)*ASF(x,y) \quad (1)$$

It is to be noted that since amplitude is uniform, a complex amplitude transmittance distribution T of the phase modulation device 1 is represented by the following equation (2). It is to be noted that in the equation (2), $T_0$ denotes a certain value, and $\phi(x, y)$ denotes the phase distribution.

$$T=T_0 \cdot \exp(i\phi(x,y)) \quad (2)$$

Moreover, in a case where the optical image forming system 4 has a uniform circular pupil and there is not any aberration, a relation shown in the following equation (3) is established concerning the point spread distribution function ASF(x, y). It is to be noted that in the equation (3), $J_1$ denotes the Bessel function, λ denotes the wavelength of light, and NA denotes the image-side numerical aperture of the optical image forming system 4 as described above.

$$ASF(x,y) \propto 2 \cdot J_1(2\pi/\lambda \cdot NA \cdot r)/(2\pi/\lambda \cdot NA \cdot r) \quad (3),$$

where $r=(x^2+y^2)^{1/2}$

Figure 7A:
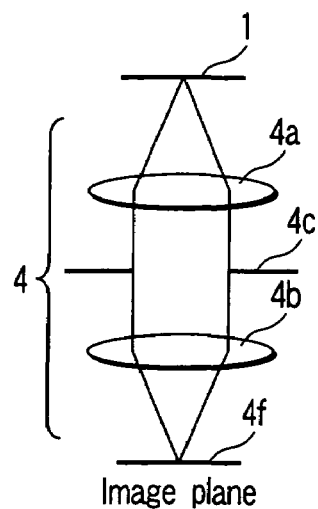
FIGS. 7A to 7F are explanatory views of a principle concerning a relation between a proportion of a third area and light intensity distribution.
Figure 7B:
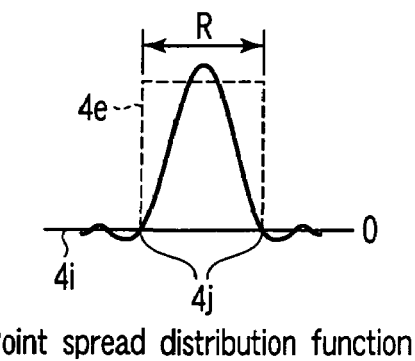
Figure 7C:
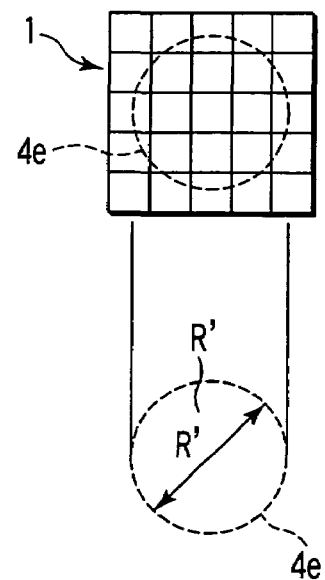
Figure 7E:
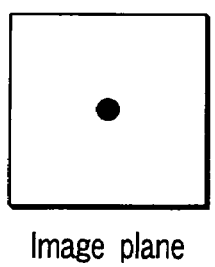

The point spread distribution function of the optical image forming system 4 shown in FIG. 7A is shown in FIG. 7B. When the point spread distribution function is approximated with a cylindrical shape 4e (shown by a broken line in FIG. 7C) having a diameter R, a complex amplitude distribution integrated in a circle having a diameter R' (value optically corresponding to the diameter R) on the phase modulation device 1 shown in FIG. 7C determines a complex amplitude on an image plane 4f. As described above, the light amplitude of the image formed on the image plane 4f, that is, the light intensity is given by convolution of the complex amplitude transmittance distribution and the point spread distribution function of the phase modulation device 1. When the point spread distribution function is approximated and considered with the cylindrical shape 4e, a result obtained by integrating the complex amplitude transmittance distribution of the phase modulation device 1 with the uniform weight constitutes a complex amplitude in the image plane 4f in a circular point spread distribution range R shown in FIG. 7C, and square of the absolute value is light intensity. It is to be noted that the point spread distribution range R in the optical image forming system 4 means a range of a curve of FIG. 7B drawn by the point spread distribution function inside intersections 4j with a zero point 4i.

Figure 7D:
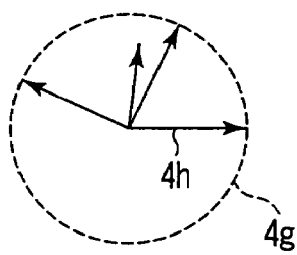
Figure 7F:
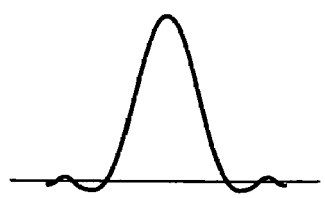

Therefore, the less a change of a phase in the point spread distribution range R is, the more the light intensity increases. Conversely, the larger the change of the phase is, the smaller the light intensity becomes. This respect is easily understood considering from a sum of a phase vector 4h in a unit circle 4g as shown in FIG. 7D. When the image plane 4f is an object, for example, a semiconductor film, the point spread distribution function of FIG. 7B is a point spread distribution function shown in FIG. 7F.

FIGS. 8A to 8C are diagrams showing a typical relation between the change of the phase and light intensity in the point spread distribution range R. FIG. 8A is a diagram showing a case where phase values of four areas are all 0°. A sum of four phase vectors 5g in a 0° direction corresponds to an amplitude 4E, and the square corresponds to a light intensity 16I.

FIG. 8B is a diagram showing a case where a phase value of two areas is 0°, and two other areas have a phase value of 90°. The sum of two phase vectors in the 0° direction and two phase vectors in a 90° direction corresponds to amplitude $2\sqrt{2}E$, and the square corresponds to a light intensity 8I.

FIG. 8C shows a case where four areas comprise an area having a phase difference of 0°, an area having a phase value of 90°, an area having a phase value of 180°, and an area having a phase value of 270°. The sum of a phase vector 5s in a 0° direction, a phase vector 5t of a 90° direction, a phase vector 5u of a 180° direction, and a phase vector 5v of a 270° direction corresponds to an amplitude 0E, and the square corresponds to a light intensity 0I.

FIGS. 9A, 9B are diagrams showing a relation between a pupil function and a point spread distribution function in the optical image forming system 4. In general, the point spread distribution function is given by Fourier transform of a pupil function. Concretely, when the optical image forming system 4 has a uniform circular pupil, and there is not any aberration, a point spread distribution function ASF(x, y) is represented by the above-described equation (3). However, this does not apply in a case where the aberration exists in the optical image forming system 4, or there is a uniform function of a pupil other than the uniform circular pupil.

In the case where the system has a uniform circular pupil and does not have any aberration, it is known that a radius R/2 of a middle area (i.e., airy disk) is represented by the following equation (4) until the point spread distribution function first reaches 0.

$$R/2 = 0.61 \cdot \lambda / NA \qquad (4)$$

In this specification, as shown in FIGS. 7B, 9B, the point spread distribution range R means a circular middle area until a point spread distribution function F(x) first reaches 0. As apparent from FIGS. 8A to 8C, in a case where a plurality of (four in FIGS. 8A to 8C) phase modulation units are included in a circle optically corresponding to the point spread distribution range R of the optical image forming system, it is possible to control the amplitude of the light, that is, the intensity of the light analytically in accordance with simple calculation by the sum of a plurality of phase vectors 5g. As a result, a comparatively complicated light intensity distribution can be comparatively easily obtained.

Therefore, according to the present invention, since the light intensity is freely controlled, a phase modulation unit of the phase modulation device 1 needs to be optically smaller than a radius R/2 of the point spread distribution range R of the optical image forming system 4. In other words, the size of the phase modulation unit of the phase modulation device 1 on the image side of the optical image forming system 4 needs to be smaller than the radius R/2 of the point spread distribution range R of the optical image forming system 4. Here, the phase modulation unit is a size of one shortest side of the cell, for example, in the above-described cell type, and is a length of one side in a pixel type.

Figure 10A:
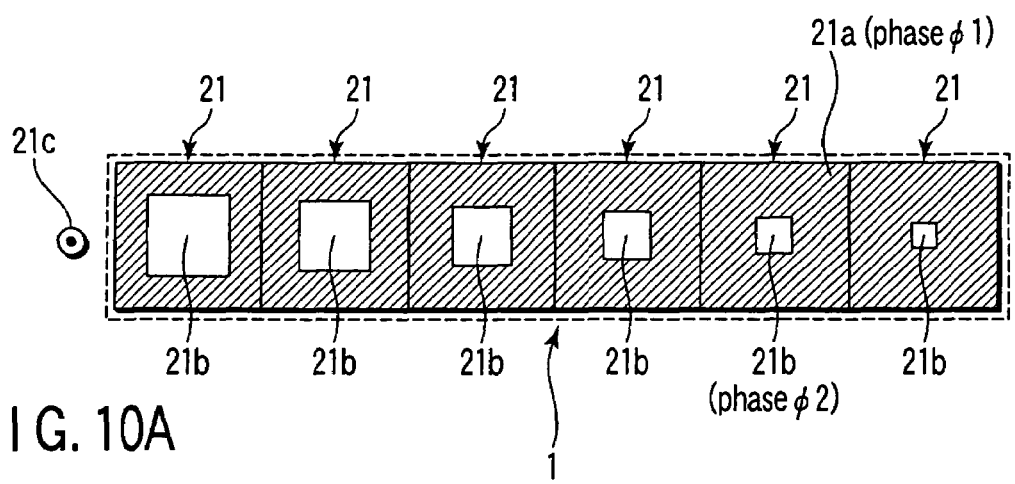
FIGS. 10A, 10B are diagrams schematically showing a cell type constitution corresponding to a third area of the phase modulation device shown in FIG. 3.
Figure 10B:
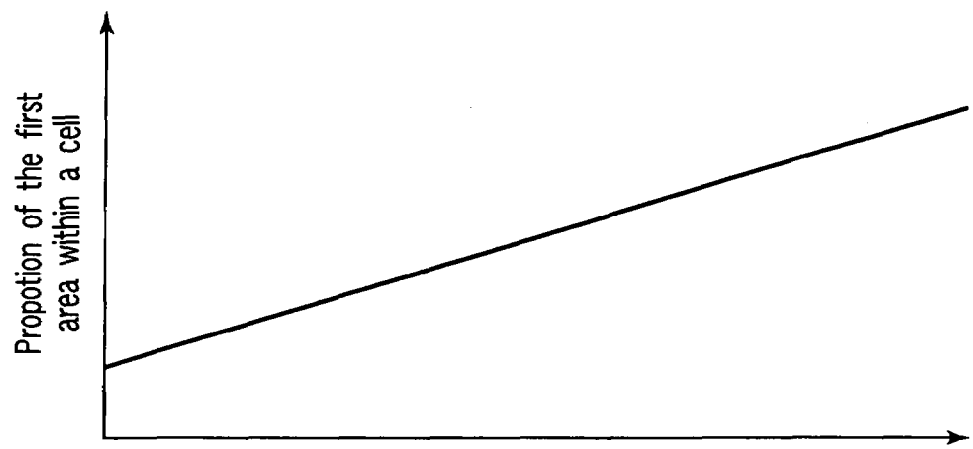

FIGS. 10A, 10B are diagrams schematically showing a cell type constitution corresponding to a third area of the phase modulation device shown in FIG. 3. Referring to FIG. 10A, the phase modulation device has a first area (shown by a slanted line portion in the drawing) 21a having a first phase value ϕ1, and a second area (shown by a blank portion in the drawing) 21b having a second phase value ϕ2. The phase modulation device has a plurality of cells (shown by rectangular broken lines in the drawing) 21 each having a size optically smaller than the radius R/2 of the point spread distribution range R of the optical image forming system 4.

As shown in FIG. 10B, the proportions of the first area 21a having the phase value ϕ1 (0°) and the second area 21b having the phase value ϕ2 (90°) in each cell 21 change with each cell. In other words, the proportions of the first area 21a having the phase value ϕ1 and the second area 21b having the phase value ϕ2 have a distribution of a phase change with position. Further concretely, the proportion of the second area 21b having the phase value ϕ2 in the cell is largest in the cell on the left side in the drawing, smallest in the cell on the right cell in the drawing, and monotonously changes therebetween. Incident light upon the phase modulation device 1 passes through a back surface direction from a front surface of the drawing as shown by an arrow 21c in FIG. 10A.

As described above, the phase modulation device shown in FIG. 10A has a phase distribution based on a phase modulation unit 21 (cell) having a size optically smaller than the radius R/2 of the point spread distribution range R of the optical image forming system 4. Therefore, the proportion (i.e., the sum of two phase vectors) of the first area 21a and second area 21b in each phase modulation unit 21 is appropriately changed. Accordingly, it is possible to control the light intensity distribution formed on the substrate to be treated analytically in accordance with simple calculation. The phase modulation device 1 having the first and second phase values ϕ1, ϕ2 is obtained, for example, by working quartz glass and forming a thickness distribution corresponding to the first and second phase values ϕ1, ϕ2. The thickness of quartz glass can be controlled by selective etching or FIB. A pattern of a phase step of the phase modulation device 1 is obtained, for example, by working the surface of the quartz glass substrate and forming a thickness distribution corresponding to a predetermined phase. The quartz glass substrate can be worked by selective etching or focused ion beam (FIB) working.

Figure 11:
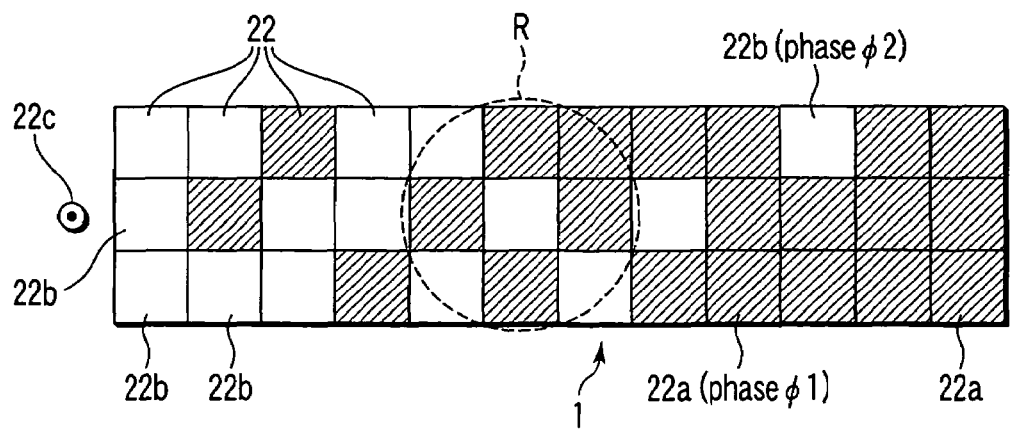
FIG. 11 is a diagram schematically showing a pixel type constitution different from the third area of the phase modulation device shown in FIG. 3.

FIG. 11 is a diagram schematically showing a pixel type constitution different from the third area of the phase modulation device shown in FIG. 3. Referring to FIG. 11, the phase modulation device 1 has a plurality of rectangular pixels 22 each of which is optically smaller than a radius R/2 of the point spread distribution range R of the optical image forming system 4. The plurality of pixels 22 are arranged longitudinally/laterally and densely, and each pixel 22 has a certain phase value. Concretely, the pixel has a first pixel (shown by a slanted line portion in the drawing) 22a having a first phase value ϕ1 (e.g., 0°), and a second pixel (shown by a blank portion in the drawing) 22b having a second phase value ϕ2 (e.g., 90°). Incident light upon the phase modulation device 1 passes through a back surface direction from a front surface of the drawing as shown by an arrow 22c in FIG. 11.

As shown in FIG. 11, the number of pixels having an equal phase value per unit range (shown by a broken-line circle in the drawing) optically corresponding to the point spread distribution range R of the optical image forming system 4 changes with each unit range. In other words, the phase modulation device 1 has a phase distribution in which the proportion of the first pixel 22a as a first area having the phase value ϕ1, and the proportion of the second pixel 22b as a second area having the phase value ϕ2 change with the position in the same manner as in FIG. 10A.

As described above, the phase modulation device shown in FIG. 11 has a phase distribution based on the phase modulation unit (pixel) 22 having a size optically smaller than the radius R/2 of the point spread distribution range R of the optical image forming system 4. Therefore, the proportion of the first pixel 22a and second pixel 22b in the unit range (not shown) optically corresponding to the point spread distribution range R of the optical image forming system 4, that is, the sum of a plurality of phase vectors is appropriately changed, and accordingly it is possible to control the light intensity distribution formed on the substrate to be treated analytically in accordance with the simple calculation.

Figure 12:
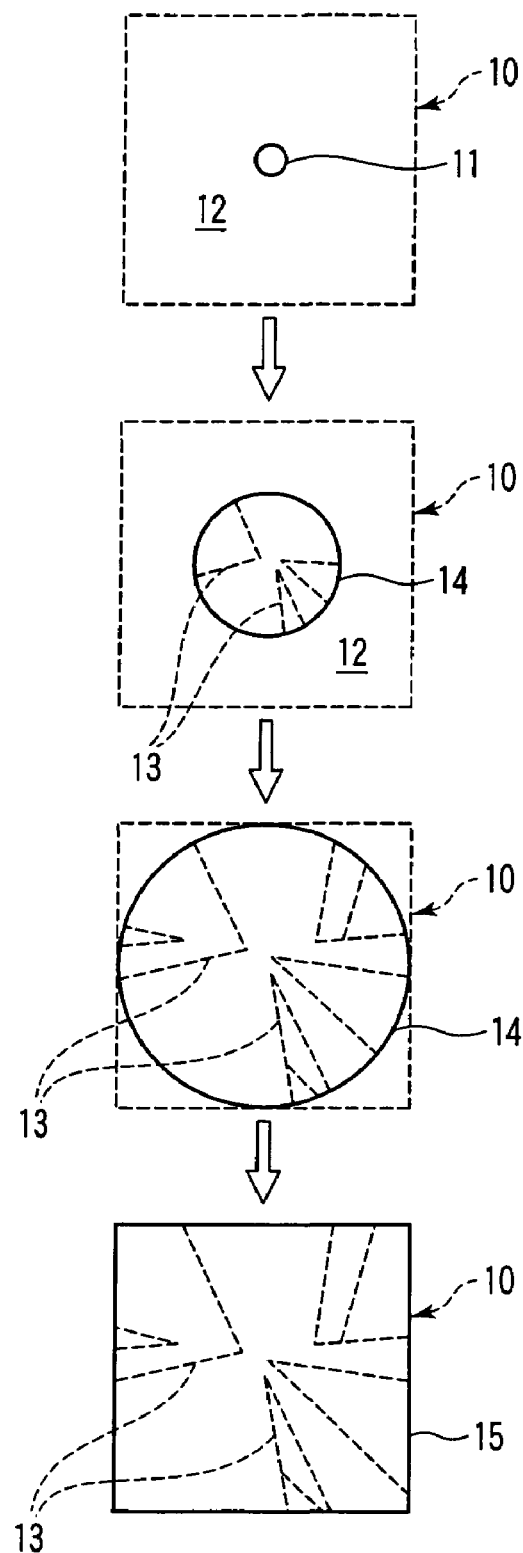
FIG. 12 is a diagram schematically showing a crystallization process of a semiconductor thin film in the present invention.

FIG. 12 schematically shows a crystallization process of a semiconductor thin film in the present invention. In FIG. 12, a rectangular area shown by a broken line is a unit substrate area 10 (5 μm square area having a square shape in Embodiment 1) corresponding to one unit area 1a of the phase modulation device 1 on the surface of the substrate 5 to be treated. In the unit substrate area 10, after repeating generation and extinction of a crystal nucleus in the vicinity of the center of a molten area 12 first in the beginning of solidification, the crystal nucleus coheres to form a diameter not less than a growable critical diameter, and a single growing crystal nucleus 11 is generated. This growing crystal nucleus 11 grows radially in all directions with an elapse of time, and a solid-fluid interface 14 spreads.

Since crystallization of the semiconductor thin film by laser annealing according to the present invention is performed in an ultraquenching solidification system, the generated crystal nucleus does not grow in all the directions while maintaining opposite orientations. For example, the crystals grow while keeping a face orientation of the generated crystal nucleus as such in a crystal direction having a comparatively high growth speed, for example, <110> direction. However, twin crystal transformation is performed in a crystal direction having a comparatively low growth speed, in which densest faces are piled up as in, for example, a <111> direction. Accordingly, the direction is changed to a face orientation having a higher growth speed, and the crystals grow. This is because the crystals grow at a speed equal to that of a direction of a high growth speed in accordance with a temperature gradient which spreads radially in a concentric circle. As a result, twin grain boundaries 13 enter crystal grains in a final structure. A forming process of this twin grain boundary 13 is different from that of a grain boundary 15.

Figure 13A:
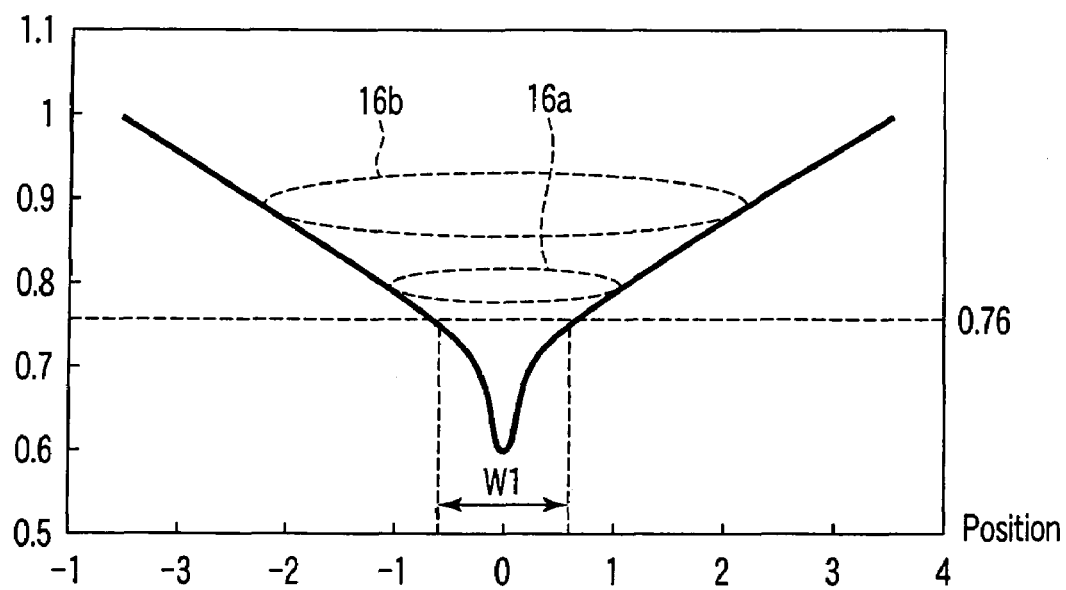
FIGS. 13A, 13B are diagrams schematically showing one example of a light intensity distribution suitable for realizing a crystallization process shown in FIG. 12.
Figure 13B:
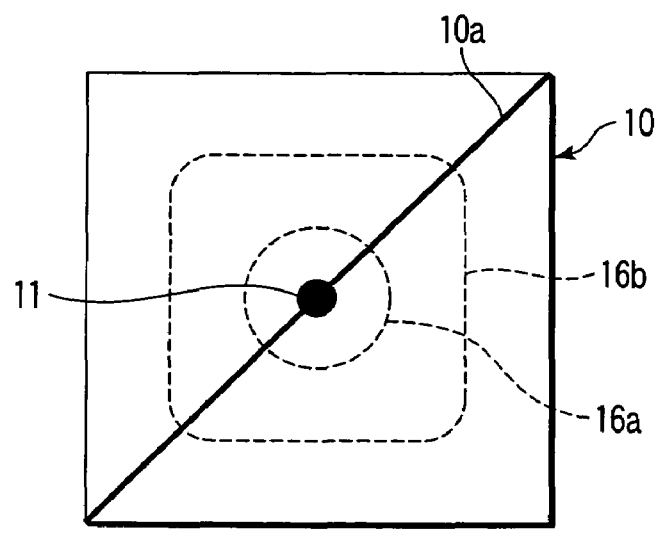

FIG. 13A schematically shows one example of a light intensity distribution suitable for realizing the crystallization process shown in FIG. 12. The light intensity distribution shown in FIG. 13A is a distribution along a diagonal line 10a of the unit substrate area 10 shown in FIG. 13B. It is to be noted that in FIG. 13B, broken lines 16a, 16b show contour lines of the light intensity (or temperature). In the light intensity distribution shown in FIG. 13A, an inversely peaked distribution is formed in a middle, and a tilted distribution is formed around the middle. In a inversely peaked distribution portion, the light intensity is smallest in the vicinity of the center of the unit substrate area 10, and the light intensity rapidly increases radially toward the periphery from a bottom peak having a smallest light intensity. In a tilted distribution portion, the light intensity slowly increases radially toward the periphery from the inversely peaked distribution.

When the substrate 5 to be treated is irradiated with laser light having a funnel-shaped light intensity distribution as shown in FIG. 13A, the semiconductor thin film of the substrate 5 to be treated absorbs light, and energy of the light is converted into heat. Therefore, a temperature distribution of the semiconductor thin film at the time of crystallization start is also as shown in FIG. 13A, and therefore the growing crystal nucleus 11 is produced only in a central area of the unit substrate area 10. The light intensity has a threshold value $\alpha$ closely related to the start of the crystal growth. In a portion in which the light intensity is not more than an $\alpha$ value, a semiconductor film (Si) is not molten. Even if the film is molten, only a part of the surface is molten, the portion remains in a polysilicon state. The crystal growth starts from where the light intensity exceeds the $\alpha$ value.

Therefore, the value of the light intensity in the bottom of the light intensity distribution is preferably slightly below this $\alpha$ value. Concretely, the intensity of the bottom peak of the light intensity distribution preferably has a relative value of 0.2 to 0.7. When the intensity of the bottom peak is less than 0.2, the intensity is excessively small, and an only central portion remains in an amorphous state without being crystallized. When the intensity of the bottom peak exceeds 0.7, the intensity becomes excessively large, and the growing crystal nucleus cannot be generated only in the central portion. It is to be noted that the intensity of the bottom peak of the light intensity distribution is preferably 0.5 to 0.6 in order to realize the crystallization process further satisfactorily.

In the inversely peaked distribution in which the light intensity rapidly increases radially toward the periphery from the bottom peak of the vicinity of the center, a range of the light intensity obtained by adding about ⅔ of the difference between maximum and minimum values to the minimum value (i.e., the value of the light intensity in the bottom peak) of the light intensity is preferable. In the light intensity distribution shown in FIG. 13A, the light intensity obtained by adding ⅔ of the difference between the maximum and minimum values to the minimum value of the light intensity has a relative value of 0.76.

A peak width W1 of the light intensity distribution in the light intensity of 0.76 is preferably 0.5 to 1.5 μm. When the peak width W1 is less than 0.5 μm, the intensity is excessively small, ambient heat diffuses in the center which is a light intensity minimum position. A lowest temperature area spreads, and the growing crystal nucleus cannot be single. When the peak width W1 exceeds 1.5 μm, and is excessively large, the lowest temperature area at a crystallization start time spreads, and the growing crystal nucleus cannot be single.

As shown in FIG. 13A, the light intensity preferably slowly increases in the periphery of the inversely peaked distribution. That is, a funnel-shaped tilted distribution is preferable in which the light intensity linearly increases toward the outside from the center. This is because the growing crystal nucleus 11 produced in the cell of the unit substrate area 10 is radially grown, and the inside of the unit substrate area 10 is formed into one crystal grain. In this funnel-shaped tilted distribution, a temperature gradient toward the outside also becomes linear, and the growth of the crystals does not stop midway. Therefore, the crystallized semiconductor film having a further large diameter can be produced. If an irregularity distribution exists in the periphery of the inversely peaked distribution, and such a peak that the light intensity rapidly increases exists, then, when the semiconductor thin film absorbs laser light, the temperature of the area excessively rises, and there is a possibility that the thin film is broken.

FIGS. 14A, 14B schematically show one example of a relation between an arrangement pattern of a unit area in the phase modulation device, and an array pattern of a formed crystal structure. In the arrangement pattern of the unit area 1a of the phase modulation device 1 shown in FIG. 14A, for the sake of simplicity, the only first area 1ab and second area 1ac disposed in the vicinity of the center of the unit area 1a and having fan shapes are shown. In the array pattern of the crystal structure shown in FIG. 14A, the grain boundary 15 is shown by a solid line, and the twin grain boundary 13 is shown by a broken line.

As seen from FIG. 14A, one crystal grain having a square shape is formed corresponding to one unit area 1a of the phase modulation device 1. That is, a plurality of crystal grains having square shapes form a lattice-shaped array pattern corresponding to a plurality of unit area 1a arranged in a lattice form in a predetermined period, and a crystallized semiconductor film having a satisfactory quality is obtained. Moreover, the only twin grain boundary 13 is included in the crystal grain. When a generation position of the growing crystal nucleus 11 is controlled in this manner, positions of the crystal grains can also be two-dimensionally controlled.

Figure 15A:
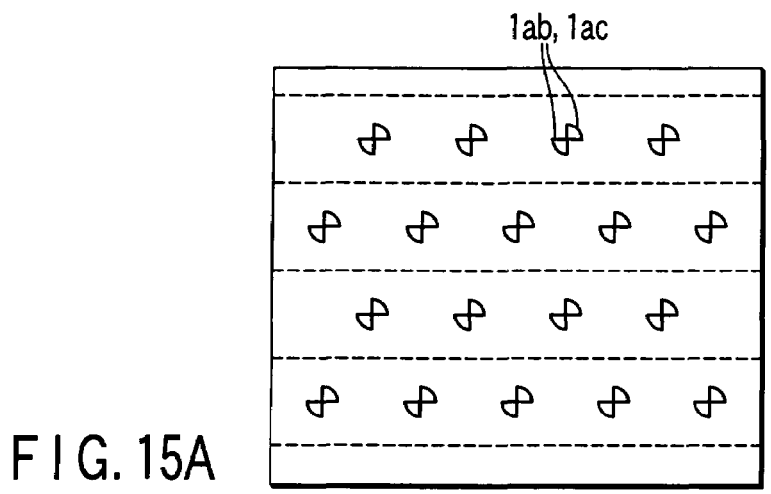
FIGS. 15A, 15B are diagrams schematically showing another example of the relation between the arrangement pattern of the unit area in the phase modulation device, and the array pattern of the formed crystal structure.
Figure 15B:
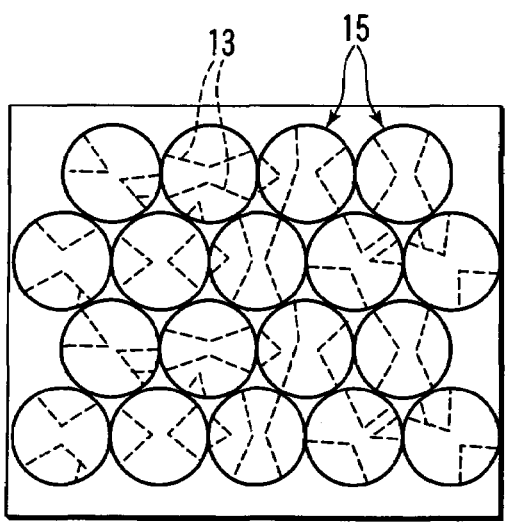

FIG. 15 schematically show another example of the relation between the arrangement pattern of the unit area in the phase modulation device, and the array pattern of the formed crystal structure. In FIG. 15A, unlike FIG. 14A, a plurality of unit areas 1a, that is, the first areas 1ab and second areas 1ac are arranged in a regularly triangular lattice form in a predetermined period. As a result, in the corresponding crystal structure, as shown in FIG. 15B, a plurality of circular crystal grains form a regularly triangular lattice array pattern. Also in this case, the only twin grain boundary 13 is included in the crystal grain, and the positions of the crystal grains can also be two-dimensionally controlled.

An interval of the unit area 1a of the phase modulation device 1 shown in FIGS. 14A, 14B and FIGS. 15A, 15B has a close relation with respect to the crystal grain diameter of the finally formed crystal structure. The interval of the unit area 1a of the phase modulation device 1 is preferably 4 to 20 µm in accordance with a converted value in the image plane of the optical image forming system 4. When the interval of the unit area 1a is less than 4 µm, the interval is excessively small, the grain diameter of the crystal grain is reduced, and the crystallized semiconductor thin film having a satisfactory quality is not obtained. When the interval of the unit area 1a exceeds 20 µm, the interval is excessively large, and the crystal growth stops midway. Therefore, the crystal grain array which coats substantially the whole surface of the semiconductor film is not obtained.

The shape of the phase area 1ab, 1ac of the reversed phase difference, disposed in the center of the unit area 1a, does not necessarily have to have a fan shape, and a polygonal shape such as a quadrangle may be formed. The area of the phase area 1ab, 1ac may be set in such a manner that the peak width W1 is sufficiently small in order to generate the only single-crystal nucleus in the light intensity distribution shown in FIG. 13A. In this example, the whole size of the phase area (1ab, 1ac) is set to 1.0 (=0.5×2) µm, but is set to a size of preferably 0.3 to 1.5 µm, further preferably 0.8 to 1.2 µm. An optimum value of the area of the phase area 1ab, 1ac is closely related to an optical system of the crystallization apparatus for use. The phase difference between phase areas 1ab, 1ac is related to the relative value of the light intensity of the bottom peak in the light intensity distribution shown in FIG. 13A, and may be determined in a range of 0.2 to 0.7.

In Embodiment 1, in the crystallization apparatus shown in FIG. 1, a semiconductor (Si) thin film on the substrate 5 to be treated positioned in an actual focus position (calculated defocus position of −7 µm) was crystallized using the phase modulation device 1 constituted as shown in FIG. 3. For example, laser light having a light intensity distribution shown in FIG. 6A was formed on the substrate 5 to be treated, and a semiconductor thin film comprising a 5 µm square crystal grain array as shown in FIG. 14B was prepared through the crystallization process shown in FIG. 12. As shown in FIGS. 4A to 4C and FIGS. 5A to 5C, even when the surface of the substrate 5 to be treated fluctuates to a certain degree with respect to the actual focus position of the optical image forming system 4 (e.g., fluctuates in a defocus range of 0 to −15 µm), the light intensity distribution formed on the substrate 5 to be treated does not change a lot. Since a large depth of focus of about ±7 µm was secured in this example, a semiconductor thin film comprising the crystal grain array having a satisfactory uniformity was obtained.

Embodiment 2

Figure 16:
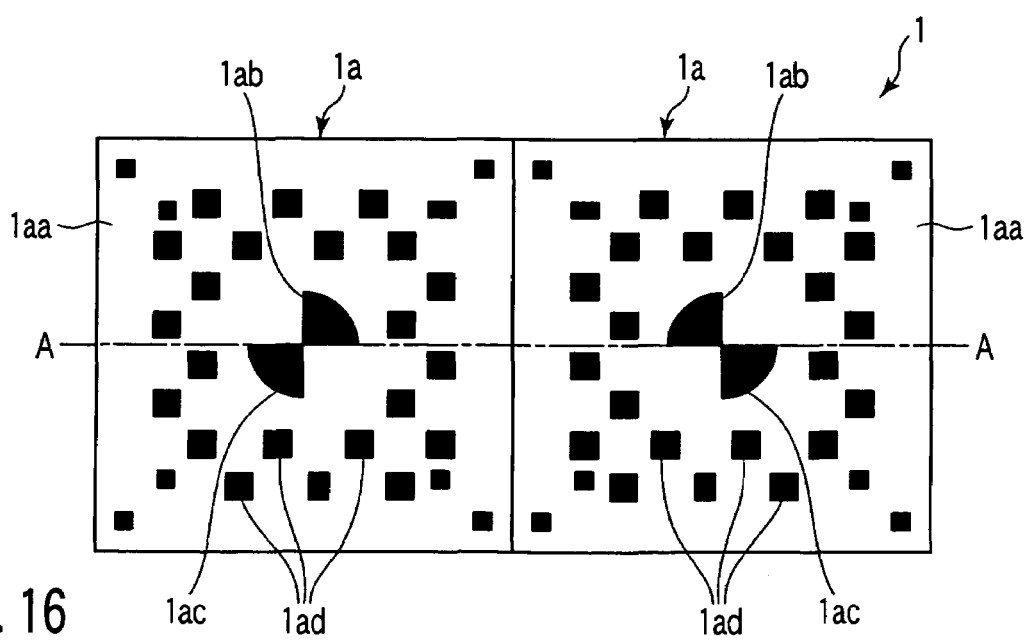
FIG. 16 is a diagram schematically showing a constitution of the phase modulation device in Embodiment 2.

FIG. 16 is a diagram schematically showing a constitution of the phase modulation device in Embodiment 2 of the present invention. A phase modulation device 1 is a phase modulation device for preparing a semiconductor thin film comprising a 5 µm square crystal grain array in the same manner as in Embodiment 1, and has a constitution similar to that of Embodiment 1. However, in Embodiment 2, a first area 1ab, a second area 1ac, and all third areas 1ad have a phase of −90° (+90° in Embodiment 1) with respect to a reference face 1aa. Embodiment 2 is different from Embodiment 1 in this respect. Embodiment 2 will be hereinafter described noting a difference from Embodiment 1.

Figure 17A:
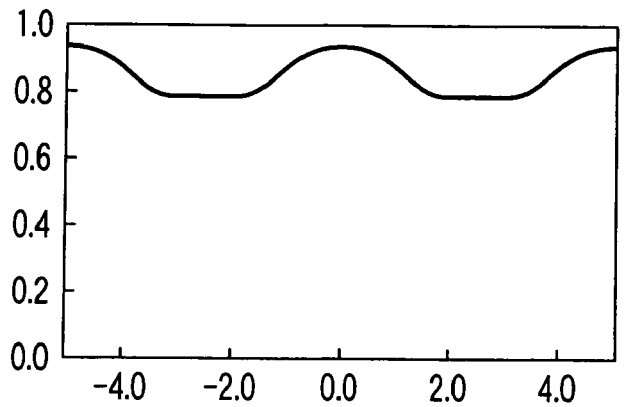
FIGS. 17A, 17B, 17C show a light intensity distribution obtained in each defocus position of −5 to +5 μm in Embodiment 2.
Figure 17B:
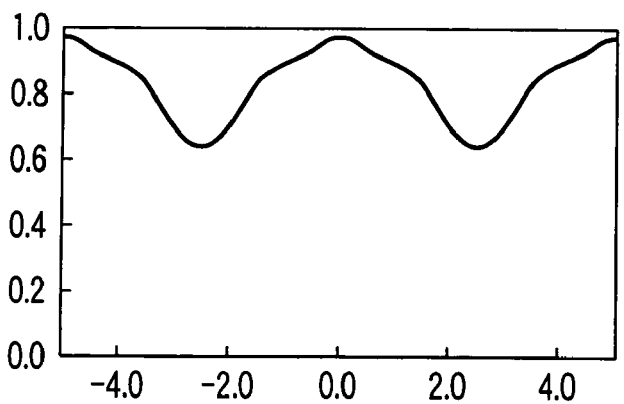

In Embodiment 2, on the surface of a substrate 5 to be treated, defocused in a direction (lower part of FIG. 1) distant from an optical image forming system 4 by 5 µm (i.e., defocus of −5 µm) from a calculated focus position of the optical image forming system 4 and positioned, a light intensity distribution shown in FIG. 17A is formed along a crossing line corresponding to a crossing line A-A of the unit area 1a. On the surface of the substrate 5 to be treated, positioned on the calculated focus position of the optical image forming system 4, a light intensity distribution shown in FIG. 17B is formed along the crossing line corresponding to the crossing line A-A of the unit area 1a.

Figure 17C:
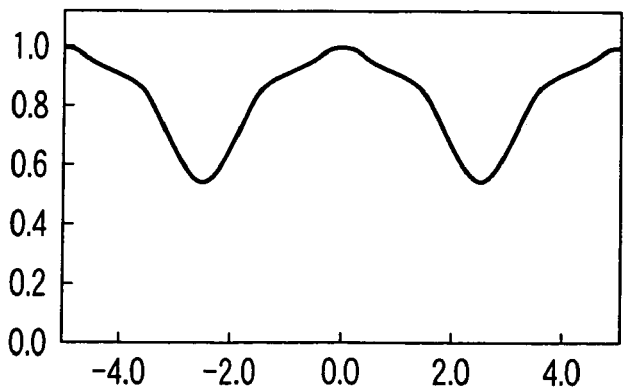

Moreover, on the surface of the substrate 5 to be treated, defocused in a direction (upper part of FIG. 1) approaching the optical image forming system 4 by 5 µm (i.e., defocus of +5 µm) from the calculated focus position of the optical image forming system 4 and positioned, a light intensity distribution shown in FIG. 17C is formed along the crossing line corresponding to the crossing line A-A of the unit area 1a. Furthermore, on the surface of the substrate 5 to be treated, defocused in a direction approaching the optical image forming system 4 by 7 µm (i.e., defocus of +7 µm) from the calculated focus position of the optical image forming system 4 and positioned, a light intensity distribution shown in FIG. 18A is formed along the crossing line corresponding to the crossing line A-A of the unit area 1a.

Moreover, on the surface of the substrate 5 to be treated, defocused in a direction approaching the optical image forming system 4 by 10 µm (i.e., defocus of +10 µm) from the calculated focus position of the optical image forming system 4 and positioned, a light intensity distribution shown in FIG. 18B is formed along the crossing line corresponding to the crossing line A-A of the unit area 1a. Finally, on the surface of the substrate 5 to be treated, defocused in a direction approaching the optical image forming system 4 by 15 µm (i.e., defocus of +15 µm) from the calculated focus position of the optical image forming system 4 and positioned, a light intensity distribution shown in FIG. 18C is formed along the crossing line corresponding to the crossing line A-A of the unit area 1a.

As shown in FIGS. 17A to 17C and FIGS. 18A to 18C, referring to the light intensity distribution obtained by changing the position of the substrate 5 to be treated with respect to the optical image forming system 4, a state in which the light intensity rapidly increases from a bottom peak (position where the light intensity is lowest) is kept between the calculated focus position and a defocus position of +10 µm. A shape of the light intensity distribution is kept between the calculated focus position and a defocus position of +15 µm. That is, it is also seen in Embodiment 2 that a depth of focus of ±5 to ±7 µm is secured in the same manner as in Embodiment 1.

Referring to FIGS. 17A to 17C and FIGS. 18A to 18C, it is seen that a gradient of the light intensity increasing from the bottom peak is largest in a light intensity distribution obtained from a position defocused by +7 µm from the calculated focus position, and a calculated defocus position of +7 µm is an actual focus position.

In Embodiment 2, in the crystallization apparatus shown in FIG. 1, a semiconductor (Si) thin film on the substrate 5 to be treated positioned in an actual focus position (calculated defocus position of +7 µm) was crystallized using the phase modulation device 1 constituted as shown in FIG. 16. For example, laser light having a light intensity distribution shown in FIG. 18A was formed on the substrate 5 to be treated, and a semiconductor thin film comprising a 5 μm square crystal grain array as shown in FIG. 14B was prepared through the crystallization process shown in FIG. 12. As shown in FIGS. 17A to 17C and FIGS. 18A to 18C, even when the surface of the substrate 5 to be treated fluctuates to a certain degree with respect to the actual focus position of the optical image forming system 4 (e.g., fluctuates in a defocus range of 0 to +15 μm), the light intensity distribution formed on the substrate 5 to be treated does not change a lot. Since a large depth of focus of about ±7 μm was secured in this example, a semiconductor thin film comprising the crystal grain array having a satisfactory uniformity was obtained.

Embodiment 3

FIG. 19 is a diagram schematically showing a constitution of a phase modulation device according to Embodiment 3 of the present invention. A phase modulation device 1 is a phase modulation device for preparing a semiconductor thin film comprising a 5 μm square crystal grain array in the same manner as in Embodiments 1 and 2, and has a constitution similar to that of Embodiment 1. However, in Embodiment 3, eight 0.2 μm square third areas 1ae having square shapes are arranged around a first area 1ab and a second area 1ac, and the first area 1ab, the second area 1ac, and all the third areas 1ae have a phase of +100° (+90° in Embodiment 1) with respect to a reference face 1aa. Embodiment 3 is different from Embodiment 1 in this respect. Embodiment 3 will be hereinafter described noting a difference from Embodiment 1.

Although not shown, in Embodiment 3, a position defocused in a direction (lower part of FIG. 1) distant from an optical image forming system 4 by 7 μm (i.e., defocus of −7 μm) from a calculated focus position of the optical image forming system 4 is an actual focus position, and a large depth of focus of about ±7 μm is secured in the same manner as in Embodiment 1.

In Embodiment 3, light intensity distributions shown in FIGS. 20A to 20C are formed on the surface of the substrate 5 to be treated positioned in the actual focus position of the optical image forming system 4. That is, in FIG. 19, the light intensity distribution shown in FIG. 20A is formed along a crossing line corresponding to a crossing line A-A of the unit area 1a of the phase modulation device 1. The light intensity distribution shown in FIG. 20B is formed along a slanted line corresponding to a leftward ascending diagonal line B-B of the unit area 1a on the left side. The light intensity distribution shown in FIG. 20C is formed along a slanted line corresponding to a leftward ascending diagonal line C-C of the unit area 1a on the right side.

In Embodiment 3, in the crystallization apparatus shown in FIG. 1, a semiconductor (Si) thin film on the substrate 5 to be treated, positioned in an actual focus position (calculated defocus position of −7 μm) was crystallized using the phase modulation device 1 constituted as shown in FIG. 19. For example, laser light having a light intensity distribution shown in FIG. 20A was formed on the substrate 5 to be treated, and a semiconductor thin film comprising a 5 μm square crystal grain array as shown in FIG. 14B was prepared through the crystallization process shown in FIG. 12. Even when the surface of the substrate 5 to be treated fluctuates to a certain degree with respect to the actual focus position of the optical image forming system 4, the light intensity distribution formed on the substrate 5 to be treated does not change a lot. Since a large depth of focus of about ±7 μm was secured in this example, a semiconductor thin film comprising the crystal grain array having a satisfactory uniformity was obtained.

Embodiment 4

Figure 21:
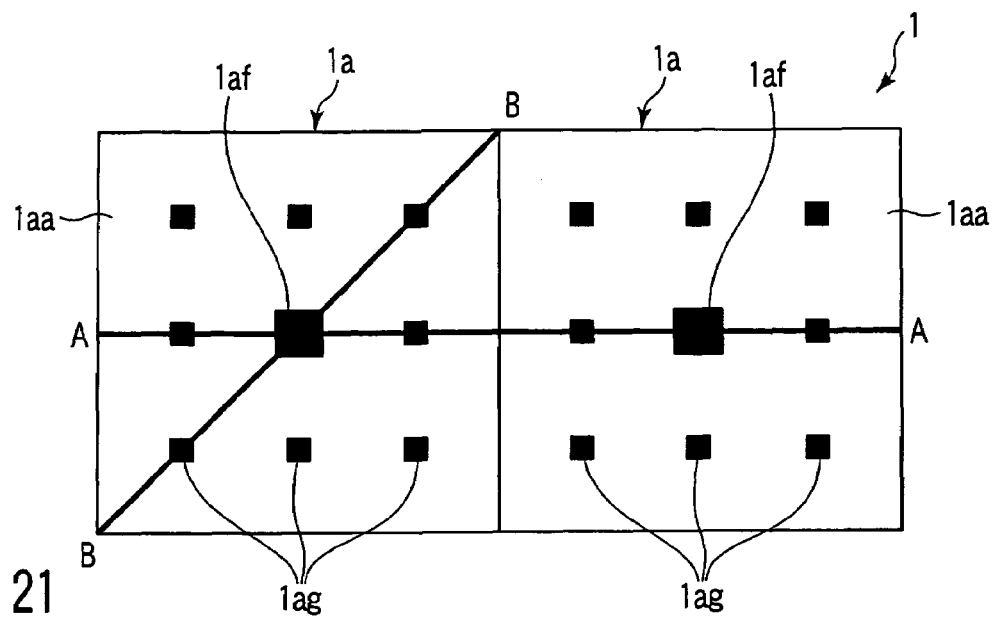
FIG. 21 is a diagram schematically showing a constitution of a phase modulation device in Embodiment 4.

FIG. 21 is a diagram schematically showing a constitution of a phase modulation device according to Embodiment 4 of the present invention. A phase modulation device 1 is a phase modulation device for preparing a semiconductor thin film comprising a 5 μm square crystal grain array in the same manner as in Embodiments 1 to 3, and has a constitution similar to that of Embodiment 3. However, a 0.5 μm square phase area 1af having a square shape is disposed in the vicinity of the center of a unit area 1a instead of a first area 1ab and a second area 1ac, eight 0.2 μm square third areas 1ag having square shapes are arranged around the areas, and the phase area 1af and all the third areas 1ag have a phase of +120° (+100° in Embodiment 3) with respect to a reference face 1aa. Embodiment 4 is different from Embodiment 3 in this respect. Embodiment 4 will be hereinafter described noting a difference from Embodiment 3.

Although not shown, in Embodiment 4, a position defocused in a direction (lower part of FIG. 1) distant from an optical image forming system 4 by 5 μm (i.e., defocus of −5 μm) from a calculated focus position of the optical image forming system 4 is an actual focus position, and a large depth of focus of about ±7 μm is secured.

Figure 22A:
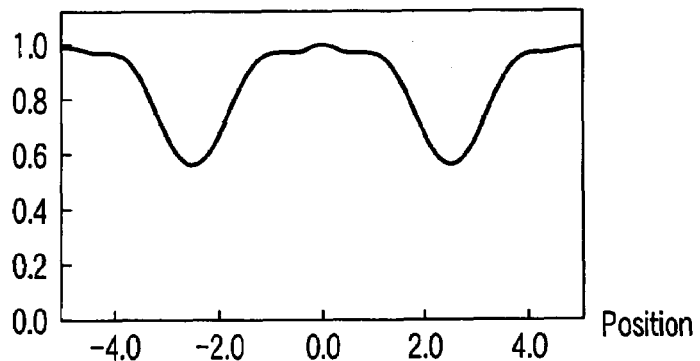
FIGS. 22A, 22B show a light intensity distribution obtained in a calculated focus position in Embodiment 4.
Figure 22B:
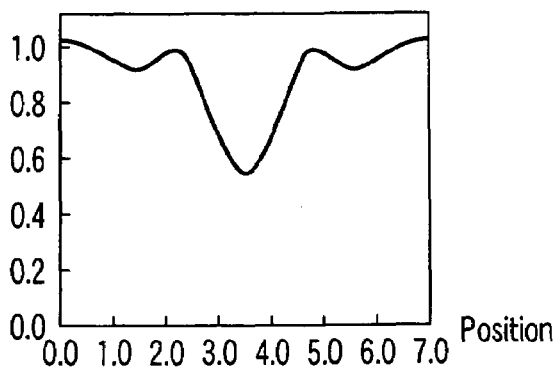

In Embodiment 4, light intensity distributions shown in FIGS. 22A, 22B are formed on the surface of the substrate 5 to be treated positioned in the actual focus position of the optical image forming system 4. That is, in FIG. 21, the light intensity distribution shown in FIG. 22A is formed along a crossing line corresponding to a crossing line A-A of the unit area 1a of the phase modulation device 1. The light intensity distribution shown in FIG. 22B is formed along a slanted line corresponding to a rightward ascending diagonal line B-B of the unit area 1a on the left side. Thus, in Embodiment 4, an inversely peaked distribution is formed in which light intensity rapidly increases radially toward periphery from a bottom peak by a function of the phase area 1af disposed in the vicinity of the center of the unit area 1a.

In Embodiment 4, in the crystallization apparatus shown in FIG. 1, a semiconductor (Si) thin film on the substrate 5 to be treated, positioned in an actual focus position (calculated defocus position of −5 μm) was crystallized using the phase modulation device 1 constituted as shown in FIG. 21. For example, laser light having a light intensity distribution shown in FIG. 22A was formed on the substrate 5 to be treated, and a semiconductor thin film comprising a 5 μm square crystal grain array as shown in FIG. 14B was prepared through the crystallization process shown in FIG. 12. Even when the surface of the substrate 5 to be treated fluctuates to a certain degree with respect to the actual focus position of the optical image forming system 4, the light intensity distribution formed on the substrate 5 to be treated does not change a lot. Since a large depth of focus of about ±7 μm was secured in this example, a semiconductor thin film comprising the crystal grain array having a satisfactory uniformity was obtained.

Figure 23:
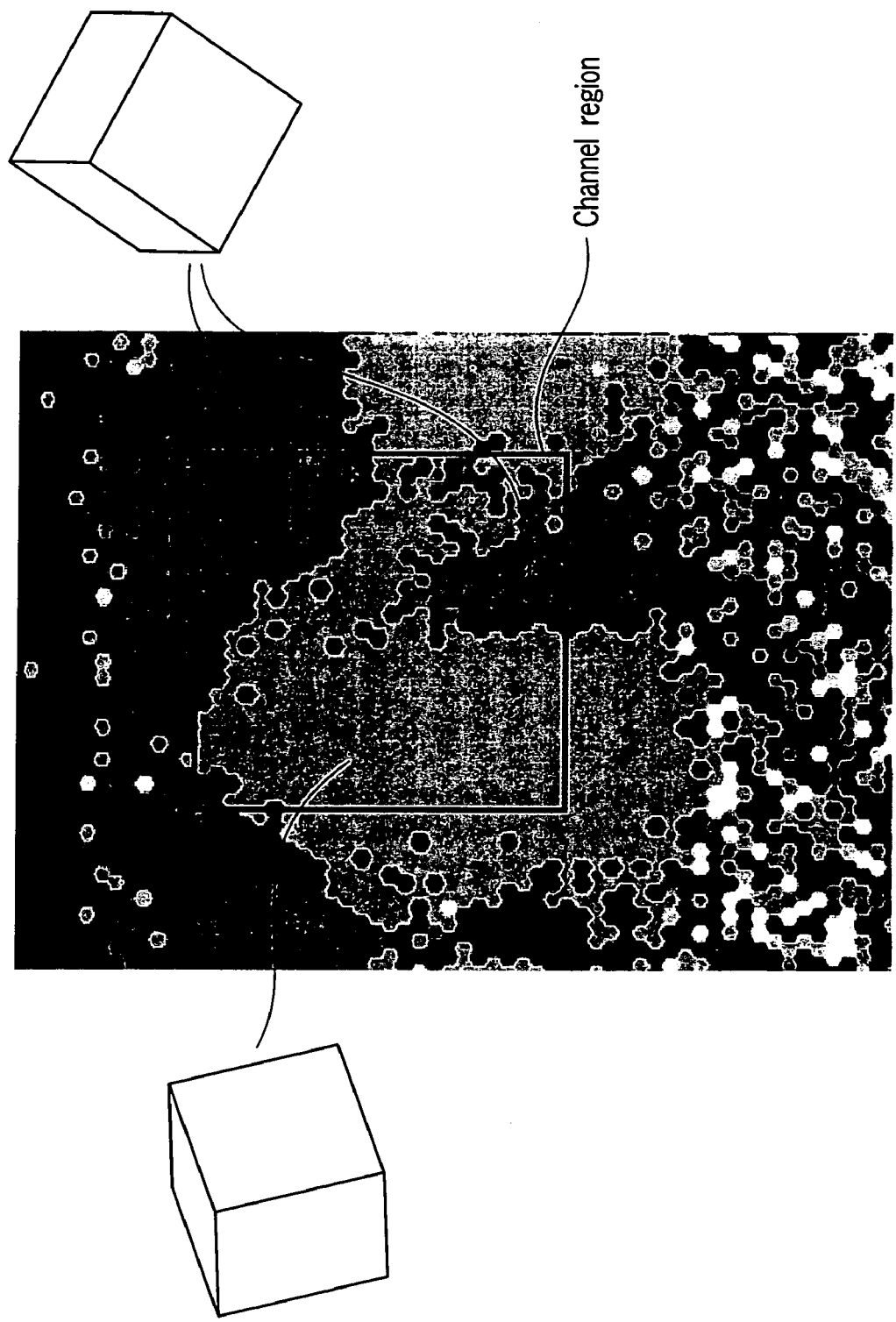
FIG. 23 is a diagram showing a crystal orientation of an Si film of a channel region of a thin-film transistor.

FIG. 23 is a diagram showing a crystal orientation of an Si film of a channel region of a thin-film transistor. Two crystals exist in a channel region, and have a twin crystal relation. This transistor had a mobility of 400 [$cm^2$/Vs]. Therefore, it is seen that a high mobility of about 400 $\mu m^2$/Vs) is obtained, even when a twin grain boundary is inserted.

Embodiment 5

FIG. 24 is a diagram schematically showing a constitution of a phase modulation device according to Embodiment 5 of the present invention. A phase modulation device 1 is a phase modulation device for preparing a semiconductor thin film comprising a 5 µm square crystal grain array in the same manner as in Embodiments 1 to 4, and has a constitution similar to that of Embodiment 1. However, a first area 1ab and a second area 1ac have a phase of +100° (+90° in Embodiment 1) with respect to a reference face 1aa, and any third area is not disposed around the first area 1ab and the second area 1ac. Embodiment 5 is different from Embodiment 1 in this respect. Embodiment 5 will be hereinafter described noting a difference from Embodiment 1.

Figure 25A:
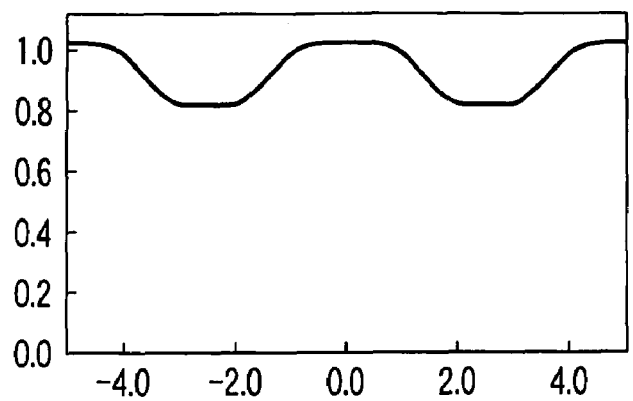
FIGS. 25A, 25B, 25C show a light intensity distribution obtained in each defocus position of +5 to −5 μm in Embodiment 5.
Figure 25B:
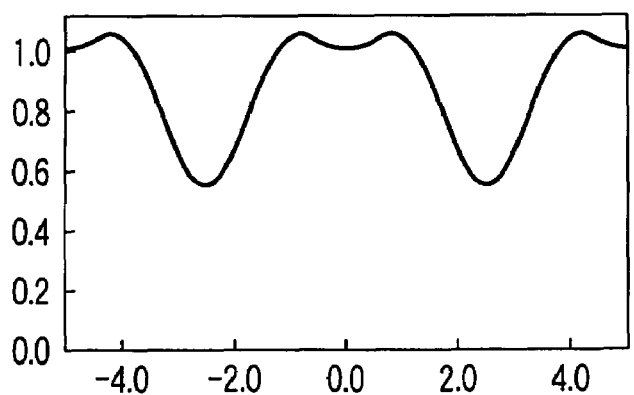

In Embodiment 5, on the surface of the substrate 5 to be treated, defocused in a direction (upper part of FIG. 1) approaching an optical image forming system 4 by 5 µm (i.e., defocus of +5 µm) from a calculated focus position of the optical image forming system 4 and positioned, a light intensity distribution shown in FIG. 25A is formed along a crossing line corresponding to a crossing line A-A of a unit area 1a. On the surface of the substrate 5 to be treated, positioned in the calculated focus position of the optical image forming system 4, a light intensity distribution shown in FIG. 25B is formed along the crossing line corresponding to the crossing line A-A of the unit area 1a.

Figure 25C:
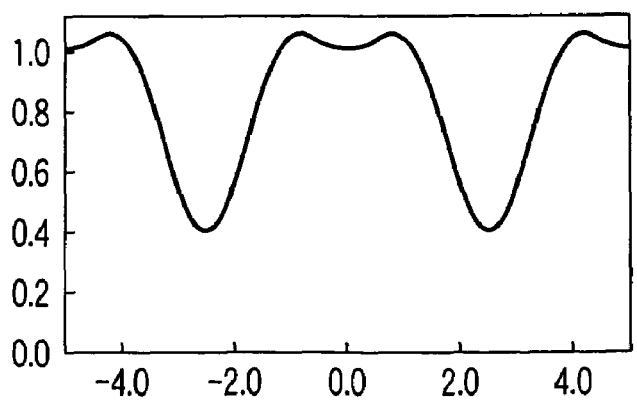
Figure 26A:
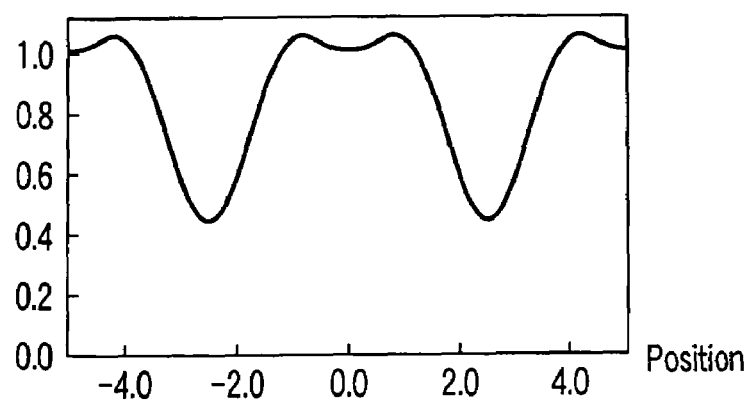
FIGS. 26A, 26B, 26C show a light intensity distribution obtained in each defocus position of −10 to −20 μm in Embodiment 5.

Moreover, on the surface of the substrate 5 to be treated, defocused in a direction (lower part of FIG. 1) distant from the optical image forming system 4 by 5 µm (i.e., defocus of −5 µm) from the calculated focus position of the optical image forming system 4 and positioned, a light intensity distribution shown in FIG. 25C is formed along a crossing line corresponding to a crossing line A-A of the unit area 1a. Furthermore, on the surface of the substrate 5 to be treated, which has been defocused in a direction distant from the optical image forming system 4 by 10 µm (i.e., defocus of −10 µm) from the calculated focus position of the optical image forming system 4 and positioned, a light intensity distribution shown in FIG. 26A is formed along the crossing line corresponding to the crossing line A-A of the unit area 1a.

Figure 26B:
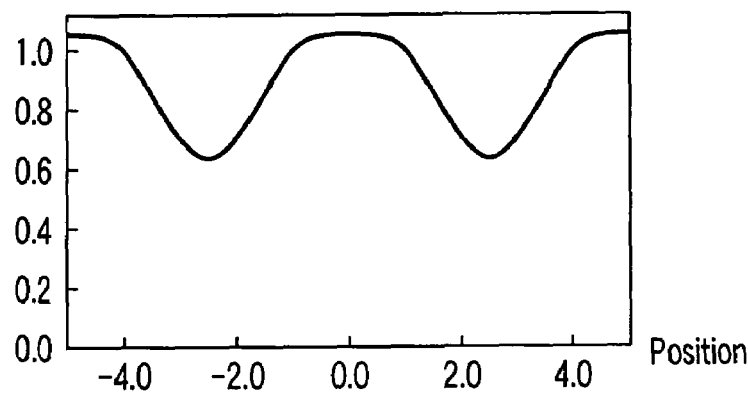
Figure 26C:
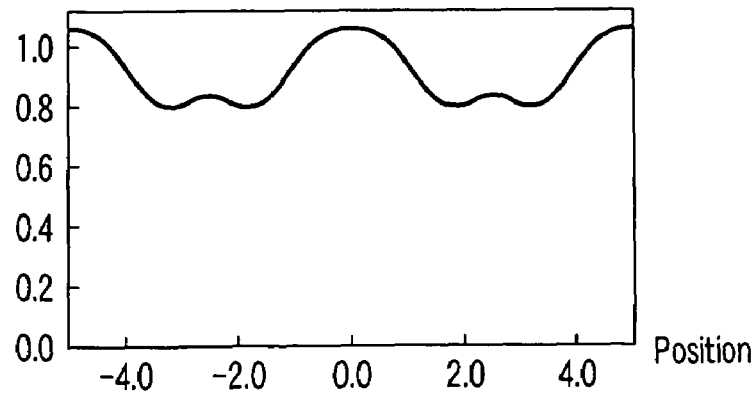

Moreover, on the surface of the substrate 5 to be treated, which has been defocused in a direction distant from the optical image forming system 4 by 15 µm (i.e., defocus of −15 µm) from the calculated focus position of the optical image forming system 4 and positioned, a light intensity distribution shown in FIG. 26B is formed along the crossing line corresponding to the crossing line A-A of the unit area 1a. Finally, on the surface of the substrate 5 to be treated, which has been defocused in a direction distant from the optical image forming system 4 by 20 µm (i.e., defocus of −20 µm) from the calculated focus position of the optical image forming system 4 and positioned, a light intensity distribution shown in FIG. 26C is formed along the crossing line corresponding to the crossing line A-A of the unit area 1a.

Referring to FIGS. 25A to 25C and FIGS. 26A to 26C, since any third area is not disposed around the first area 1ab and the second area 1ac, an inversely peaked distribution in which light intensity rapidly increases radially toward the periphery from the bottom peak is formed. Unlike Embodiment 1, a tilted distribution in which the light intensity slowly increases radially toward the periphery from the inversely peaked distribution is not formed.

In Embodiment 5, in the crystallization apparatus shown in FIG. 1, a semiconductor (Si) thin film on the substrate 5 to be treated, positioned in an actual focus position (calculated defocus position of −7 µm) was crystallized using the phase modulation device 1 constituted as shown in FIG. 24. For example, laser light having a light intensity distribution shown in FIG. 25C or FIG. 26A was formed on the substrate 5 to be treated, and a semiconductor thin film comprising a 5 µm square crystal grain array as shown in FIG. 14B was prepared through the crystallization process shown in FIG. 12.

Even when the surface of the substrate 5 to be treated fluctuates to a certain degree with respect to the actual focus position of the optical image forming system 4, the light intensity distribution formed on the substrate 5 to be treated does not change a lot. Since a large depth of focus of about ±7 µm was secured in this example, a semiconductor thin film comprising the crystal grain array having a satisfactory uniformity was obtained. However, since any funnel-shaped tilted distribution was not formed as described above in Embodiment 5, only crystal grains smaller than those of Embodiment 1 were obtained.

Embodiment 6

Figure 27A:
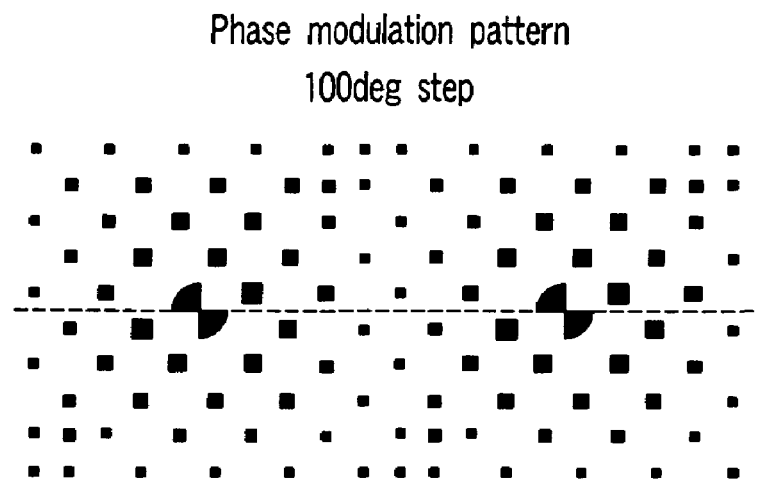
FIGS. 27A, 27B are diagram schematically showing a constitution of a phase modulation device and a light intensity distribution on a substrate to be treated in Embodiment 6.
Figure 27B:
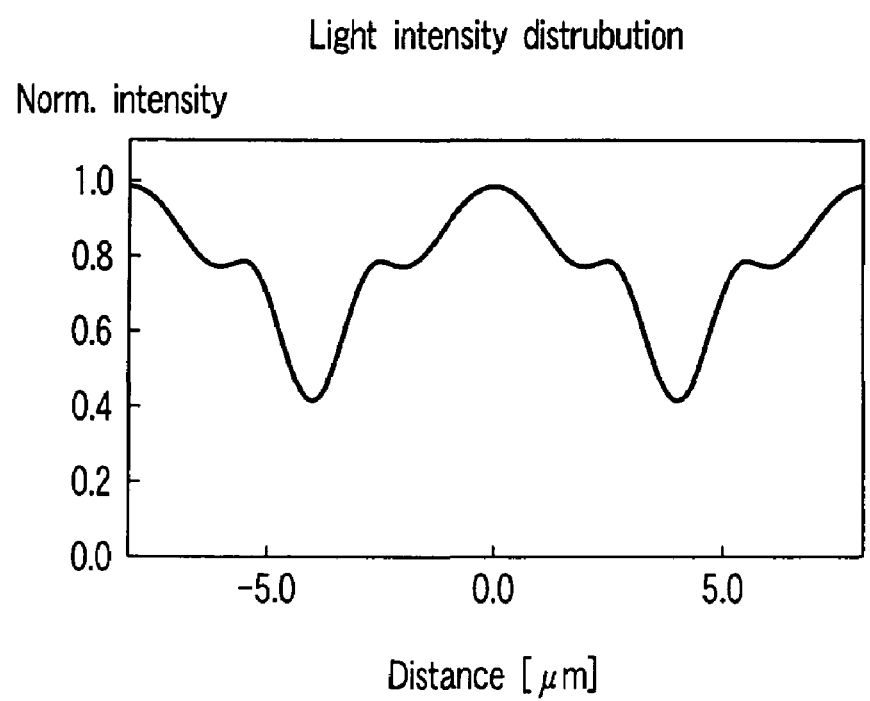

FIGS. 27A, 27B are diagram schematically showing a constitution of a phase modulation device and a light intensity distribution on a substrate to be treated according to Embodiment 6 of the present invention. This phase modulation device is designed for preparing a semiconductor thin film comprising an 8 µm square crystal grain array. A phase modulation pattern is constituted of a 0° reference face, and a step having a phase difference of −100°. Since a bottom peak is formed in a center, a fan-shaped step having a radius 0.6 µm in accordance with a converted value on a substrate is brought into contact with the center and disposed. Around the step, a dotted step is disposed in a part of a virtually disposed lattice in order to form a moderate tilt. An actual dimension of the pattern of the phase modulation device is five times the converted value on the substrate. For example, the unit area has a size of 40 µm square, and a size of a fan shape is a radius of 3.0 µm. FIG. 27B shows a one-dimensional light intensity distribution (height position +2 µm [upper part 2 µm]) of a transverse section.

In this example, a crystallization apparatus shown in FIG. 3 is used, an image-side numerical aperture NA of an optical image forming system 4 is set to 0.15, and an illumination sigma value (numerical aperture of an illumination system/object-side numerical aperture of the optical image forming system 4) is set to 0.52. A magnification of a telecentric reduction lens is ⅕. An Si thin film on the substrate was crystallized using the phase modulation device having a pattern shown in FIG. 27A. An intensity distribution of laser light, shown in FIG. 27B, was formed on a substrate to be treated, adjusted into a defocus position of +2 µm on an XYZ stage. An Si thin film comprising an 8 µm square crystal grain array was prepared through a crystallization process shown in FIG. 1. A large depth of focus was obtained in a defocus range of 0 to +15 µm without changing the light intensity distribution very much. As a result, a crystal grain array Si thin film having a satisfactory uniformity was obtained. The phase modulation device of FIGS. 27A, 27B can be manufactured, when successively performing selective etching, for example, in such a manner that a 0° face and −100° face are formed on quartz glass as reference faces.

It is to be noted that in the above-described embodiments, the light intensity distribution can be obtained by calculation in a design stage, and the light intensity distribution in an actual face to be treated is preferably observed and confirmed beforehand. For this purpose, the face of the substrate to be treated may be enlarged by an optical system and input by an imaging device such as CCD. When light for use is ultraviolet, the optical system is restricted. Therefore, a fluorescent plate may be disposed on the face to be treated, and light may be converted into visible light. In the above-described embodiments, the concrete constitution examples have been illustrated with respect to the phase modulation device 1, but the constitution of the phase modulation device 1 can be variously modified in the scope of the present invention.

Embodiment 7

Figure 28A:
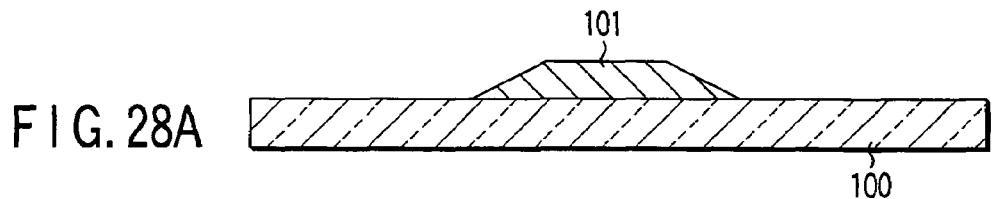
FIGS. 28A to 28D are step diagrams showing a manufacturing process of a bottom gate type thin-film transistor according to one embodiment of the present invention.
Figure 28B:
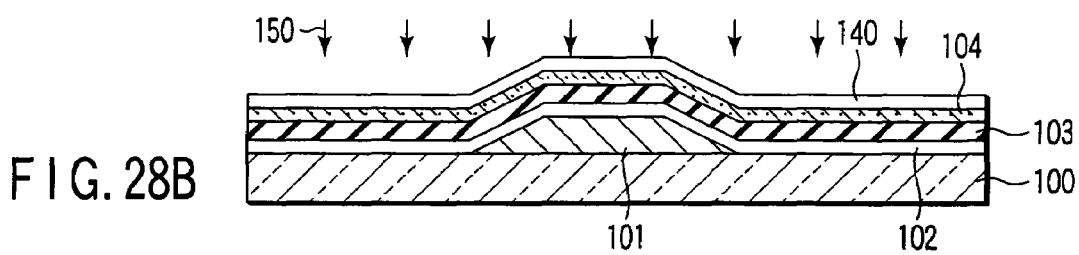

FIGS. 28A, 28B are step diagrams showing a manufacturing process of a bottom gate type thin film transistor according to an embodiment of the present invention. It is to be noted that in this embodiment, for the sake of convenience, a method of manufacturing an N-channel type thin film transistor will be described, but a method of manufacturing a P-channel type is similar except that impurity seeds (dopant seeds) are changed. Here, the method of manufacturing a thin-film transistor having a bottom gate structure will be described, First, as shown in FIG. 28A, Al, Ta, Mo, W, Cr, Cu, or an alloy of them is formed into a thickness of 100 to 300 nm on an insulating substrate 100 formed of glass or the like, patterned, and worked into a gate electrode 101.

Subsequently, as shown in FIG. 28B, a gate insulating film is formed on the gate electrode 101. In this example, a two-layer structure of a gate nitride film 102 (SiNx)/a gate oxide film 103 (SiO$_2$) was used in the gate insulating film. The gate nitride film 102 was formed using a mixture of SiH$_4$ and NH$_3$ gases as a material gas, and using a plasma CVD process (PE-CVD process). It is to be noted that a normal pressure CVD or reduced pressure CVD may be used instead of plasma CVD. In this example, the gate nitride film 102 was deposited into a thickness of 50 nm. Continuously to the forming of the gate nitride film 102, the gate oxide film 103 is formed into a thickness of about 200 nm.

Furthermore, a semiconductor thin film 104 formed of amorphous silicon was formed into a thickness of about 50 to 200 nm continuously on the gate oxide film 103. Further on the semiconductor thin film 104, an insulating film 140 of SiO$_2$ was formed into a thickness of 300 nm. The gate insulating film having the two-layer structure, the amorphous semiconductor thin film 104, and the insulating film 140 were continuously deposited without breaking a vacuum system of a reaction chamber. When the plasma CVD process is used as described above, dehydrogenation annealing is performed at a temperature of 400 to 450° C. in a nitrogen atmosphere by a heating process for about one hour, and hydrogen contained in the amorphous semiconductor thin film 104 is released.

Next, following the method described, for example, in Embodiments 1 to 6, the amorphous semiconductor thin film 104 is irradiated with laser light 150 and crystallized. Excimer laser beams are usable as the laser light 150. After adjusting an irradiated region of the laser light 150, the laser light 150 is focused to irradiate the region in such a manner that a periodic pattern of the phase modulation device is transferred onto the irradiated region. Furthermore, the region is shifted in such a manner as to be prevented from being duplicated, the irradiation is repeated, and a predetermined area is crystallized. Subsequently, the insulating film 140 is peeled by a method such as etching.

Figure 28C:
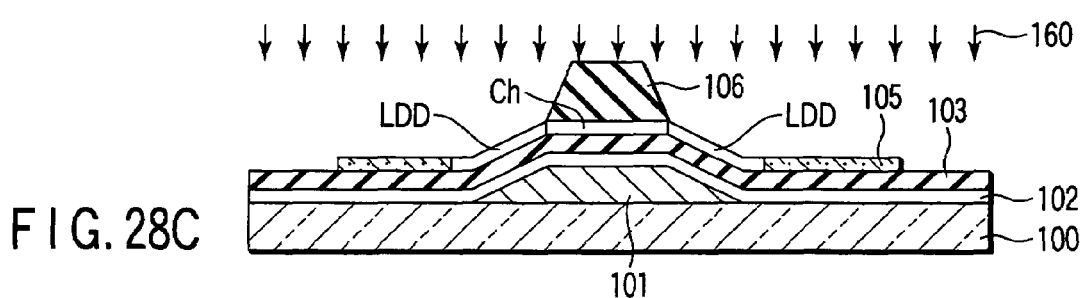

Subsequently, as shown in FIG. 28C, ions are implanted, if necessary, for a purpose of controlling Vth of the thin film transistor. In this example, the ions were implanted in such a manner that a dose amount of B$^+$ was about $5\times10^{11}$ to $4\times10^{12}$/cm$^2$. In this ion implantation, ion beams accelerated at 10 keV were used. Subsequently, SiO$_2$ was formed to a thickness of about 100 to 300 nm on a polycrystal semiconductor thin film 105 crystallized in a preprocess, for example, by a plasma CVD process. In this example, silane gas SH$_4$ and oxygen gas were plasma-decomposed, and SiO$_2$ was deposited.

Moreover, SiO$_2$ formed in this manner was patterned into a predetermined shape, and formed into a stopper film 106. In this case, the stopper film 106 is patterned using a back surface exposure technique in such a manner as to match the film with the gate electrode 101. A portion of the polycrystal semiconductor thin film 105 positioned right under the stopper film 106 is protected as a channel region Ch. As described above, the B$^+$ ions are implanted into the channel region Ch beforehand with a comparatively small dose amount by the ion implantation. Subsequently, impurities (e.g., P$^+$ ions) are implanted into the semiconductor thin film 105 by ion doping using the stopper film 106 as a mask, and an LDD region is formed. At this time, a dose amount is, for example, $5\times10^{12}$ to $1\times10^{13}$/cm$^2$, and an acceleration voltage is, for example, 10 KeV.

Furthermore, after patterning/forming a photo resist in such a manner as to coat the stopper film 106 and the LDD regions on opposite sides, impurities (e.g., P$^+$ ions) are implanted with a high concentration using the resist as a mask, and a source region S and a drain region D are formed. For example, ion doping (ion shower) is usable in injecting impurities. The impurities are implanted by electric field acceleration without performing mass separation. In this example, the impurities were injected with a dose amount of about $1\times10^{15}$/cm$^2$ to form the source region S and the drain region D. The acceleration voltage is, for example, 10 KeV.

It is to be noted that, although not shown, to form a P-channel thin film transistor, after coating the region of an N-channel type thin-film transistor with the photoresist, the impurities are changed to B$^+$ ions from P$^+$ ions, and the ion doping may be performed with a dose amount of about $1\times10^{15}$/cm$^2$.

It is to be noted that here the impurities may be injected using a mass separation type ion implantation apparatus.

Thereafter, the impurities injected into the polycrystal semiconductor thin film 105 are activated by rapid thermal annealing (RTA) 160. If necessary, laser activation annealing (ELA) may be performed using excimer laser. Thereafter, unnecessary portions of the semiconductor thin film 105 and stopper film 106 are simultaneously patterned, and the thin-film transistor is separated for each device region.

Figure 28D:
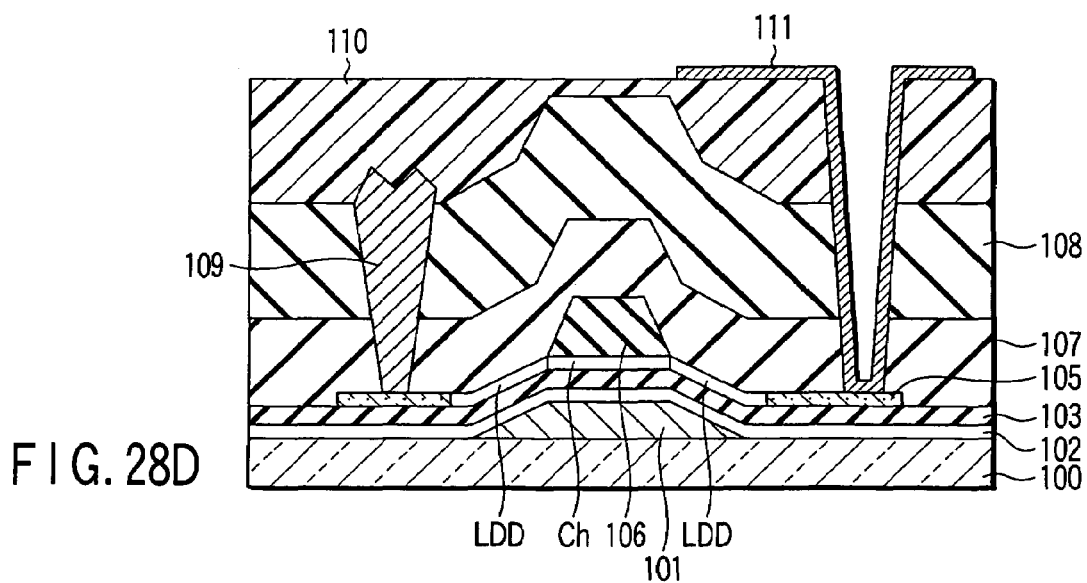

Finally, as shown in FIG. 28D, SiO$_2$ is deposited in a thickness of about 100 to 200 nm to form an interlayer insulating film 107. After forming the interlayer insulating film 107, SiN$_x$ is deposited into a thickness of about 200 to 400 nm by the plasma CVD process to form a passivation film (cap film) 108. In this stage, the films are heated at about 350 to 400° C. in a nitrogen gas, forming gas, or vacuum atmosphere for one hour, and hydrogen atoms included in the interlayer insulating film 107 are diffused in the semiconductor thin film 105. Thereafter, contact holes are opened, and Mo, Al or the like is sputtered in a thickness of 100 to 200 nm and thereafter patterned into a predetermined shape to form a wiring electrode 109.

Furthermore, after applying a flattering layer 110 formed of an acryl resin or the like in a thickness of about 1 μm, the contact holes are opened. After sputtering a transparent conductive film formed of ITO or the like on the flatting layer 110, the film is patterned into a predetermined shape to form a pixel electrode 111. When a channel is formed in accordance with a position of a crystal grain array having a large grain diameter as shown in FIG. 14, a thin-film transistor having a high mobility is obtained.

Embodiment 8

Figure 29A:
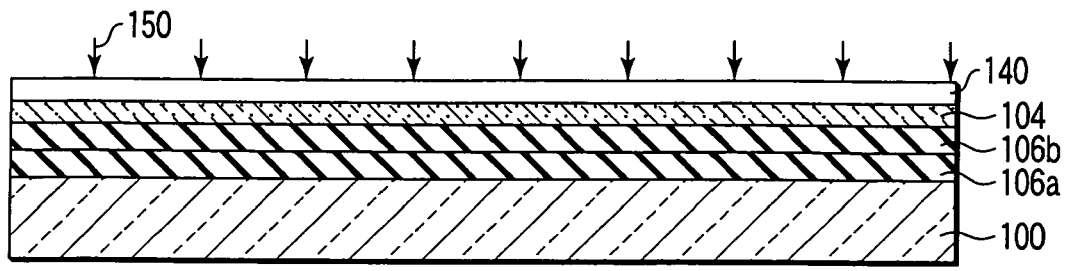
FIGS. 29A, 29B, 29C are step diagrams showing a manufacturing process of a top gate type thin-film transistor according to one embodiment of the present invention.
Figure 29B:
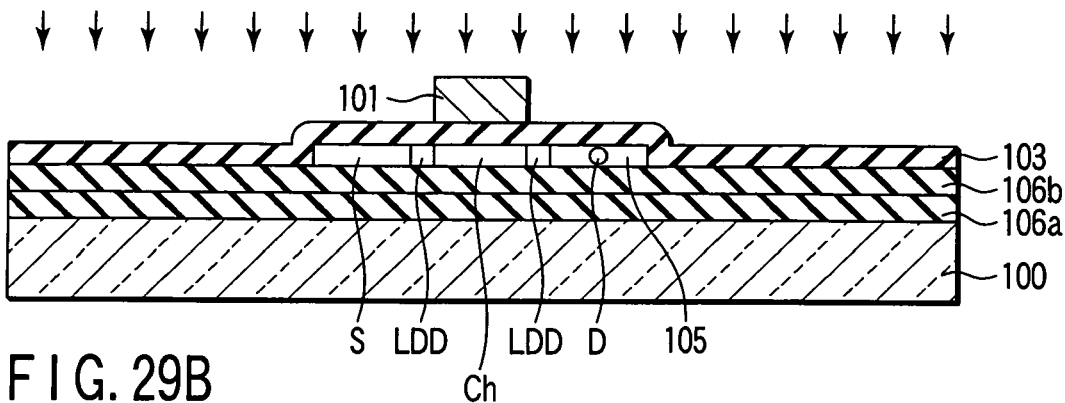
Figure 29C:
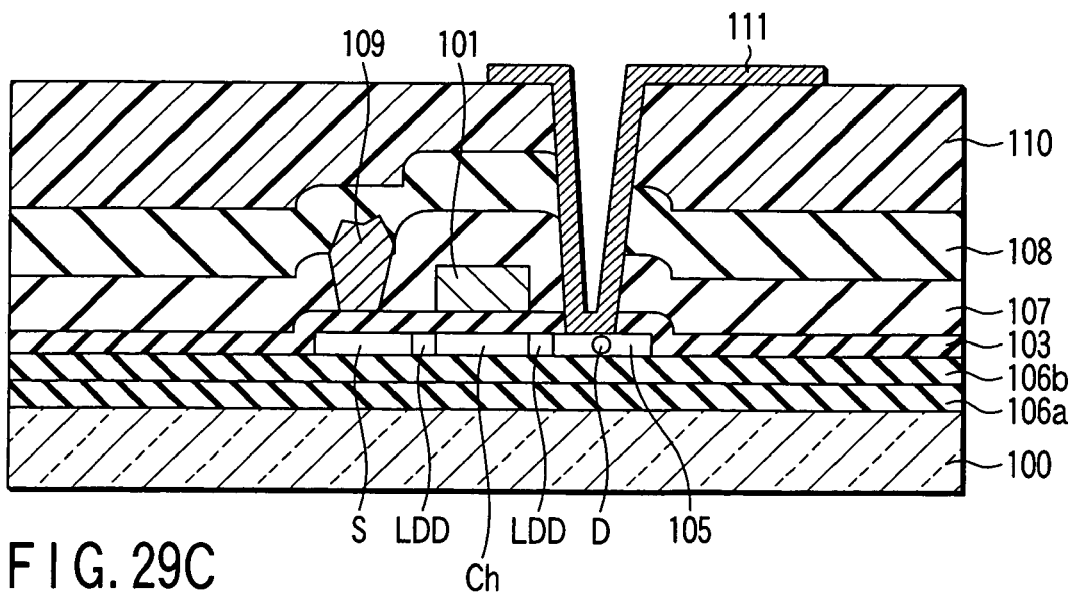

FIGS. 29A, 29B, 29C are step diagrams showing a manufacturing process of a top gate type thin-film transistor according to an embodiment of the present invention. It is to be noted that in this embodiment, unlike Embodiment 7, a thin-film transistor having a top gate structure is prepared.

First, as shown in FIG. 29A, two underlayer films 106a, 106b constituting buffer layers are continuously deposited on an insulating substrate 100 by a plasma CVD process. The first-layer underlayer film 106a is formed of $SiN_x$, and film thickness is 500 nm. The second-layer underlayer film 106b is formed of $SiO_2$, and the film thickness is similarly 500 nm. A semiconductor thin film 104 formed of amorphous silicon is formed to a thickness of 50 to 200 nm on the underlayer film 106b of $SiO_2$ by the plasma CVD process or an LPCVD process. Furthermore, an insulating film 140 of $SiO_2$ is formed to a thickness of 200 nm. When the plasma CVD process is used in forming the semiconductor thin film 104 of amorphous silicon, annealing is performed for about one hour on conditions of a nitrogen atmosphere at 400 to 450° C. in order to detach hydrogen from the film.

Next, following the method described, for example, in Embodiments 1 to 6, the amorphous semiconductor thin film 104 is crystallized. After adjusting an irradiated region of the laser light 150, the laser light 150 is focused to irradiate the region in such a manner that a periodic pattern of the phase modulation device is transferred onto the irradiated region. Furthermore, the region is shifted in such a manner as to be prevented from being duplicated, the irradiation is repeated, and a predetermined area is crystallized. Subsequently, the insulating film 140 is peeled by a method such as etching.

Here, if necessary, ions are implanted as described above for a purpose of controlling Vth. In this example, $B^+$ ions are implanted in such a manner that a dose amount is about $5\times10^{11}$ to $4\times10^{12}/cm^2$. In this case, acceleration voltage is about 10 keV. Subsequently, as shown in FIG. 29B, a crystallized silicon semiconductor thin film 105 is patterned in an island shape. $SiO_2$ is deposited to a thickness of about 10 to 400 nm on the thin film by a plasma CVD process, normal pressure CVD process, reduced pressure CVD process, ECR-CVD process, sputtering process or the like to form a gate insulating film 103. In this example, the thickness of the gate insulating film 103 was set to 100 nm.

Next, Al, Ti, Mo, W, Ta, doped polycrystal silicon, or an alloy of them is deposited to a thickness of 200 to 800 nm on the gate insulating film 103, and patterned into a predetermined shape to form a gate electrode 101. Next, $P^+$ ions are implanted into the semiconductor thin film 105 by an ion implantation process using mass separation to dispose an LDD region. The ions are implanted with respect to the whole surface of the insulating substrate 100 using the gate electrode 101 as a mask. A dose amount is $6\times10^{12}$ to $5\times10^{13}/cm^2$, and an acceleration voltage is, for example, 90 keV.

It is to be noted that a channel region Ch positioned right under the gate electrode 101 is protected, and the $B^+$ ions implanted beforehand by the ion implantation are held as such. After implanting the ions with respect to the LDD region, a resist pattern is formed in such a manner as to coat the gate electrode 101 and its periphery. The $P^+$ ions are injected with a high concentration by a mass non-separation type ion shower doping process to form a source region S and a drain region D. In this example, a dose amount is, for example, about $1\times10^{15}/cm^2$. The acceleration voltage is, for example, 90 keV. In a doping gas, 20% $PH_3$ gas diluted with hydrogen was used.

To form a CMOS circuit, after forming a resist pattern for a P-channel thin-film transistor, the doping gas is changed to 5 to 20% of $B_2H_6/H_2$ gas base. A dose amount of about $1\times10^{15}$ to $3\times10^{15}/cm^2$. The acceleration voltage during the ion implantation is, for example, 90 keV. It is to be noted that a mass separation type ion implantation apparatus may be used in forming the source region S and drain region D. Thereafter, dopant injected into the semiconductor thin film 105 is activated. In this activation process, an RTA 160 using an ultraviolet lamp is usable in the same manner as in Embodiment 7.

Finally, as shown in FIG. 29C, an interlayer insulating film 107 is formed of PSG or the like in such a manner as to coat the gate electrode 101. After forming the interlayer insulating film 107, $SiN_x$ is deposited to a thickness of about 200 to 400 nm by the plasma CVD process to form a passivation film (cap film) 108. In this stage, the films are annealed in a nitrogen gas at a temperature of 350° C. for one hour, and hydrogen contained in the interlayer insulating film 107 is diffused in the semiconductor thin film 105. Thereafter, contact holes are opened.

Furthermore, Al—Si or the like is deposited on the passivation film 108 by sputtering, and thereafter patterned into a predetermined shape to form a wiring electrode 109. Furthermore, after applying a flattering layer 110 formed of an acryl resin or the like in a thickness of about 1 µm, the contact holes are opened. After sputtering a transparent conductive film formed of ITO or the like on the flattering layer 110, the film is patterned into a predetermined shape to form a pixel electrode 111.

In Embodiment 8 (FIGS. 29A to 29C), the amorphous semiconductor thin film is crystallized in a method similar to that of Embodiment 7 (FIGS. 28A to 28D). Additionally, in Embodiment 8 having the top gate structure, unlike Embodiment 7 having a bottom gate structure, the crystallization is performed in a stage before the pattern of the gate electrode is formed. Therefore, an allowance of contraction of the insulating substrate of glass or the like is large as compared with Embodiment 7. Therefore, a crystallization process can be performed using a laser irradiation apparatus having a larger output. When a channel is formed in accordance with a position of a crystal grain array having a large grain diameter as shown in FIG. 14, a thin-film transistor having a high mobility is obtained.

Embodiment 9

FIG. 30 shows one example of an active matrix type display device using a thin-film transistor prepared according to a method described in Embodiment 7 or 8. As shown, the display device has a panel structure comprising a pair of insulating substrates 201, 202, and an electro-optical material 203 held between both the substrates. A liquid crystal material is broadly used as the electro-optical material 203. A pixel array portion 204 and a driving circuit portion are formed in the lower insulating substrate 201. The driving circuit portion is divided into a vertical driving circuit 205 and a horizontal driving circuit 206.

Moreover, a terminal portion 207 for outside connection is formed on an upper end of a peripheral portion of the insulating substrate 201. The terminal portion 207 is connected to the vertical driving circuit 205 and the horizontal driving circuit 206 via a wiring 208. In the pixel array portion 204, a rowed gate wiring 209 and a columned signal wiring 210 are formed. Pixel electrodes 211 and thin-film transistors 212 are formed in intersections between both the wirings. A gate electrode of the thin-film transistor 212 is connected to the corresponding gate wiring 209, a drain region is connected to the corresponding pixel electrode 211, and a source region is connected to the corresponding signal wiring 210.

The gate wiring 209 is connected to the vertical driving circuit 205. On the other hand, the signal wiring 210 is connected to the horizontal driving circuit 206. The thin-film transistor 212 which switches the pixel electrode 211, and thin-film transistors included in the vertical driving circuit 205 and horizontal driving circuit 206 are prepared according to the present invention, and mobility is enhanced as compared with conventional transistors. Therefore, it is possible to form not only the driving circuit but also a processing circuit having a higher performance.

Figure 31:
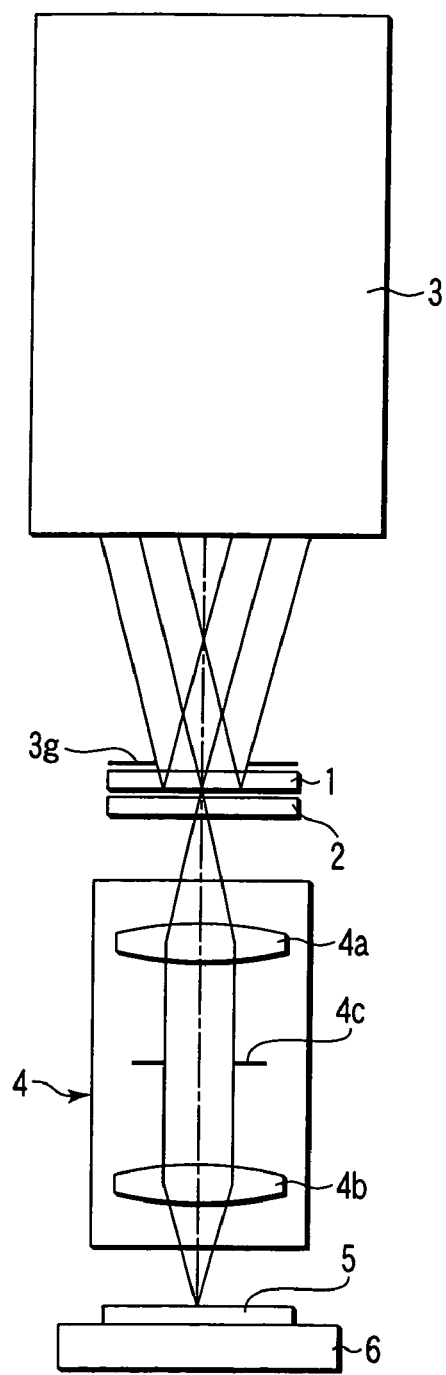
FIG. 31 is a diagram schematically showing a constitution of a crystallization apparatus according to another embodiment of the present invention.
Figure 32:
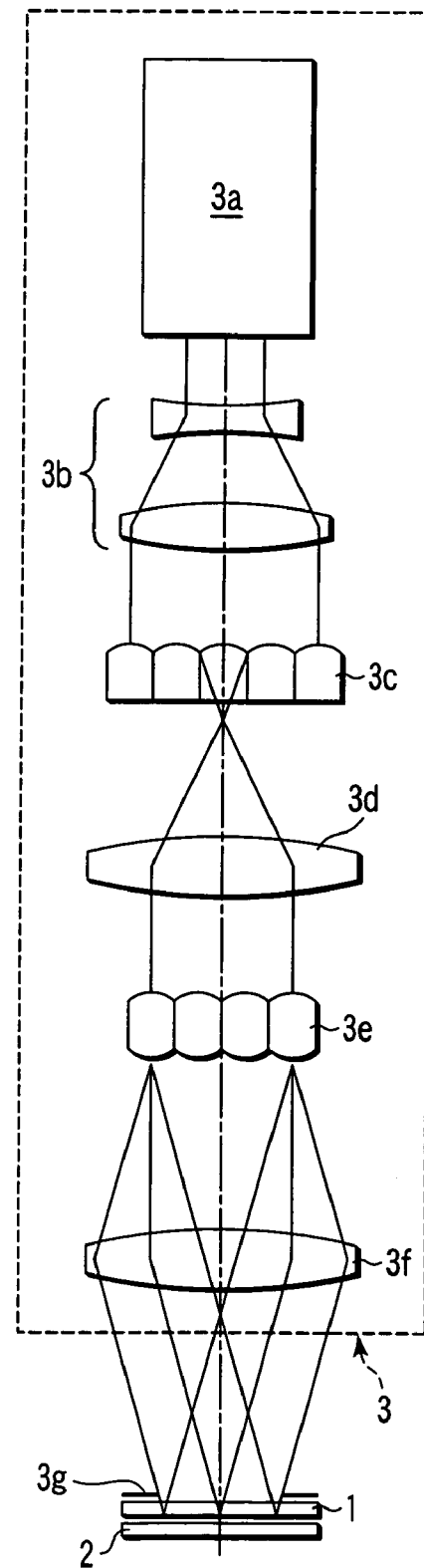
FIG. 32 is a diagram schematically showing an inner constitution of an illumination system of FIG. 31.

FIG. 31 is a diagram schematically showing a constitution of a crystallization apparatus according to another embodiment of the present invention. FIG. 32 is a diagram schematically showing an inner constitution of an illumination system of FIG. 31. Referring to FIGS. 31 and 32, the crystallization apparatus comprises a phase modulation device 1 for modulating a phase of an incident luminous flux to form a luminous flux having a predetermined light intensity distribution, and a luminous flux split device 2 (birefringence device 2E in this example) for splitting the incident luminous flux into two incoherent luminous fluxes having different polarized states.

It is to be noted that the phase modulation device 1 is disposed in the vicinity of the luminous flux split device 2 in such a manner that a phase pattern face (face having a step) faces the luminous flux split device 2. It is to be noted that the phase modulation device 1 may be constituted integrally with the luminous flux split device 2. Constitutions and functions of the phase modulation device 1 and the luminous flux split device 2 will be described later. The crystallization apparatus also comprises an illumination system 3 for illuminating the phase modulation device 1.

The illumination system 3 is an optical system shown, for example, in FIG. 32, and comprises a KrF excimer laser light source 3a which supplies light having a wavelength of 248 nm. As the light source 3a, another appropriate light source that emits an energy light ray for melting a member to be treated may be used, such as an XeCl excimer laser light source or a YAG laser light source. Laser light supplied from the light source 3a is enlarged via a beam expander 3b, and thereafter enters a first fly eye lens 3c. Thus, a plurality of light sources are formed on a rear-side focal plane of the first fly eye lens 3c, and the luminous flux from the plurality of light sources illuminates an incidence face of a second fly eye lens 3e via a first optical capacitor system 3d in a superimposing manner.

As a result, light sources more than those on the rear-side focal face of the first fly eye lens 3c are formed on the rear-side focal face of the second fly eye lens 3e. The luminous flux from the plurality of light sources formed on the rear-side focal face of the second fly eye lens 3e illuminates the phase modulation device 1 via a second optical capacitor system 3f and diaphragm 3g in the superimposing manner. Here, the first fly eye lens 3c and the first optical capacitor system 3d constitute a first homogenizer. The laser light supplied from the light source 3a is homogenized on the phase modulation device 1 with respect to an incidence angle by the first homogenizer.

Moreover, the second fly eye lens 3e and the second optical capacitor system 3f constitute a second homogenizer. The laser light whose incidence angle from the first homogenizer has been homogenized is homogenized on the phase modulation device 1 with respect to an incidence angle in each position in the plane by the second homogenizer. It is to be noted that a pair of cylindrical fly eye lenses may be used instead of the first fly eye lens 3c or the second fly eye lens 3e. Here, the cylindrical fly eye lens comprises a plurality of cylindrical lens elements which have refraction functions in a certain flat face and which do not have any refraction function in a flat face crossing the flat face at right angles.

Thus, the illumination system 3 irradiates the phase modulation device 1 with the laser light having a substantially uniform light intensity distribution. The laser light whose phase has been modulated by the phase modulation device 1 enters a substrate 5 to be treated via an optical image forming system 4. Here, a phase pattern face of the phase modulation device 1, and the substrate 5 to be treated are arranged in an optically conjugated manner in the optical image forming system 4. In other words, the substrate 5 to be treated is disposed in a plane (i.e., the image plane of the optical image forming system 4) optically conjugated with respect to the phase pattern face of the phase modulation device 1. The optical image forming system 4 comprises an aperture iris 4c between positive lens groups 4a and 4b.

The aperture iris 4c has a plurality of aperture irises whose openings (light transmitting portions) have different sizes. The plurality of aperture irises 4c may be constituted to be changeable with respect to an optical path. Alternatively, the aperture iris 4c may have irises whose opening sizes are continuously changeable. In any case, as described later, the size (i.e., image-side numerical aperture NA of the optical image forming system 4) of the opening of the aperture iris 4c is set in such a manner as to produce a desired light intensity distribution on the semiconductor film of the substrate 5 to be treated. It is to be noted that the optical image forming system 4 may be a refractive optical system, reflective optical system, or refractive/reflective optical system.

Moreover, the substrate 5 to be treated is constituted by depositing a lower-layer insulating film, a semiconductor thin film, and an upper-layer insulating film in order on the substrate. That is, in the substrate 5 to be treated, for example, an underlayer insulating film, a non-single-crystal film (e.g., an amorphous silicon film), and a cap film are successively formed on plate glass for a liquid crystal display by a chemical vapor development (CVD) process. The underlayer insulating film and the cap film are insulating films, for example, $SiO_2$. The underlayer insulating film prevents the amorphous semiconductor film from being directly brought into contact with the glass substrate. Foreign matters such as Na are prevented from being mixed in the amorphous semiconductor film. Moreover, melting temperature of the amorphous silicon film is prevented from being directly conducted to the glass substrate. The amorphous silicon film is a crystallized semiconductor film.

The amorphous silicon film is heated, when incident light is absorbed. The cap film is heated, when a part of heat is conducted. The heat is accumulated in the amorphous silicon film. When the incidence of the light beam is interrupted, the temperature of a high-temperature portion drops relatively rapidly in an irradiated face of the amorphous silicon film. The above-described heat accumulating effect moderates an effect speed of the temperature, and promotes crystal growth of a lateral direction of a large grain diameter. The substrate 5 to be treated is positioned and held in a predetermined position on a substrate stage 6 by a vacuum chuck, an electrostatic chuck or the like.

Embodiment 10

FIG. 33 is a diagram schematically showing a constitution of a phase modulation device according to Embodiment 10 of the present invention. The phase modulation device 1 is a phase modulation device for preparing a semiconductor thin film comprising a 5 µm square crystal grain array. The phase modulation device 1 comprises a plurality of unit areas 1a having the same pattern, and the respective unit areas 1a are two-dimensionally arranged in a predetermined period. In FIG. 33, for simplicity of description, only two adjacent unit areas 1a having square shapes are shown. One side of each of the unit areas 1a is 5 µm in accordance with a converted value in the image plane of the optical image forming system 4. Dimensions of the phase modulation device 1 will be described hereinafter in accordance with converted values in the image plane of the optical image forming system 4.

The unit area 1a comprises a reference face (blank portion in the drawing) 1aa having a certain phase, a first area 1ab and a second area 1ac arranged in the vicinity of a center of the unit area 1a, and third areas 1ad, 1ae and fourth areas 1af, 1ag disposed around the first area 1ab and the second area 1ac. Here, each of the first area 1ab and the second area 1ac is a pattern having a fan shape obtained by dividing a circle having a radius of 1.1 µm into four equal parts, and the areas are arranged in such a manner that vertexes are brought into contact with each other in the center of the unit area 1a.

The third area 1ad and the fourth area 1af are square dot patterns whose one side is 0.5 µm, and are disposed at an equal distance from the center of the unit area 1a (contact between the first area 1ab and the second area 1ac). On the other hand, the third area 1ae and the fourth area 1ag are square dot patterns whose one side is 0.3 µm, and are disposed at an equal distance from the center of the unit area 1a. They are farther from the center of the unit area 1a than the third area 1ad and the fourth area 1af are. The unit area 1a has a symmetric pattern with respect to a diagonal line B-B or C-C.

In the unit area 1a on the left side in the drawing, the first area 1ab and the third areas 1ad, 1ae have a phase (relative phase at a time when the phase in the reference face 1aa is standardized at 0°) of −60° with respect to the reference face 1aa. The second area 1ac and the fourth areas 1af, 1ag have a phase of +60° with respect to the reference face 1aa. Conversely, in the unit area 1a on the right side in the drawing, the first area 1ab and the third areas 1ad, 1ae have a phase of +60° with respect to the reference face 1aa. The second area 1ac and the fourth areas 1af, 1ag have a phase of −60° with respect to the reference face 1aa.

That is, in the phase modulation device 1 of this example, the reference face 1aa has the same phase between two adjacent unit areas 1a, but the first area 1ab, second area 1ac, third areas 1ad, 1ae, fourth areas 1af, 1ag have phases (phases whose absolute values are equal and whose signs are different) mutually reversed with respect to the reference face 1aa. It is to be noted that the third areas 1ad, 1ae and the fourth areas 1af, 1ag have shapes which are optically smaller than a radius of a point spread distribution range of the optical image forming system 4.

Figure 34A:
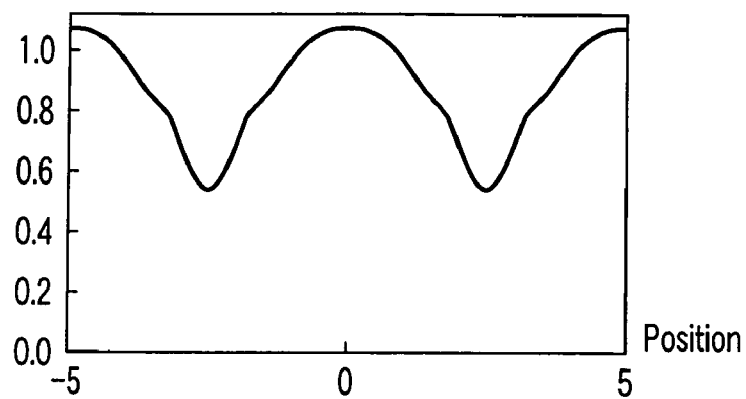
FIGS. 34A, 34B, 34C show a light intensity distribution obtained by the phase modulation device in which any luminous flux split device is not used in Embodiment 10.
Figure 34B:
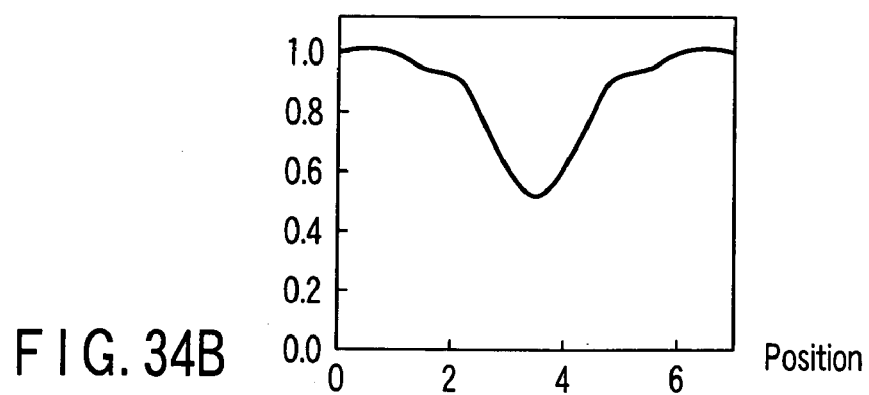
Figure 34C:
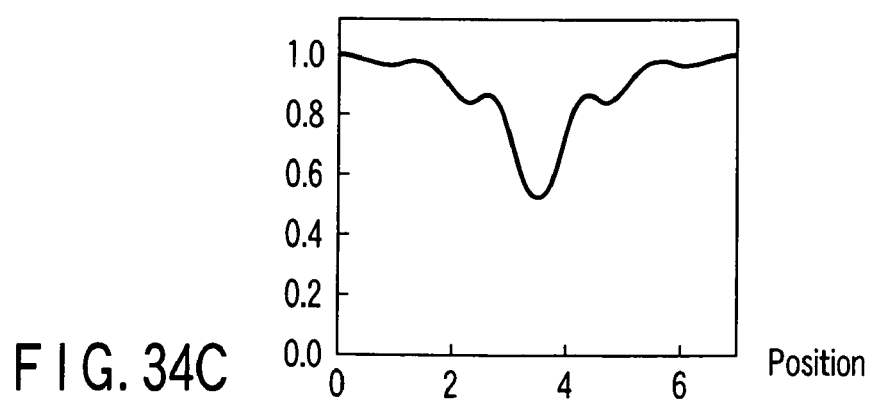

In Embodiment 10, in a case where a luminous flux split device 2 is not disposed, light intensity distributions shown in FIGS. 34A to 34C are formed on the surface of a substrate 5 to be treated positioned in a focal position (focus position) of the optical image forming system 4. That is, in FIG. 33, the light intensity distribution shown in FIG. 34A is formed along a crossing line corresponding to a line A-A crossing a middle of the unit area 1a of the phase modulation device 1. The light intensity distribution shown in FIG. 34B is formed along a slanted line corresponding to a rightward ascending diagonal line B-B of the unit area 1a on the left side in the drawing. The light intensity distribution shown in FIG. 34C is formed along a slanted line corresponding to a leftward ascending diagonal line C-C of the unit area 1a on the right side in the drawing.

It is to be noted that in the following embodiments, an image-side numerical aperture NA of the optical image forming system 4 is set to 0.13, and an illumination sigma value (numerical aperture of an illumination system/object-side numerical aperture of the optical image forming system 4) is set to 0.43. Moreover, in FIGS. 34A to 34C, the ordinate indicates light intensity, and shows a relative value at a time when the maximum value is normalized into 1. The abscissa indicates a distance (µm) from a point corresponding to the center of the unit area 1a. It is to be noted that in the following, the light intensity distributions are described in the same manner as in FIG. 34.

It is seen from FIG. 34A that a bottom peak having a smallest light intensity is formed corresponding to a contact (the center of the unit area 1a) between the first area 1ab and the second area 1ac. An inversely peaked distribution whose light intensity rapidly increases is formed radially toward periphery from the bottom peak by functions of the first area 1ab and second area 1ac. A tilted distribution whose light intensity slowly increases is formed radially toward the periphery from the inversely peaked distribution by the third areas 1ad, 1ae and the fourth areas 1af, 1ag. It is to be noted that the functions of the third areas 1ad, 1ae and the fourth areas 1af, 1ag will be described later in detail (Embodiment 12). For example, a phase step pattern of the phase modulation device 1 is obtained, when the surface of a quartz glass substrate is worked, and a thickness distribution corresponding to a predetermined phase is formed. The quartz glass substrate can be worked by selective etching or focused ion beam (FIB) working.

Next, the luminous flux split device 2 for use in the crystallization apparatus of FIG. 31 will be described. FIG. 35 show explanatory views of a constitution and a function of the luminous flux split device. This luminous flux split device is, for example, a birefringence device 2E. This birefringence device 2E is constituted of a birefringent parallel flat plate set in such a manner that a crystal optical axis 2a forms a predetermined angle θ with respect to an optical axis. Examples of a birefringent optical material constituting the birefringence device 2E include quartz, calcite, magnesium fluoride and the like.

Figure 35A:
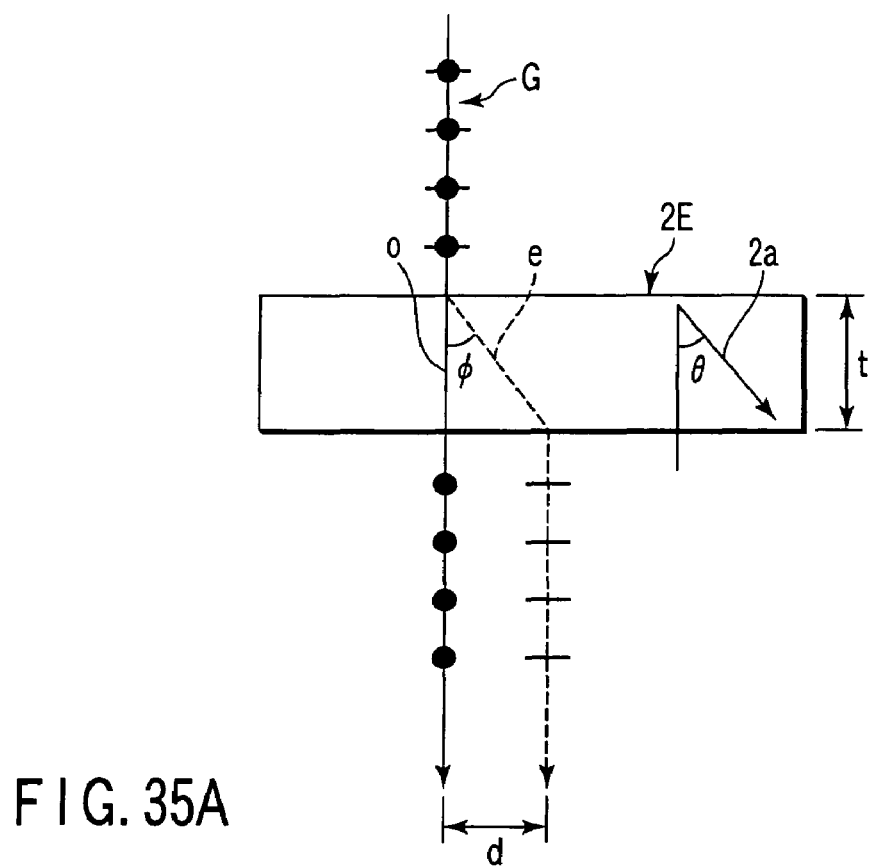
FIGS. 35A, 35B are explanatory views of a constitution and a function of the luminous flux split device in each embodiment of the present invention.

As shown in FIG. 35A, for example, when a light ray G having a random polarized state enters the birefringence device 2E in parallel with the optical axis, a light ray having a linearly polarized state in which a direction vertical to a sheet face of FIG. 35A is assumed as a polarization direction, that is, a normal light ray o (shown by black circles) travels straight without receiving any refractive function of the birefringence device 2E, and is emitted from the birefringence device 2E in parallel with the optical axis. On the other hand, a light ray having a linearly polarized state in which a direction parallel to a sheet face of FIG. 35A is assumed as the polarization direction, that is, an abnormal light ray e (shown by short straight lines) is refracted by an incidence interface of the birefringence device 2E, and travels in a direction forming an angle θ with respect to the optical axis. Thereafter, the ray is again refracted by an emission interface of the birefringence device 2E, and emitted in parallel with the optical axis of the birefringence device 2E. This phenomenon is widely known, and is described in detail, for example, in Chapter 5 of "General Optics II" authored by Junpei Tsujiuchi, published by Asakura Shoten, or "Basic Optics <Light Ray Optics•Electromagnetic Optics>" authored by Keie Kudo and Tomiya Uehara, published by Gendai Kogakusha.

Figure 35B:
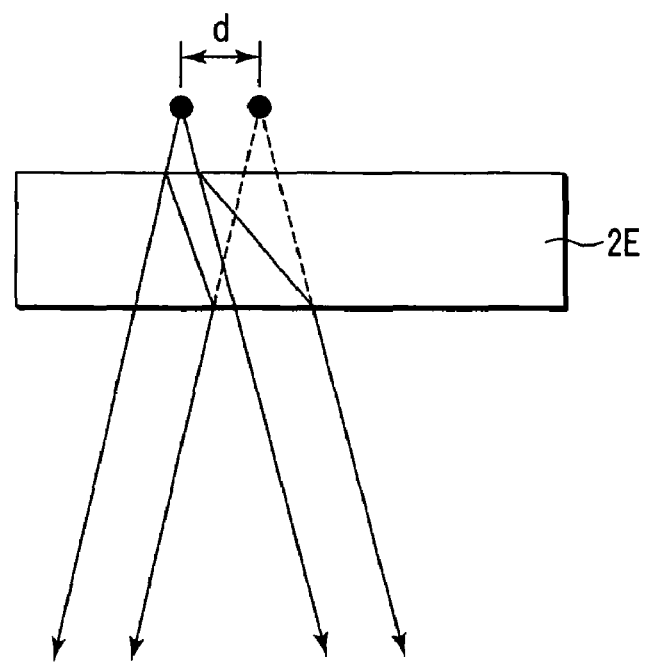

At this time, a distance between the normal light ray o and the abnormal light ray e emitted from the birefringence device 2E in parallel with the optical axis, that is, a separated width (detached distance) d depends on a type of the optical material forming the birefringence device 2E, direction of a crystal optical axis, a cutout way, dimension (i.e., thickness) of the birefringence device 2E in an optical axis direction and the like. FIG. 35B shows that one point on the phase modulation device 1 is split into two points by the birefringence device 2E, and observed. It is to be noted that the separated width d by the birefringence device 2E is a value of the optical image forming system 4 on an object side, and a separated width in the image plane of the optical image forming system 4 indicates a value obtained by multiplying the separated width d by a magnification (e.g., ⅕) of the optical image forming system 4.

The separated width d in a case where the light ray vertically enters the birefringence device 2E having a parallel flat plate shape formed by a uniaxial crystal material is represented by the following equation (a):

$$d = \tan \phi \times t \qquad (a),$$

where $\tan \phi = (no^2 - ne^2) \sin \theta \cdot \cos \theta / (ne^2 \cos^2 \theta + no^2 \sin^2 \theta)$.

It is to be noted that in the equation (a), no denotes a refractive index of the normal light ray o, and ne denotes a refractive index of the abnormal light ray e. As described above, φ denotes an angle between the abnormal light ray e and a normal (i.e., optical axis) of the incidence interface, θ is an angle between the crystal optical axis 2a and the normal of the incidence interface, and t denotes thickness of the birefringence device 2E. As one example, in a case where light has a wavelength of 248 nm, and the birefringence device 2E whose θ is set to 45 degrees and which is formed of quartz, a thickness t of the birefringence device 2E required for obtaining a separated width d=25 μm is 3697 μm. It is to be noted that in the calculation, the refractive indexes of quartz with respect to the light having a wavelength of 248 nm were set to ne=1.6124, no=1.6016

In this example, since an incident luminous flux is split into two incoherent luminous fluxes having different polarized states via the birefringence device 2E, a light intensity distribution corresponding to synthesis of two light intensity distributions detached from each other is formed on the surface of the substrate 5 to be treated. At this time, when the incident luminous flux upon the birefringence device 2E has a random polarized state, two luminous fluxes split via the birefringence device 2E are substantially equal to each other. When two luminous fluxes split via the birefringence device 2E are superimposed upon the surface of the substrate 5 to be treated by a double image function, two luminous fluxes do not interfere with each other, and the fluxes are synthesized simply as the sum of light intensities.

Thus, in FIG. 33, the light intensity distribution formed on the surface of the substrate 5 to be treated by the normal light ray o passed through the right unit area 1a of the phase modulation device 1, and that formed on the surface of the substrate 5 to be treated by the abnormal light ray e passed through the left unit area 1a are superimposed, and synthesized. As a result, a light intensity distribution shown in FIGS. 36A, 36B is formed on the surface of the substrate 5 to be treated positioned in the focal position of the optical image forming system 4. FIG. 36A is a diagram sterically showing a synthesized light intensity distribution superimposed on the surface of the substrate 5 to be treated. FIG. 36B is a diagram showing a synthesized light intensity distribution along the crossing line corresponding to the crossing line A-A of the unit area 1a.

Moreover, a light intensity distribution shown in FIGS. 37A, 37B is formed on the surface of the substrate 5 defocused on an optical image forming system 4 side by 10 μm from the focal position of the optical image forming system 4 and positioned. FIG. 37A is a diagram sterically showing a synthesized light intensity distribution superimposed on the surface of the substrate 5 to be treated. FIG. 37B is a diagram showing a synthesized light intensity distribution along the crossing line corresponding to the crossing line A-A of the unit area 1a. Referring to FIGS. 36A, 36B and FIGS. 37A, 37B, it is seen that even when the surface of the substrate 5 to be treated is defocused to a certain degree with respect to the focal position of the optical image forming system 4, the synthesized light intensity distribution does not change very much by a cooperative function of the phase modulation device 1 and the birefringence device 2E, and a large depth of focus is secured.

In Embodiment 10, in the crystallization apparatus shown in FIG. 31, a semiconductor (Si) thin film on the substrate 5 to be treated was crystallized using the phase modulation device 1 having a constitution shown in FIG. 33. On the substrate 5 to be treated, for example, the laser light having the light intensity distribution between the light intensity distribution shown in FIGS. 36A, 36B and that shown in FIGS. 37A, 37B was formed, and a semiconductor thin film comprising a 5 μm square crystal grain array was prepared as shown in FIG. 14B through a crystallization process shown in FIG. 12. As shown in FIGS. 36A, 36B and FIGS. 37A, 37B, even when the surface of the substrate 5 to be treated is defocused with respect to the focal position of the optical image forming system 4, the light intensity distribution synthesized on the substrate 5 to be treated does not change very much. Since a large depth of focus is secured in this manner, the semiconductor thin film comprising a crystal grain array having satisfactory uniformity is obtained.

Embodiment 11

Figure 38:
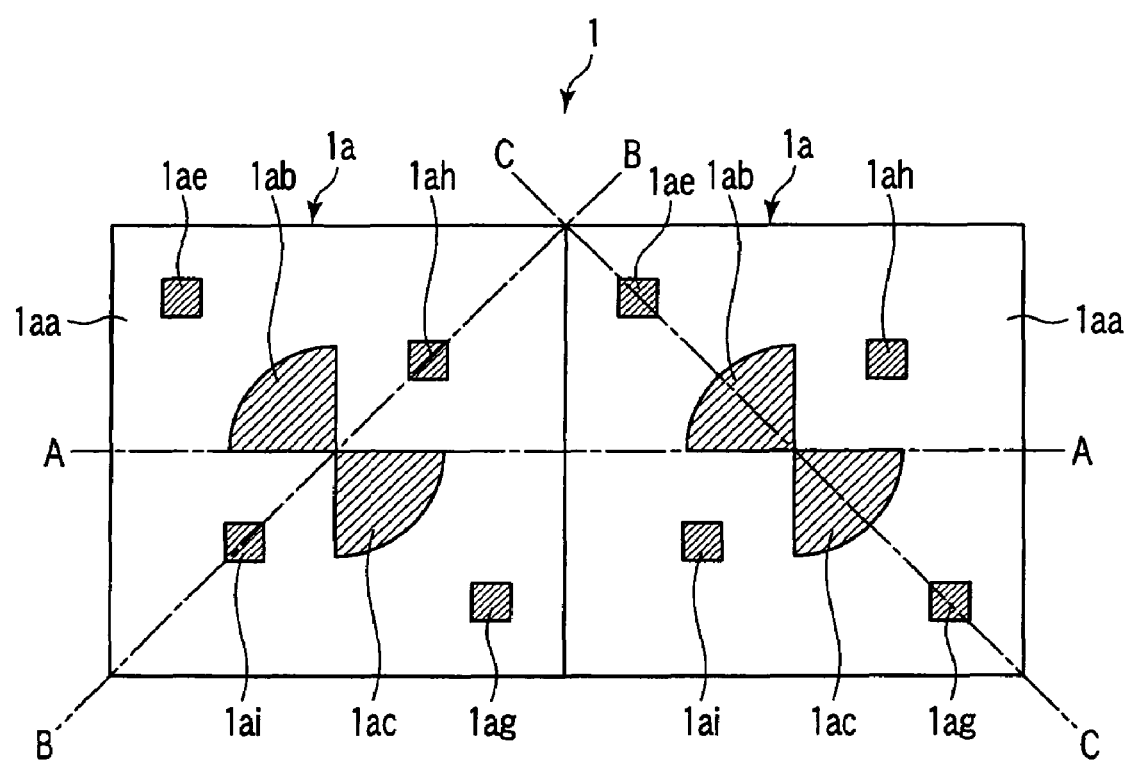
FIG. 38 is a diagram schematically showing a constitution of a phase modulation device in Embodiment 11.

FIG. 38 is a diagram schematically showing a constitution of a phase modulation device according to Embodiment 11 of the present invention. A phase modulation device 1 is a phase modulation device for preparing a semiconductor thin film comprising a 5 μm square crystal grain array in the same manner as in Embodiment 10, and has a constitution similar to that of Embodiment 10. However, in Embodiment 11, instead of a third area 1ad and a fourth area 1af constituted of square dot patterns whose one side is 0.5 μm, a third area 1ah and a fourth area 1ai constituted of square dot patterns whose one side is 0.3 μm are disposed. In this respect, Embodiment 11 is different from Embodiment 10. Embodiment 11 will be described noting a difference from Embodiment 10.

Figure 39A:
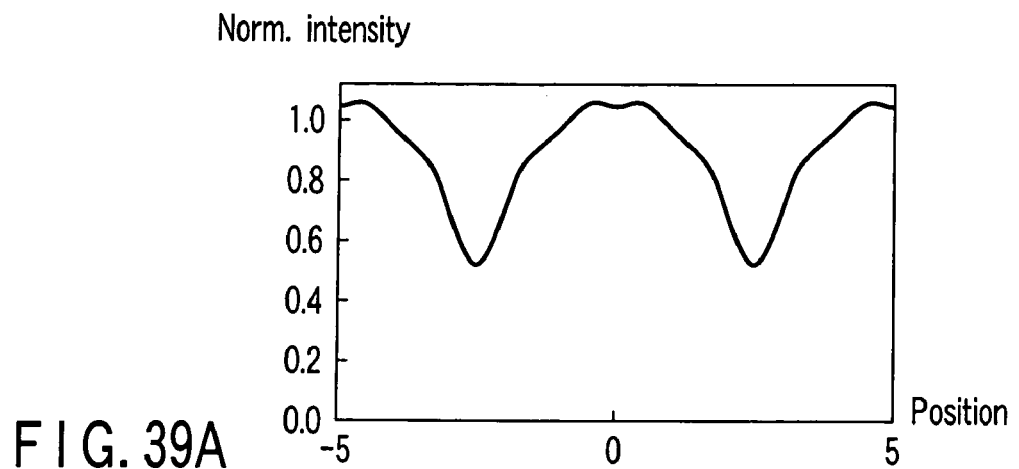
FIGS. 39A, 39B, 39C show a light intensity distribution obtained by the phase modulation device in which any luminous flux split device is not used in Embodiment 11.
Figure 39B:
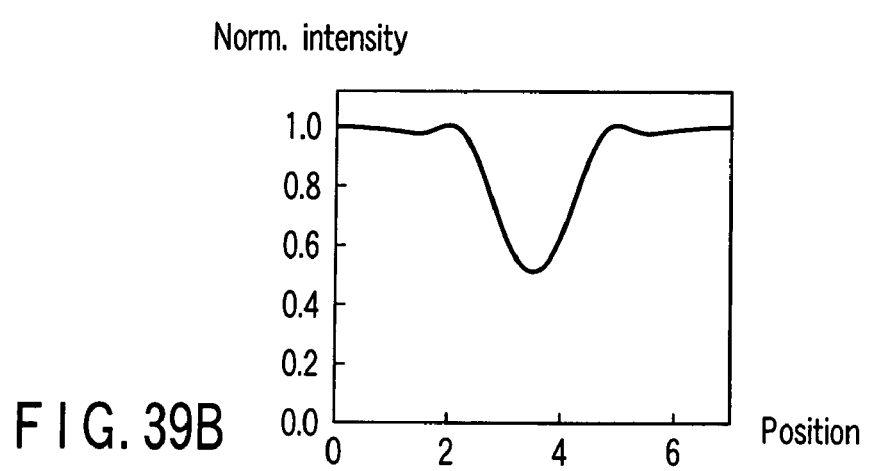
Figure 39C:
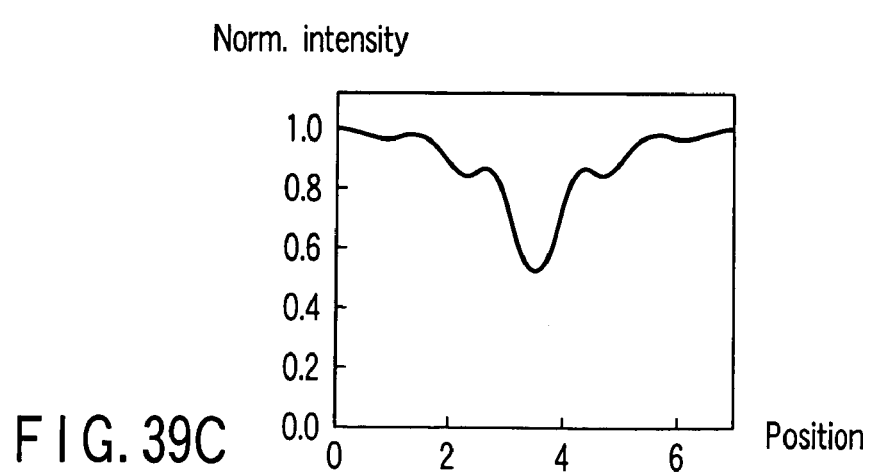

In Embodiment 11, in a case where any luminous flux split device 2 is not disposed, light intensity distributions shown in FIGS. 39A to 39C are formed on a substrate 5 to be treated positioned in a focal position of an optical image forming system 4. That is, in FIG. 38, the light intensity distribution shown in FIG. 39A is formed along a crossing line corresponding to a line A-A crossing a middle of a unit area 1a of the phase modulation device 1. The light intensity distribution shown in FIG. 39B is formed along a slanted line corresponding to a rightward ascending diagonal line B-B of the unit area 1a on the left side. The light intensity distribution shown in FIG. 39C is formed along a slanted line corresponding to a leftward ascending diagonal line C-C of the unit area 1a on the right side.

It is seen from FIG. 39A that a bottom peak having a smallest light intensity is formed corresponding to a contact (i.e., the center of the unit area 1a) between the first area 1ab and the second area 1ac. An inversely peaked distribution whose light intensity rapidly increases is formed radially toward periphery from the bottom peak by functions of the first area 1ab and second area 1ac. A tilted distribution whose light intensity slowly increases is formed radially toward the periphery from the inversely peaked distribution by functions of the third areas 1ah, 1ae and the fourth areas 1ai, 1ag.

In this example, in actual, since an incident luminous flux is split into two incoherent luminous fluxes having different polarized states via the birefringence device 2E, a light intensity distribution formed on the surface of the substrate 5 to be treated by a normal light ray o passed through the unit area 1a of the phase modulation device 1 on the right side in the drawing, and that formed on the surface of the substrate to be treated by an abnormal light ray e passed through the unit area 1a on the left side in the drawing are superimposed, and synthesized. As a result, a light intensity distribution shown in FIGS. 40A, 40B is formed on the surface of the substrate 5 to be treated positioned in the focal position of the optical image forming system 4. FIG. 40A is a diagram sterically showing a synthesized light intensity distribution superimposed on the surface of the substrate 5 to be treated. FIG. 40B is a diagram showing a synthesized light intensity distribution along the crossing line corresponding to the crossing line A-A of the unit area 1a.

A light intensity distribution shown in FIGS. 41A, 41B is formed on the surface of the substrate 5 defocused on an optical image forming system 4 side by 10 μm from the focal position of the optical image forming system 4 and positioned. FIG. 41A is a diagram sterically showing a synthesized light intensity distribution superimposed on the surface of the substrate 5 to be treated. FIG. 41B is a diagram showing a synthesized light intensity distribution along the crossing line corresponding to the crossing line A-A of the unit area 1a.

Referring to FIGS. 40A, 40B and FIGS. 41A, 41B, it is seen that even when the surface of the substrate 5 to be treated is defocused to a certain degree with respect to the focal position of the optical image forming system 4, the synthesized light intensity distribution does not change very much by a cooperative function of the phase modulation device 1 and the birefringence device 2E. That is, a large depth of focus is secured. Concretely, when the substrate 5 to be treated is defocused by 10 μm with respect to the focal position of the optical image forming system 4, a relative value of the bottom peak rises to about 0.62 from about 0.5, and a peak width W1 increases to about 1.14 μm from about 1.01 μm. That is, the relative value of the bottom peak and the peak width W1 change in the above-described desirable range. It is to be noted that the peak width W1 is slightly smaller than that of Embodiment 10 in the synthesized light intensity distribution obtained in Embodiment 11.

In Embodiment 11, in the crystallization apparatus shown in FIG. 31, a semiconductor (Si) thin film on the substrate 5 to be treated was crystallized using the phase modulation device 1 having a constitution shown in FIG. 38. On the substrate 5 to be treated, for example, the laser light having the light intensity distribution between the light intensity distribution shown in FIGS. 40A, 40B and that shown in FIGS. 41A, 41B was formed, and a semiconductor thin film comprising a 5 μm square crystal grain array was prepared as shown in FIG. 14B through a crystallization process shown in FIG. 12. As shown in FIGS. 40A, 40B and FIGS. 41A, 41B, even when the substrate 5 to be treated is defocused with respect to the focal position of the optical image forming system 4, the light intensity distribution synthesized on the substrate 5 to be treated does not change very much. Since a large depth of focus is secured in this manner, the semiconductor thin film comprising a crystal grain array having satisfactory uniformity is obtained.

Embodiment 12

Figure 42:
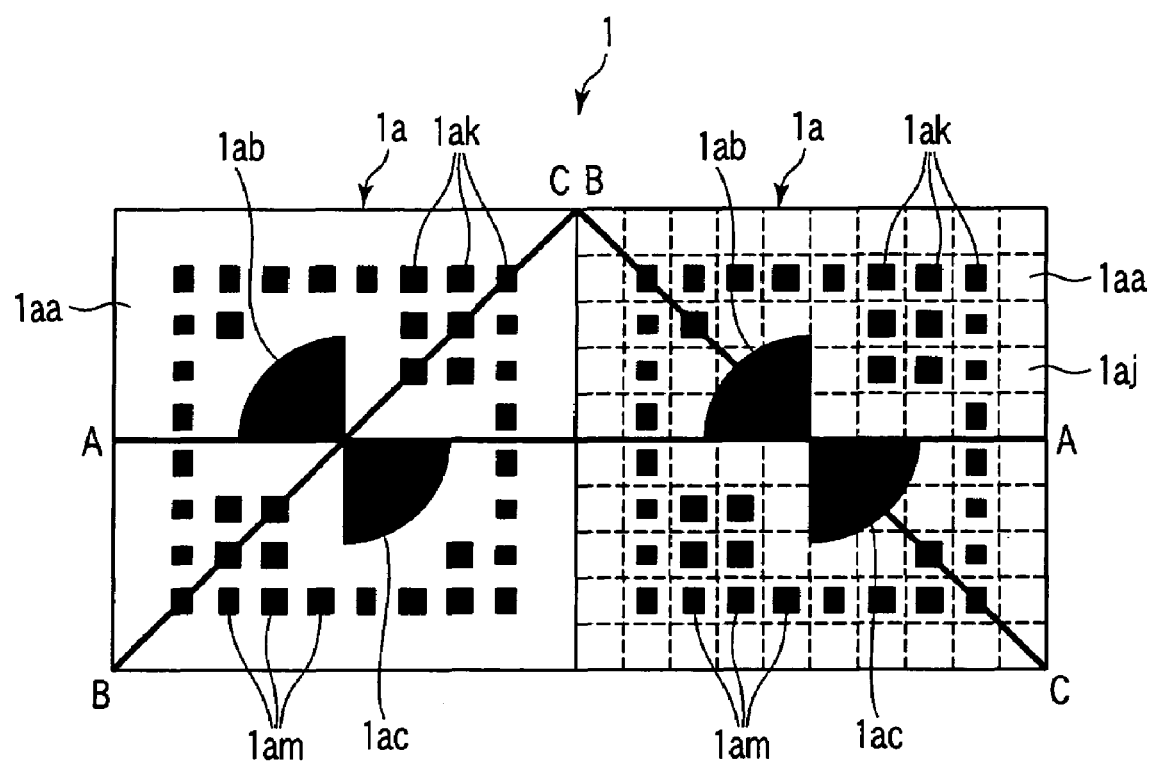
FIG. 42 is a diagram schematically showing a constitution of a phase modulation device in Embodiment 12.

FIG. 42 is a diagram schematically showing a constitution of a phase modulation device according to Embodiment 12 of the present invention. A phase modulation device 1 is a phase modulation device for preparing a semiconductor thin film comprising a 5 μm square crystal grain array in the same manner as in Embodiment 10, and has a constitution similar to that of Embodiment 10. However, in Embodiment 12, a dot pattern disposed around a first area 1ab and a second area 1ac is different from that of Embodiment 10. Embodiment 12 will be described noting a difference from Embodiment 10.

In the phase modulation device 1 of Embodiment 12, 0.5 μm square unit cells (shown only in a unit area 1a on the right side in the drawing for clarity) 1aj having square shapes are virtually set longitudinally/laterally and densely around the first area 1ab and the second area 1ac. Each cell is optically smaller than a radius of a point spread distribution range of the optical image forming system 4. Moreover, third areas 1ak are disposed in a plurality of unit cells 1aj above a crossing line A-A in the drawing, and fourth areas 1am are disposed in a plurality of unit cells 1aj below the crossing line A-A. Additionally, any third or area is not disposed in a unit cell 1aj around the first area 1ab and the second area 1ac. The unit area 1a has a symmetric pattern with respect to diagonal lines B-B and C-C.

Here, in the unit area 1a on the left side in the drawing, the first area 1ab and the third areas 1ak have a phase of −60 degrees with respect to a reference face 1aa, and the second area 1ac and the fourth areas 1am have a phase of +60 degrees with respect to the reference face 1aa. Conversely, in the unit area 1a on the right side in the drawing, the first area 1ab and the third areas 1ak have a phase of +60 degrees with respect to the reference face 1aa, and the second area 1ac and the fourth areas 1am have a phase of −60 degrees with respect to the reference face 1aa.

Moreover, a proportion of the third area 1ak in the unit cell 1aj, and that of the fourth area 1am in the unit cell 1aj are constituted in such a manner as to decrease apart from a contact (center of the unit area 1a) between the first area 1ab and the second area 1ac. When the proportions of the third areas 1*ak* and the fourth areas 1*am* are constituted in such a manner as to decrease apart from the center of the unit area 1*a*, a funnel-shaped tilted distribution enlarging apart from the inversely peaked distribution is realized.

Figure 43A:
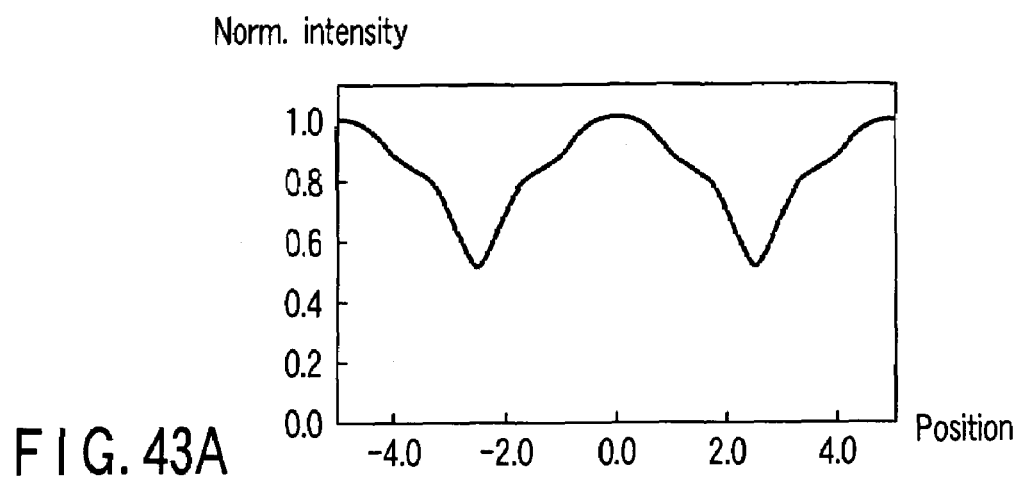
FIGS. 43A, 43B, 43C show a light intensity distribution obtained by the phase modulation device in which any luminous flux split device is not used in Embodiment 12.
Figure 43B:
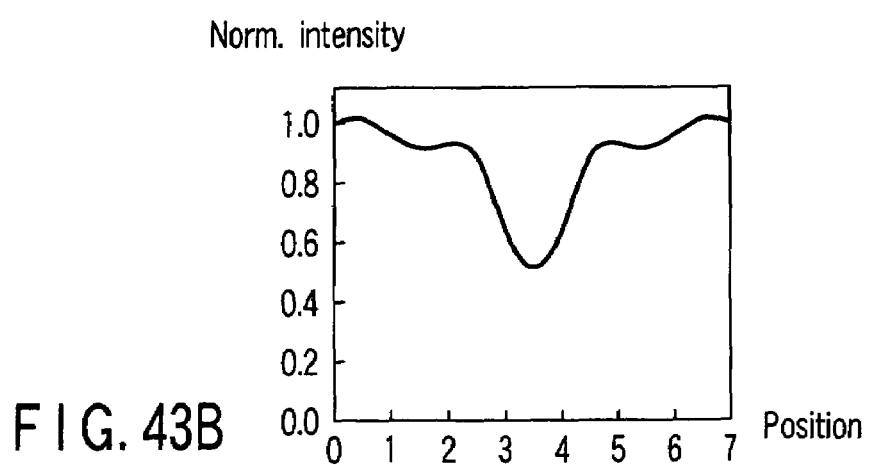
Figure 43C:
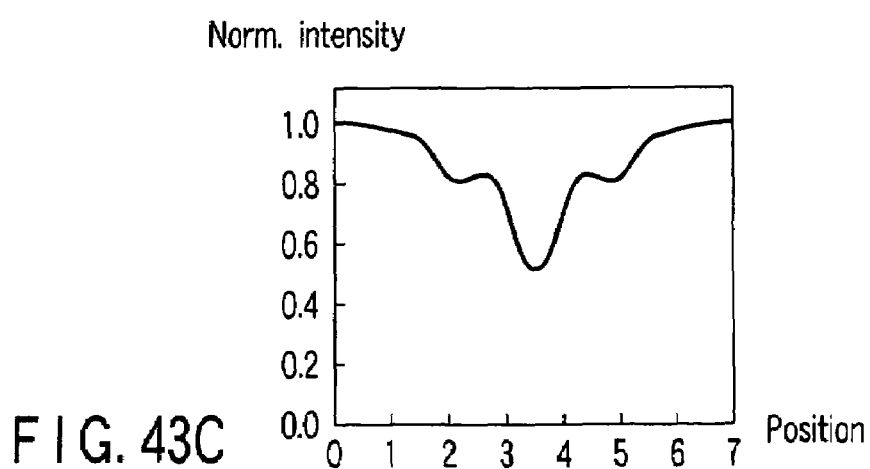

When the luminous flux split device 2 is not disposed in Embodiment 12, light intensity distributions shown in FIGS. 43A to 43C are formed on the surface of the substrate 5 to be treated positioned in the focal position of the optical image forming system 4. That is, in FIG. 42, the light intensity distribution shown in FIG. 43A is formed along a crossing line corresponding to a line A-A crossing a middle of the unit area 1*a* of the phase modulation device 1. The light intensity distribution shown in FIG. 43B is formed along a slanted line corresponding to a rightward ascending diagonal line B-B of the unit area 1*a* on the left side. The light intensity distribution shown in FIG. 43C is formed along a slanted line corresponding to a leftward ascending diagonal line C-C of the unit area 1*a* on the right side.

It is seen from FIG. 43A that a bottom peak having a smallest light intensity is formed corresponding to a contact (i.e., the center of the unit area 1*a*) between the first area 1*ab* and the second area 1*ac*. An inversely peaked distribution whose light intensity rapidly increases is formed radially toward periphery from the bottom peak by functions of the first area 1*ab* and second area 1*ac*. A tilted distribution whose light intensity slowly increases is formed radially toward the periphery from the inversely peaked distribution by functions of the third areas 1*ak* and the fourth areas 1*am*.

Figure 44A:
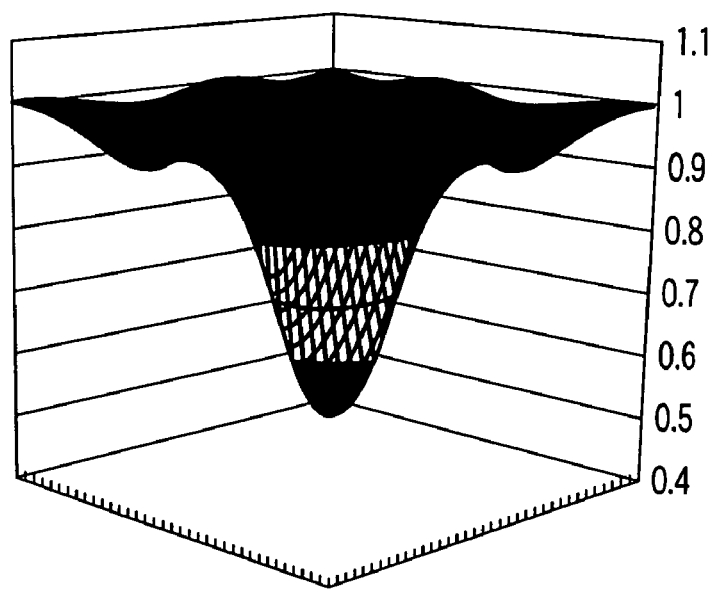
FIGS. 44A, 44B show a light intensity distribution obtained in a focus position by the phase modulation device and the luminous flux split device in Embodiment 12.
Figure 44B:
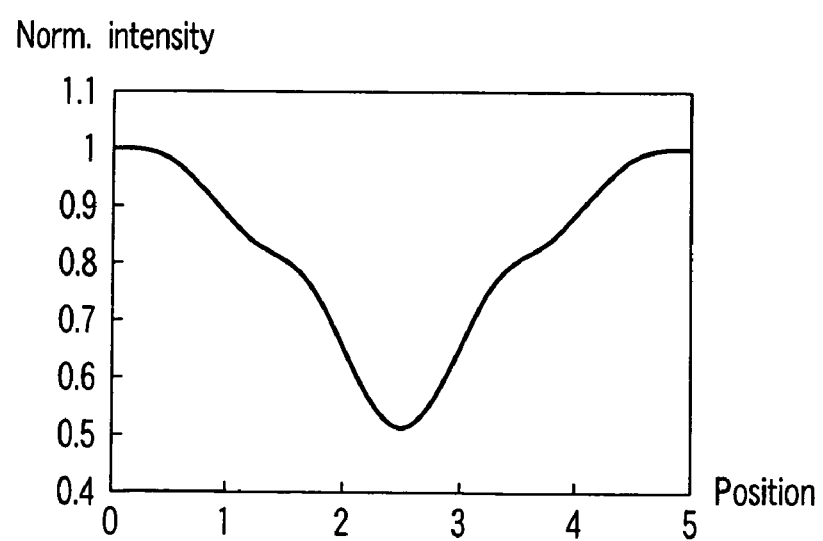

In this example, in actual, since an incident luminous flux is split into two incoherent luminous fluxes having different polarized states via the birefringence device 2E, a light intensity distribution formed on the surface of the substrate 5 to be treated by a normal light ray o passed through the unit area 1*a* of the phase modulation device 1 on the right side in the drawing, and that formed on the surface of the substrate to be treated by an abnormal light ray e passed through the unit area 1*a* on the left side in the drawing are superimposed, and synthesized. As a result, a light intensity distribution shown in FIGS. 44A, 44B is formed on the surface of the substrate 5 to be treated positioned in the focal position of the optical image forming system 4. FIG. 44A is a diagram sterically showing a synthesized light intensity distribution superimposed on the surface of the substrate 5 to be treated. FIG. 40B is a diagram showing a synthesized light intensity distribution along the crossing line corresponding to the crossing line A-A of the unit area 1*a*.

Figure 45A:
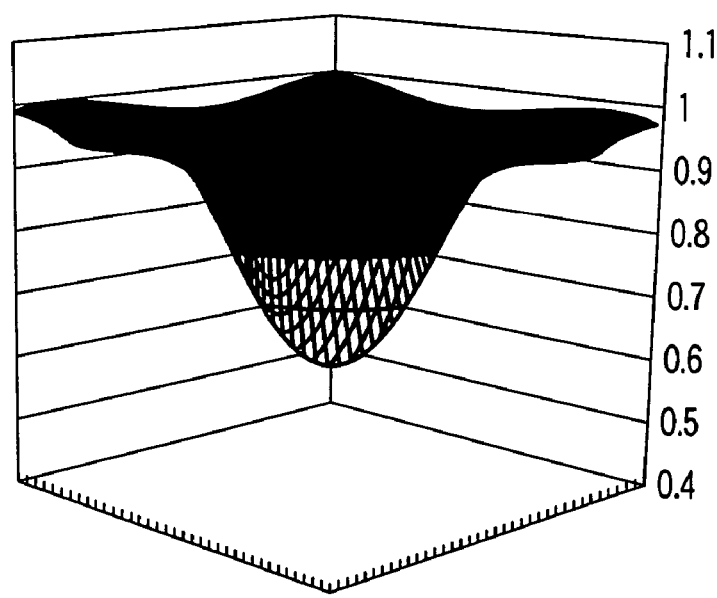
FIGS. 45A, 45B show a light intensity distribution obtained in a defocus position by the phase modulation device and the luminous flux split device in Embodiment 12.
Figure 45B:
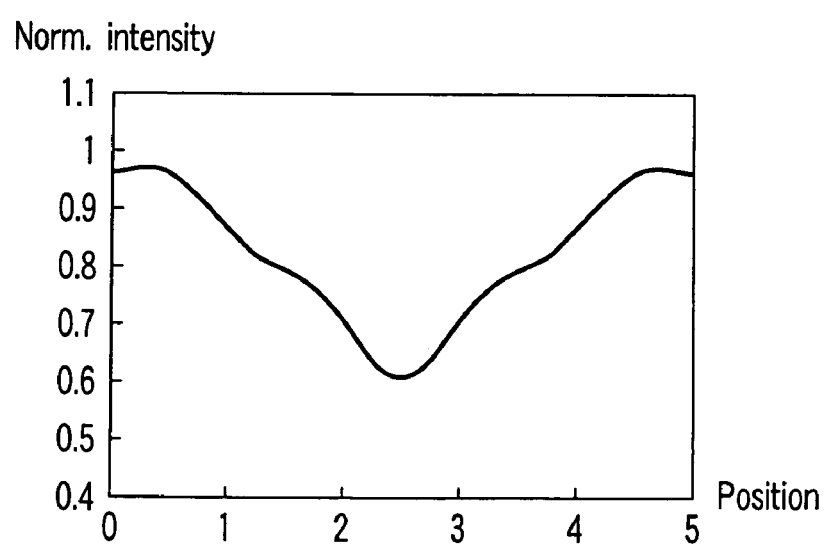

A light intensity distribution shown in FIGS. 45A, 45B is formed on the surface of the substrate 5 to be treated. The surface has been defocused on an optical image forming system 4 side by 10 µm from the focal position of the optical image forming system 4 and positioned. FIG. 45A is a diagram sterically showing a synthesized light intensity distribution superimposed on the surface of the substrate 5 to be treated. FIG. 45B is a diagram showing a synthesized light intensity distribution along the crossing line corresponding to the crossing line A-A of the unit area 1*a*.

Referring to FIGS. 44A, 44B and FIGS. 45A, 45B, it is seen that even when the surface of the substrate 5 to be treated is defocused to a certain degree with respect to the focal position of the optical image forming system 4, the synthesized light intensity distribution does not change very much by a cooperative function of the phase modulation device 1 and the birefringence device 2E. That is, a large depth of focus is secured. Concretely, when the substrate 5 to be treated is defocused by 10 µm with respect to the focal position of the optical image forming system 4, a relative value of the bottom peak rises to about 0.62 from about 0.5, and a peak width W1 increases to about 1.14 µm from about 1.01 µm. That is, the relative value of the bottom peak and the peak width W1 change in the above-described desirable range. It is to be noted that in the synthesized light intensity distribution obtained in Embodiment 12, the light intensity changes in the tilted distribution more slowly than in Embodiments 10 and 11, and the distribution similar to that of FIG. 13A was obtained.

In Embodiment 12, in the crystallization apparatus shown in FIG. 31, a semiconductor (Si) thin film on the substrate 5 to be treated was crystallized using the phase modulation device 1 having a constitution shown in FIG. 42. On the substrate 5 to be treated, for example, the laser light having the light intensity distribution between the light intensity distribution shown in FIG. 44A and that shown in FIG. 45 was formed, and a semiconductor thin film comprising a 5 µm square crystal grain array was prepared as shown in FIG. 14B through a crystallization process shown in FIG. 12. As shown in FIGS. 44A, 44B and FIGS. 45A, 45B, even when the substrate 5 to be treated is defocused with respect to the focal position of the optical image forming system 4, the light intensity distribution synthesized on the substrate 5 to be treated does not change very much. Since a large depth of focus is secured in this manner, the semiconductor thin film comprising a crystal grain array having satisfactory uniformity is obtained.

Embodiment 13

Figure 46:
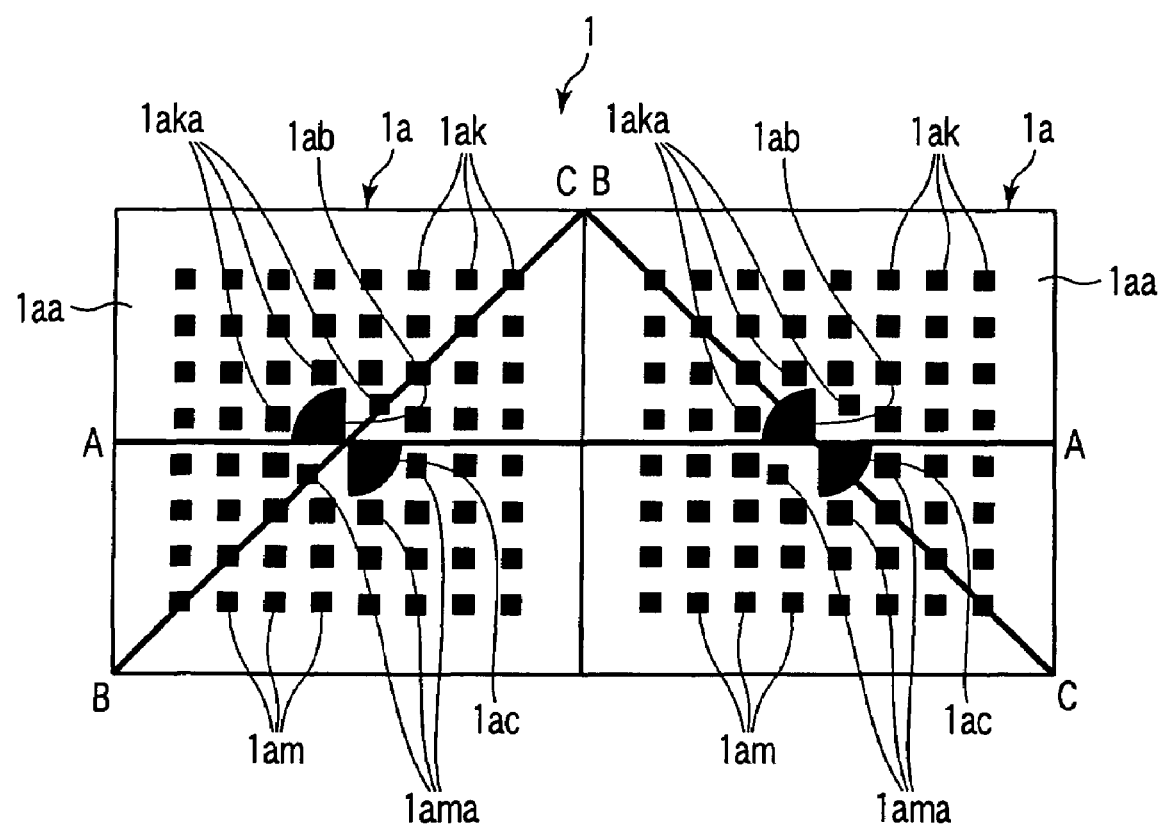
FIG. 46 is a diagram schematically showing a constitution of a phase modulation device in Embodiment 13.

FIG. 46 is a diagram schematically showing a constitution of a phase modulation device according to Embodiment 13 of the present invention. A phase modulation device 1 has a constitution similar to that of Embodiment 12. However, unlike Embodiments 10 to 12, the phase modulation device 1 is a phase modulation device for preparing a semiconductor thin film comprising a 10 µm square crystal grain array. In Embodiment 13, a dot pattern disposed around a first area 1*ab* and a second area 1*ac* is different from that of Embodiment 12. Embodiment 13 will be described hereinafter noting a different respect from Embodiment 12.

In the phase modulation device 1 of Embodiment 13, 1.0 µm square unit cells (not shown) having square shapes are virtually set longitudinally/laterally and densely around the first area 1*ab* and the second area 1*ac*. Each cell is optically smaller than a radius of a point spread distribution range of an optical image forming system 4. Moreover, third areas 1*ak* are disposed in a plurality of unit cells above a crossing line A-A in the drawing, and fourth areas 1*am* are disposed in a plurality of unit cell below the crossing line A-A. Additionally, any dot pattern is not disposed on a longitudinal/lateral line of a middle of a unit area 1*a*. The unit area 1*a* has a symmetric pattern with respect to diagonal lines B-B and C-C.

That is, a center interval of the dot pattern is 0.5 µm in Embodiment 12, while that of the dot pattern is 1.0 µm in Embodiment 13. Further in Embodiment 13, three third areas 1*aka* and three fourth areas 1*ama* are set into 0.4 µm squares round the first area 1*ab* and the second area 1*ac* in one unit area 1*a* in order to keep a comparatively rapid change of the light intensity in the vicinity of the inversely peaked distribution. It is to be noted that the present embodiment is similar to Embodiment 12 in that proportions of the third areas 1*ak* and the fourth areas 1*am* are set in such a manner as to decrease apart from the center of the unit area 1*a*.

In Embodiment 13, in a case where a luminous flux split device 2 is not disposed, light intensity distributions shown in FIGS. 47A to 47C are formed on the surface of a substrate 5 positioned in a focal position of the optical image forming system 4. That is, in FIG. 46, the light intensity distribution shown in FIG. 47A is formed along a crossing line corresponding to a line A-A crossing a middle of the unit area 1a of the phase modulation device 1. The light intensity distribution shown in FIG. 47B is formed along a slanted line corresponding to a rightward ascending diagonal line B-B of the unit area 1a on the left side. The light intensity distribution shown in FIG. 47C is formed along a slanted line corresponding to a leftward ascending diagonal line C-C of the unit area 1a on the right side.

It is seen from FIG. 47A that a bottom peak having a smallest light intensity is formed corresponding to a contact (i.e., the center of the unit area 1a) between the first area 1ab and the second area 1ac. An inversely peaked distribution whose light intensity rapidly increases is formed radially toward periphery from the bottom peak by functions of the first area 1ab and second area 1ac. A tilted distribution whose light intensity slowly increases is formed radially toward the periphery from the inversely peaked distribution by functions of the third areas 1ak and the fourth areas 1am.

In this example, in actual, since an incident luminous flux is split into two incoherent luminous fluxes having different polarized states via the birefringence device 2E, a light intensity distribution formed on the surface of the substrate 5 to be treated by a normal light ray o passed through the unit area 1a of the phase modulation device 1 on the right side in the drawing, and that formed on the surface of the substrate to be treated by an abnormal light ray e passed through the unit area 1a on the left side in the drawing are superimposed, and synthesized. As a result, a light intensity distribution shown in FIGS. 48A, 48B is formed on the surface of the substrate 5 to be treated positioned in the focal position of the optical image forming system 4. FIG. 48A is a diagram sterically showing a synthesized light intensity distribution superimposed on the surface of the substrate 5 to be treated. FIG. 48B is a diagram showing a synthesized light intensity distribution along the crossing line corresponding to the crossing line A-A of the unit area 1a.

A light intensity distribution shown in FIGS. 49A, 49B is formed on the surface of the substrate 5 to be treated. The surface has been defocused on an optical image forming system 4 side by 10 μm from the focal position of the optical image forming system 4 and positioned. FIG. 49A is a diagram sterically showing a synthesized light intensity distribution superimposed on the surface of the substrate 5 to be treated. FIG. 49B is a diagram showing a synthesized light intensity distribution along the crossing line corresponding to the crossing line A-A of the unit area 1a.

Referring to FIGS. 48A, 48B and FIGS. 49A, 49B, it is seen that even when the surface of the substrate 5 to be treated is defocused to a certain degree with respect to the focal position of the optical image forming system 4, the synthesized light intensity distribution does not change very much by a cooperative function of the phase modulation device 1 and the birefringence device 2E. That is, a large depth of focus is secured. Concretely, when the substrate 5 to be treated is defocused by 10 μm with respect to the focal position of the optical image forming system 4, a relative value of the bottom peak rises to about 0.62 from about 0.54, and a peak width W1 increases to about 1.50 μm from about 1.24 μm. That is, the relative value of the bottom peak and the peak width W1 change in the above-described desirable range.

In Embodiment 13, in the crystallization apparatus shown in FIG. 31, a semiconductor (Si) thin film on the substrate 5 to be treated was crystallized using the phase modulation device 1 having a constitution shown in FIG. 46. On the substrate 5 to be treated, for example, the laser light having the light intensity distribution between the light intensity distribution shown in FIGS. 48A, B and that shown in FIGS. 49A, 49B was formed, and a semiconductor thin film comprising a 10 μm square crystal grain array was prepared as shown in FIG. 14B through a crystallization process shown in FIG. 12. As shown in FIGS. 48A, 48B and FIGS. 49A, 49B, even when the substrate 5 to be treated is defocused with respect to the focal position of the optical image forming system 4, the light intensity distribution synthesized on the substrate 5 to be treated does not change very much. Since a large depth of focus is secured in this manner, the semiconductor thin film comprising a crystal grain array having satisfactory uniformity is obtained.

Embodiment 14

Figure 50:
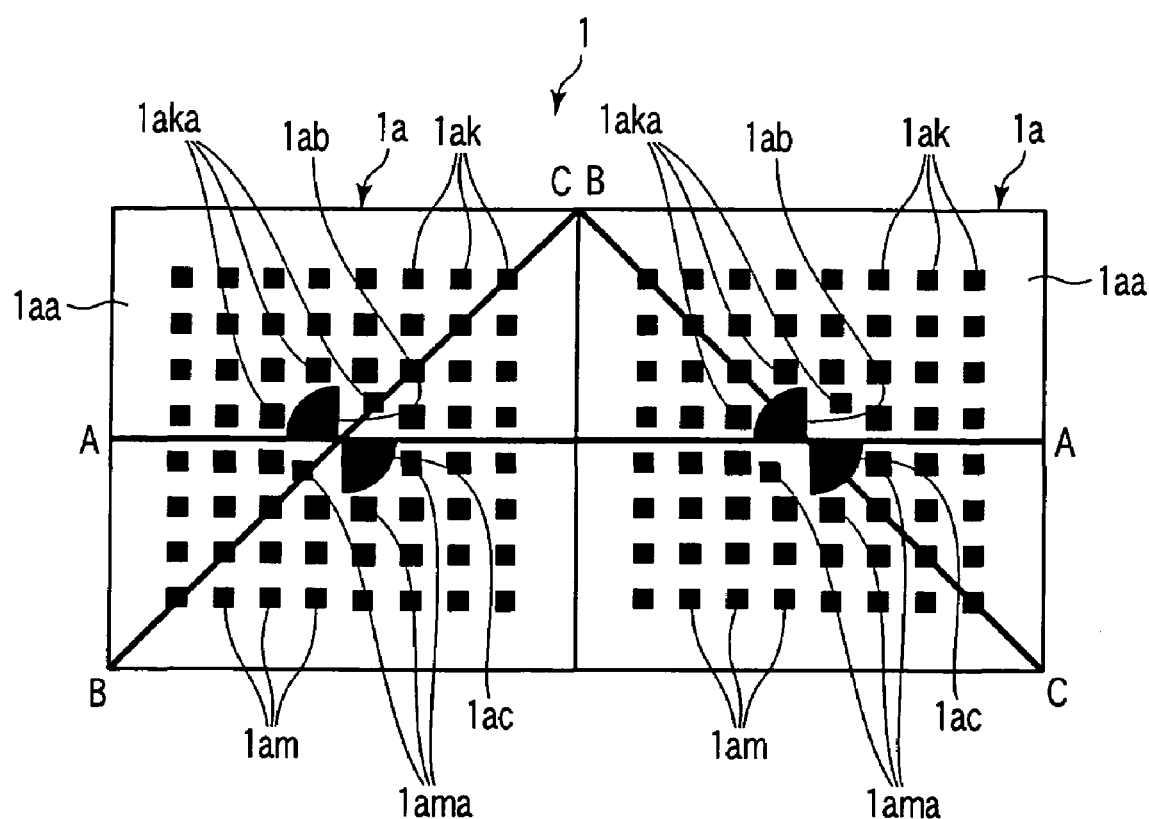
FIG. 50 is a diagram schematically showing a constitution of a phase modulation device in Embodiment 14.

FIG. 50 is a diagram schematically showing a constitution of a phase modulation device according to Embodiment 14 of the present invention. A phase modulation device 1 is a phase modulation device for preparing a semiconductor thin film comprising a 10 μm square crystal grain array in the same manner as in Embodiment 13, and has a constitution similar to that of Embodiment 13. However, in Embodiment 14, all (five in this example) third areas 1aka and all (five in this example) fourth areas 1ama around a first area 1ab and a second area 1ac are set into 0.4 μm squares in one unit area 1a. In this respect, Embodiment 14 is different from Embodiment 13. Embodiment 14 will be described hereinafter noting a different respect from Embodiment 13.

In Embodiment 14, in a case where a luminous flux split device 2 is not disposed, light intensity distributions shown in FIGS. 51A to 51C are formed on the surface of a substrate 5 positioned in a focal position of an optical image forming system 4. That is, in FIG. 50, the light intensity distribution shown in FIG. 51A is formed along a crossing line corresponding to a line A-A crossing a middle of the unit area 1a of the phase modulation device 1. The light intensity distribution shown in FIG. 51B is formed along a slanted line corresponding to a rightward ascending diagonal line B-B of the unit area 1a on the left side. The light intensity distribution shown in FIG. 51C is formed along a slanted line corresponding to a leftward ascending diagonal line C-C of the unit area 1a on the right side.

It is seen from FIG. 51A that a bottom peak having a smallest light intensity is formed corresponding to a contact (i.e., the center of the unit area 1a) between the first area 1ab and the second area 1ac. An inversely peaked distribution whose light intensity rapidly increases is formed radially toward periphery from the bottom peak by functions of the first area 1ab and second area 1ac. A tilted distribution whose light intensity slowly increases is formed radially toward the periphery from the inversely peaked distribution by functions of the third areas 1ak and the fourth areas 1am.

In this example, in actual, since an incident luminous flux is split into two incoherent luminous fluxes having different polarized states via the birefringence device 2E, a light intensity distribution formed on the surface of the substrate 5 to be treated by a normal light ray o passed through the unit area 1a of the phase modulation device 1 on the right side in the drawing, and that formed on the surface of the substrate to be treated by an abnormal light ray e passed through the unit area 1a on the left side in the drawing are superimposed, and synthesized. As a result, a light intensity distribution shown in FIGS. 52A, 52B is formed on the surface of the substrate 5 to be treated positioned in the focal position of the optical image forming system 4. FIG. 52A is a diagram sterically showing a synthesized light intensity distribution superimposed on the surface of the substrate 5 to be treated. FIG. 52B is a diagram showing a synthesized light intensity distribution along the crossing line corresponding to the crossing line A-A of the unit area 1a.

Figure 53A:
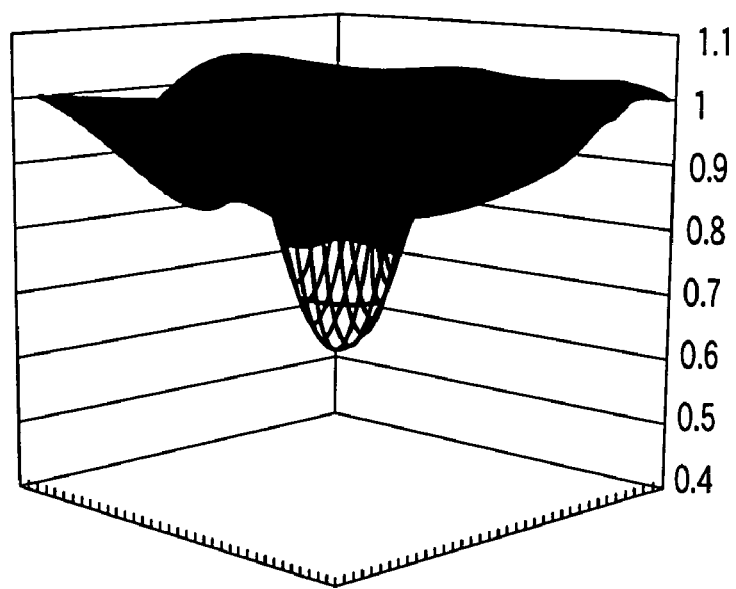
FIGS. 53A, 53B show a light intensity distribution obtained in a defocus position by the phase modulation device and the luminous flux split device in Embodiment 14.
Figure 53B:
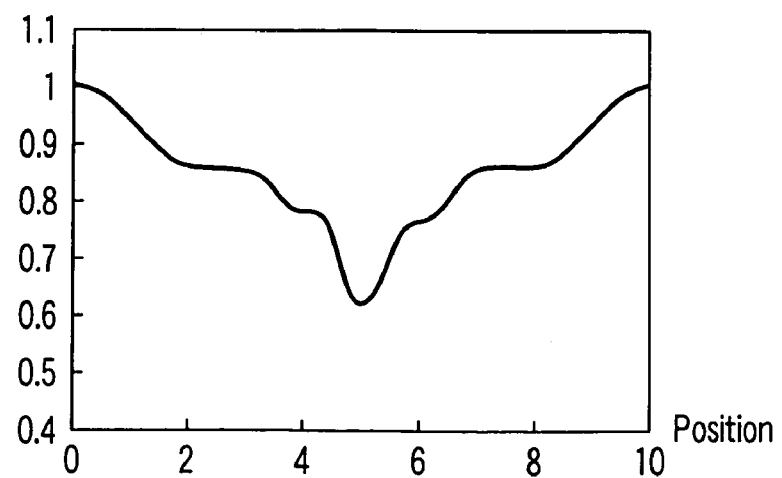

A light intensity distribution shown in FIGS. 53A, 53B is formed on the surface of the substrate 5 to be treated. The surface has been defocused on an optical image forming system 4 side by 10 µm from the focal position of the optical image forming system 4 and positioned. FIG. 53A is a diagram sterically showing a synthesized light intensity distribution superimposed on the surface of the substrate 5 to be treated. FIG. 53B is a diagram showing a synthesized light intensity distribution along the crossing line corresponding to the crossing line A-A of the unit area 1a.

Referring to FIGS. 52A, 52B and FIGS. 53A, 53B, it is seen that even when the surface of the substrate 5 to be treated is defocused to a certain degree with respect to the focal position of the optical image forming system 4, the synthesized light intensity distribution does not change very much by a cooperative function of the phase modulation device 1 and the birefringence device 2E. That is, a large depth of focus is secured. Concretely, when the substrate 5 to be treated is defocused by 10 µm with respect to the focal position of the optical image forming system 4, a relative value of the bottom peak rises to about 0.62 from about 0.53, and a peak width W1 increases to about 1.50 µm from about 1.30 µm. That is, the relative value of the bottom peak and the peak width W1 change in the above-described desirable range. The synthesized light intensity distribution obtained in Embodiment 14 has an anisotropy smaller than that of Embodiment 13.

In Embodiment 14, in the crystallization apparatus shown in FIG. 31, a semiconductor (Si) thin film on the substrate 5 to be treated was crystallized using the phase modulation device 1 having a constitution shown in FIG. 50. On the substrate 5 to be treated, for example, the laser light having the light intensity distribution between the light intensity distribution shown in FIGS. 52A, 52B and that shown in FIGS. 53A, 53B was formed, and a semiconductor thin film comprising a 10 µm square crystal grain array was prepared as shown in FIG. 14B through a crystallization process shown in FIG. 12. As shown in FIGS. 52A, 52B and FIGS. 53A, 53B, even when the substrate 5 to be treated is defocused with respect to the focal position of the optical image forming system 4, the light intensity distribution synthesized on the substrate 5 to be treated does not change very much. Since a large depth of focus is secured in this manner, the semiconductor thin film comprising a crystal grain array having satisfactory uniformity is obtained.

It is to be noted that in the above-described embodiments, the light intensity distribution can be calculated in a design stage, but is preferably observed and confirmed beforehand in an actual face to be treated. For this purpose, the face to be treated of the substrate may be enlarged by an optical system, and input by an imaging device such as CCD. When light for use is an ultraviolet ray, the optical system is restricted. Therefore, a fluorescence plate may be disposed on the face to be treated, and the light may be converted into visible light. In the above-described embodiments, concrete constitution examples of the phase modulation device 1 have been described, but various modifications of the constitution of the phase modulation device 1 are possible in a range of the present invention.

Additionally, in the above-described embodiments, the birefringence device 2E is disposed in the vicinity of the phase modulation device 1. However, the present invention is not limited to this arrangement. When the birefringence device 2E is disposed between the phase modulation device 1 and the substrate 5 to be treated, the above-described double image effect can be effectively produced. Concretely, the birefringence device 2E is preferably disposed between the phase modulation device 1 and the optical image forming system 4, or between the optical image forming system 4 and the substrate 5 to be treated. When a light incidence face of the birefringence device 2E is surface-worked, a step for realizing a predetermined phase difference is disposed, and functions of the birefringence device 2E and the phase modulation device 1 may be integrated in this manner. That is, optical modulation means and luminous flux split means may be formed integrally.

Moreover, in the above-described embodiments, since the birefringence device 2E comprises one birefringent parallel flat plate, the normal light ray o has an optical path length different from that of the abnormal light ray e. Therefore, a phase difference is made between two luminous fluxes split via the birefringence device 2E, and image forming positions of two luminous fluxes are separated in an optical axis direction. A Savart plate is usable as the luminous flux split device 2 for avoiding this problem. The Savart plate is constitute of one pair of birefringent parallel flat plates, and these parallel flat plates are constituted in such a manner that a crystal optical axis forms a predetermined angle with respect to the optical axis. Alternatively, to avoid the separation problem of the image forming position by the phase difference, deformation of the Savart plate is usable by so-called Francon as the luminous flux split device 2.

Moreover, in the above-described embodiments, the birefringence device 2E disposed in the vicinity of the phase modulation device 1 is used as the luminous flux split device 2. However, the present invention is not limited to this example, and a pupil plane of the optical image forming system 4 or a Wollaston prism disposed in the vicinity is usable instead of the birefringence device 2E. The Wollaston prism comprises a pair of birefringent polarization prisms, and these polarization prisms are constituted in such a manner that the crystal optical axis forms a predetermined angle with respect to the optical axis.

The above-described crystallized semiconductor thin film prepared by the crystallization method of the present invention is applied to a thin film transistor, and indicates a superior TFT characteristic that mobility is high. Therefore, the film is applicable to a driving circuit for a liquid crystal display or an electroluminescence (EL) display, or an integrated circuit for a memory (SPRAM or DRAM) or CPU.

What is claimed is:

1. A crystallization apparatus which irradiates a non-single-crystal semiconductor film with a luminous flux having a predetermined light intensity distribution to crystallize the semiconductor film, comprising:

a phase modulation device comprising a plurality of unit areas which are arranged in a certain period and which mutually have substantially the same pattern; and an optical image forming system disposed between the phase modulation device and the non-single-crystal semiconductor film, each of the unit areas of the phase modulation device comprising:

a reference face having a certain phase;

a first area disposed in the vicinity of a center of each unit area and having a first phase difference with respect to the reference face; and a second area disposed in the vicinity of the first area and having substantially the same phase difference as the first area with respect to the reference face; and a plurality of third area disposed around the first and second areas, each of the third areas having substantially the same phase difference as the first area with respect to the reference face, the sizes of the third areas varying in accordance with distances between the third areas and the center of each of the unit areas, wherein:

the predetermined light intensity distribution has a plurality of unit distribution areas, each of the unit distribution areas corresponding to each of the unit areas of the phase modulation device; and each of the unit distribution areas has an inversely peaked pattern whose light intensity increases radially toward periphery from a bottom peak, the bottom peak corresponding to the center of each of the unit areas.

2. The crystallization apparatus according to claim 1, wherein:

the sizes of the third areas are set in such a manner as to decrease apart from the center of each of the unit areas;

each of the unit distribution areas has a funnel-shaped light intensity distribution whose light intensity rapidly increases radially from the bottom peak, and then slowly increases radially toward the periphery.

3. The crystallization apparatus according to claim 2, wherein the light intensity at the bottom peak in each of the unit distribution areas has a relative value of 0.2 to 0.7, when a maximum value of the light intensity in the unit distribution area is normalized to 1.

4. The crystallization apparatus according to claim 2, wherein a width of the light intensity distribution in light intensity obtained by adding ⅖ of a difference between a maximum value and a minimum value to the minimum value of the light intensity in each of the unit distribution areas is between 0.5 and 1.5 μm, when the maximum value of the light intensity in the unit distribution area is normalized to 1.

5. The crystallization apparatus according to claim 2, wherein the respective unit distribution areas are arranged at an interval of 4 to 20 μm in terms of a converted value in the image plane of the optical image forming system, in a rectangular or triangular lattice form.

6. The crystallization apparatus according to claim 1, wherein the first area has substantially the same pattern as that of the second area, and is brought into contact with the second area substantially in one point.

7. The crystallization apparatus according to claim 1, wherein the first and second areas have fan shapes.

8. The crystallization apparatus according to claim 1, wherein the first and second areas have a size of 0.3 to 1.5 μm in terms of a converted value of a diameter in a function face as a whole.

9. The crystallization apparatus according to claim 1, wherein:

each unit area has a plurality of square unit cells disposed around the first and second areas, each of the unit cells including one third area, the third area having substantially the same phase difference as the first area with respect to the reference face; and a proportion of the third area in each of the unit cells changes with the cell.

10. The crystallization apparatus according to claim 9, wherein the proportion of the third area in each of the unit cells is reduced apart from the center of the unit area.

11. A crystallization apparatus which irradiates a non-single-crystal semiconductor film with a luminous flux having a predetermined light intensity distribution to crystallize the semiconductor film, comprising:

a phase modulation device comprising a plurality of unit areas which are arranged in a certain period and which mutually have substantially the same pattern;

birefringence device which splits a luminous flux passing through the phase modulation device into normal light ray traveling straight through the birefringence device and abnormal light ray refracted by an incidence interface and by an emission interface of the birefringence device; and an optical image forming system disposed between the birefringence device and the non-single-crystal semiconductor film, each of the unit areas of the phase modulation device comprising:

a reference face having a certain phase;

a first area disposed in the vicinity of a center of each unit area and having a first phase difference with respect to the reference face;

a second area disposed in the vicinity of the first area and having a second phase difference whose absolute value is substantially equal to that of the first phase difference with respect to the reference face and whose sign is different from that of the first phase difference;

a plurality of third areas disposed around the first and second areas, each of the third areas having substantially the same phase difference as the first area with respect to the reference face, the sizes of the third areas varying in accordance with distances between the third areas and the center of each of the unit areas; and a plurality of fourth areas disposed around the first and second areas, each of the fourth areas having substantially the same phase difference as the second area with respect to the reference face, the sizes of the fourth areas varying in accordance with distances between the fourth areas and the center of each of the unit areas;

the reference face having substantially the same phase between two adjacent unit areas, the first area having a substantially reversed phase difference with respect to the reference face between two adjacent unit areas, the second area having a substantially reversed phase difference with respect to the reference face between two adjacent unit areas, wherein:

the predetermined light intensity distribution has a plurality of unit distribution areas, each of the unit distribution areas corresponding to each of the unit areas of the phase modulation device, and each of the unit distribution areas has an inversely peaked pattern whose light intensity increases radially toward periphery from a bottom peak, the bottom peak corresponding to the center of each of the unit areas.

12. The crystallization apparatus according to claim 11, wherein:

the sizes of the third areas and fourth areas are set in such a manner as to decrease apart from the center of said unit area; and each of the unit distribution areas has a funnel-shaped light intensity distribution whose light intensity rapidly increases radially from the bottom peak, and then slowly increases radially toward the periphery.

13. The crystallization apparatus according to claim 12, wherein a minimum value of the light intensity in each of the unit distribution areas has a relative value of 0.2 to 0.7, when a maximum value of the light intensity in the unit distribution area is normalized to 1.

14. The crystallization apparatus according to claim 12, wherein a width of the light intensity distribution in light intensity obtained by adding ⅖ of a difference between a maximum value and a minimum value to the minimum value of the light intensity in each of the unit distribution areas is between 0.5 and 1.5 μm, when the maximum value of the light intensity in the unit distribution area is normalized to 1.

15. The crystallization apparatus according to claim 12, wherein the respective unit distribution areas are arranged at an interval of 4 to 20 μm in a rectangular or triangular lattice form.

16. The crystallization apparatus according to claim 11, wherein the first area has substantially the same pattern as that of the second area, and is brought into contact with the second area substantially in one point.

17. The crystallization apparatus according to claim 11, wherein the first and second areas have fan shapes.

18. The crystallization apparatus according to claim 11, wherein the first and second areas have a size of 0.3 to 3 μm in terms of a converted value of a diameter in a function face as a whole.

19. The crystallization apparatus according to claim 11, wherein each unit area has a plurality of square unit cells disposed around the first and second areas; each of these unit cells including one third area or one fourth area selectively; and a proportion of the third area or the fourth area in each of the unit cells changes with the cell.

20. The crystallization apparatus according to claim 19, wherein the proportion of the third area or the fourth area in each of the unit cells is reduced apart from the center of the unit area.

* * * * *